(12) United States Patent
Arai et al.

(10) Patent No.: US 9,639,002 B2
(45) Date of Patent: May 2, 2017

(54) METHOD OF FORMING RESIST PATTERN

(71) Applicant: TOKYO OHKA KOGYO CO., LTD., Kawasaki-shi (JP)

(72) Inventors: Masatoshi Arai, Kawasaki (JP); Yoshitaka Komuro, Kawasaki (JP); Daichi Takaki, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/872,568

(22) Filed: Oct. 1, 2015

(65) Prior Publication Data

US 2016/0116843 A1    Apr. 28, 2016

(30) Foreign Application Priority Data

Oct. 2, 2014  (JP) ................................. 2014-204053

(51) Int. Cl.
*G03F 7/32* (2006.01)
*G03F 7/039* (2006.01)

(52) U.S. Cl.
CPC ............ *G03F 7/325* (2013.01); *G03F 7/0397* (2013.01)

(58) Field of Classification Search
None
See application file for complete search history.

(56) References Cited

U.S. PATENT DOCUMENTS

| 2004/0110085 A1 | 6/2004 | Iwai et al. |
| 2009/0197204 A1 | 8/2009 | Shiono et al. |
| 2009/0317743 A1 | 12/2009 | Shiono et al. |
| 2010/0086873 A1* | 4/2010 | Seshimo ............... G03F 7/0045 430/281.1 |
| 2010/0310985 A1 | 12/2010 | Mori et al. |
| 2011/0117499 A1 | 5/2011 | Matsumiya et al. |
| 2012/0149916 A1 | 6/2012 | Utsumi et al. |
| 2013/0302736 A1* | 11/2013 | Utsumi ................... G03F 7/004 430/285.1 |
| 2014/0011134 A1* | 1/2014 | Takahashi ............. G03F 7/0045 430/281.1 |
| 2014/0363772 A1* | 12/2014 | Tsuchiya ................. G03F 7/038 430/325 |
| 2015/0198880 A1* | 7/2015 | Shinomiya ............ C08F 224/00 430/325 |
| 2015/0248054 A1* | 9/2015 | Matsuda ................. G03F 7/038 430/281.1 |

FOREIGN PATENT DOCUMENTS

| JP | A-2003-241385 | 8/2003 |
| JP | A-2010-002870 | 1/2010 |
| JP | A-2010-032994 | 2/2010 |
| JP | A-2010-277043 | 12/2010 |
| JP | A-2011-013569 | 1/2011 |
| JP | A-2011-128226 | 6/2011 |
| JP | A-2013-178515 | 9/2013 |
| WO | WO 2012/118168 A1 * | 9/2012 |
| WO | WO 2014/069415 A1 * | 5/2014 |

* cited by examiner

*Primary Examiner* — Sin Lee
(74) *Attorney, Agent, or Firm* — Knobbe Martens Olson & Bear LLP

(57) ABSTRACT

A method of forming a resist pattern including forming a resist film on a substrate using a resist composition which generates acid upon exposure and exhibits changed solubility in a developing solution under action of the acid; exposing the resist film; and patterning the exposed resist film by negative-tone development using a developing solution containing an organic solvent, to form a resist pattern. The resist composition includes a polymeric compound having at least two kinds of specific structural units.

4 Claims, No Drawings

METHOD OF FORMING RESIST PATTERN

TECHNICAL FIELD

The present invention relates to a method of forming a resist pattern.

Priority is claimed on Japanese Patent Application No. 2014-204053, filed Oct. 2, 2014, the content of which is incorporated herein by reference.

DESCRIPTION OF RELATED ART

Techniques (pattern-forming techniques) in which a fine pattern is formed on top of a substrate, and a lower layer beneath that pattern is then fabricated by conducting etching with this pattern as a mask are widely used in the production of semiconductor devices and liquid display device. These types of fine patterns are usually formed from an organic material, and are formed using a lithography method or a nanoimprint method or the like. In lithography techniques, for example, a resist film composed of a resist material containing a base component such as a resin is formed on a support such as a substrate, and the resist film is subjected to selective exposure of radial rays such as light or electron beam, followed by development, thereby forming a resist pattern having a predetermined shape on the resist film. Using this resist pattern as a mask, a semiconductor or the like is produced by conducting a step in which the substrate is processed by etching.

The aforementioned resist material can be classified into positive types and negative types. Resist materials in which the exposed portions exhibit increased solubility in a developing solution is called a positive type, and a resist material in which the exposed portions exhibit decreased solubility in a developing solution is called a negative type.

In general, an aqueous alkali solution (alkali developing solution) such as an aqueous solution of tetramethylammonium hydroxide (TMAH) is used as the developing solution. Alternatively, organic solvents such as aromatic solvents, aliphatic hydrocarbon solvents, ether solvents, ketone solvents, ester solvents, amide solvents and alcohol solvents are used as the developing solution.

In recent years, advances in lithography techniques have led to progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

As shortening the wavelength of the exposure light source progresses, it is required to improve various lithography properties of the resist material, such as the sensitivity to the exposure light source and a resolution capable of reproducing fine patterns. As resist materials which satisfy such requirements, chemically amplified resists are known.

As a chemically amplified composition, a composition including a base material component that exhibits a changed solubility in a developing solution under the action of acid and an acid-generator component that generates acid upon exposure is generally used. For example, in the case where an alkali developing solution is used as a developing solution (alkali developing process), a base component which exhibits increased solubility in an alkali developing solution under action of acid is used.

Conventionally, a resin (base resin) is typically used as the base component of a chemically amplified resist composition. Resins that contain structural units derived from (meth)acrylate esters within the main chain (acrylic resins) are the mainstream as base resins for chemically amplified resist compositions that use ArF excimer laser lithography, as they exhibit excellent transparency in the vicinity of 193 nm.

Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

In general, the base resin for a chemically amplified resist composition contains a plurality of kinds of structural units for improving lithography properties and the like. For example, a structural unit having a lactone structure and a structural unit having a polar group such as a hydroxy group are used, as well as a structural unit having an acid decomposable group which is decomposed by the action of an acid generated from the acid generator to form an alkali soluble group (for example, see Patent Document 1). When the base resin is an acrylic resin, as the acid decomposable group, in general, resins in which the carboxy group of (meth)acrylic acid or the like is protected with an acid dissociable group such as a tertiary alkyl group or an acetal group are used.

The positive tone process using a combination of a positive chemically amplified resist composition (i.e., a chemically amplified resist composition which exhibits increased solubility in an alkali developing solution upon exposure) and an alkali developing solution is advantageous over a negative tone development process in which a negative type, chemically amplified resist composition is used in combination with an alkali developing solution in that the structure of the photomask can be simplified, and the characteristics of the formed resist pattern are excellent. For these reasons, currently, positive-tone development process using a combination of a positive chemically amplified resist composition and an alkali developing solution is mainly employed in the formation of an extremely fine pattern.

In recent years, as further progress is made in lithography techniques and the application field for lithography techniques expand, the positive-tone development process is required to further improve various lithography properties.

In the case where a positive-tone development process is applied, when a resist film obtained by coating the chemically amplified resist composition on a substrate is selectively exposed, the acid decomposable groups in the base resin is decomposed by the action of acid generated from the acid generator and the like, such that the exposed portions change from an insoluble state to a soluble state in an alkali developing solution. On the other hand, the unexposed portions remain insoluble in an alkali developing solution. Therefore, by developing with an alkali developing solution, a dissolution contrast can be obtained between the exposed portions and the unexposed portions, and a positive resist pattern can be formed.

However, in the formation of a fine pattern (such as a dense pattern, a trench pattern, or the like) using the positive-tone development process, a region where the optical strength becomes weak is likely to be generated especially in the film thickness direction of the exposed portions of the resist film, thereby deteriorating the resolution of the resist pattern.

In the formation of a fine pattern, a method in which regions where the optical strength becomes weak are selectively dissolved and removed to form a resist pattern (negative pattern) is useful. For forming a negative resist pattern with a chemically amplified resist composition used in a positive-tone developing process which is the mainstream, a method in which a developing solution containing an organic solvent (organic developing solution) is used in combination with a chemically amplified resist composition is known (see for example, Patent Document 2).

In the case where a negative-tone development process is applied, when a resist film obtained by coating the chemically amplified resist composition on a substrate is selectively exposed, the acid decomposable groups in the base resin is decomposed by the action of acid generated from the acid generator and the like, such that the exposed portions change from an soluble state to a insoluble state in an organic developing solution. On the other hand, the unexposed portions remain soluble in an organic developing solution. Therefore, by developing with an alkali developing solution, a dissolution contrast can be obtained between the exposed portions and the unexposed portions, and a negative resist pattern can be formed.

DOCUMENTS OF RELATED ART

Patent Literature

[Patent Document 1] Japanese Unexamined Patent Application, First Publication No. 2003-241385
[Patent Document 2] Japanese Unexamined Patent Application, First Publication No. 2013-178515

SUMMARY OF THE INVENTION

As further progress is made in lithography techniques and the application field for lithography techniques expand, pattern miniaturization rapidly progresses. In the production of semiconductor elements or the like, a technique for forming a fine pattern having a size of 50 nm or smaller with an excellent shape is demanded.

However, when such a fine pattern is formed on a substrate, the intensity of the light irradiated to the resist film in the exposure becomes non-uniform in each of the exposed portions and the unexposed portions.

Therefore, there is a problem in that, in the formation of a pattern such as a fine line and space pattern, pattern collapse likely to occur. Further, there is a problem in that, in the formation of a fine trench pattern, the resist film at a near-interface cannot to be removed by a development, thereby likely to result in poor resolution.

The present invention takes the above circumstances into consideration, with an object of providing resist pattern forming method capable of forming a finer resist pattern with an excellent shape.

As described above, in the production of semiconductor elements or the like having a size of 50 nm or smaller, it becomes more difficult to form a fine line and space pattern and form a fine trench pattern. Moreover, it becomes further difficult to form both these patterns with using the same resist composition.

As a result of the studies of the present inventors, they have discovered that the above object could be achieved by the resist pattern forming method in that a polymeric compound having at least two types of specific structural unit is selected and a negative-tone development process using an organic developing solution is applied. The present invention has been completed based on this finding.

Specifically, a method of forming a resist pattern comprises a step of forming a resist film on a substrate using a resist composition which generates acid upon exposure and exhibits changed solubility in a developing solution under action of the acid, a step of exposing the resist film, and a step of patterning the exposed resist film by negative-tone development using a developing solution containing an organic solvent, to form a resist pattern, and the resist composition comprising a polymeric compound comprising a structural unit (a01) represented by general formula (a01-1) shown below and a structural unit (a04) represented by general formula (a04-1) shown below.

[Chemical Formula 1]

(a01-1)

In the formula, R represents a hydrogen atom, an alkyl group of 1 to 5 carbon atoms or a halogenated alkyl group of 1 to 5 carbon atoms. $La^{011}$ represents —CO—, —CO—O—($Va^{01}$-CO—O-)$n_{a011}$-, —O—CO—, —CO—N(R')—, —CO—NH—CO— or —CO—NH—CS—. $Va^{01}$ represents a divalent linking group or a single bond. $n_{a011}$ represents 0 or 1. R' represents a hydrogen atom or a methyl group. $Ra^{011}$ represents a polycyclic group containing at least one structure selected from the group consisting of —O—CO— and —SO$_2$— in the ring skeleton thereof, a cyclic group containing a structure —CO—N< in the ring skeleton thereof, or a cyclic group which may have a group represented by $Va^{011}$-N($Ra^{012}$)($Ra^{013}$) as a substituent. $Va^{001}$ represents —CO— or —SO$_2$. $Ra^{012}$ and $Ra^{013}$ each independently represent a hydrogen atom, —CO—$Ra^{014}$ or —SO$_2$—$Ra^{015}$. $Ra^{014}$ and $Ra^{015}$ each independently represents an alkyl group of 1 to 5 carbon atoms; provided that, when $La^{011}$ represents —CO—N(R')—, $Ra^{011}$ can represent a monocyclic group containing —O—CO— in the ring skeleton thereof.

[Chemical Formula 2]

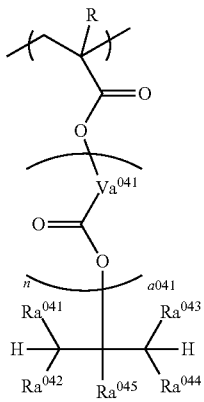

(a04-1)

In the formula, R represents a hydrogen atom, an alkyl group of 1 to 5 carbon atoms or a halogenated alkyl group of 1 to 5 carbon atoms. $Va^{041}$ represents a divalent linking group or a single bond. $n_{a041}$ represents 0 or 1. $Ra^{041}$, $Ra^{042}$, $Ra^{043}$ and $Ra^{044}$ each independently represent a linear or branched alkyl group of 1 to 5 carbon atoms which may have a substituent. $Ra^{045}$ represents a linear or branched alkyl group of 1 to 10 carbon atoms which may have a substituent.

By the method of forming a resist pattern according to the present invention, a finer resist pattern can be formed with an excellent shape.

DETAILED DESCRIPTION OF THE INVENTION

In the present description and claims, the term "aliphatic" is a relative concept used in relation to the term "aromatic", and defines a group that has no aromaticity or a compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic, divalent saturated hydrocarbon, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

The expression "may have a substituent" means that a case where a hydrogen atom (—H) is substituted with a monovalent group, or a case where a methylene (—$CH_2$—) group is substituted with a divalent group.

The term "exposure" is used as a general concept that includes irradiation with any form of radiation.

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent ($R^{\alpha 0}$) that substitutes the hydrogen atom bonded to the carbon atom on the α-position is an atom other than hydrogen or a group, and examples thereof include an alkyl group of 1 to 5 carbon atoms and a halogenated alkyl group of 1 to 5 carbon atoms. Further, an acrylate ester having the hydrogen atom bonded to the carbon atom on the α-position substituted with a substituent ($R^{\alpha 0}$) in which the substituent has been substituted with a substituent containing an ester bond (e.g., an itaconic acid diester), or an acrylic acid having the hydrogen atom bonded to the carbon atom on the α-position substituted with a substituent ($R^{\alpha 0}$) in which the substituent has been substituted with a hydroxyalkyl group or a group in which the hydroxy group within a hydroxyalkyl group has been modified (e.g., α-hydroxyalkyl acrylate ester) can be mentioned as an acrylate ester having the hydrogen atom bonded to the carbon atom on the α-position substituted with a substituent. A carbon atom on the α-position of an acrylate ester refers to the carbon atom bonded to the carbonyl group of the acrylate, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from acrylamide" refers to a structural unit that is formed by the cleavage of the ethylenic double bond of acrylamide.

The acrylamide may have the hydrogen atom bonded to the carbon atom on the α-position substituted with a substituent, and may have either or both terminal hydrogen atoms on the amino group of acrylamide substituted with a substituent. A carbon atom on the α-position of an acrylamide refers to the carbon atom bonded to the carbonyl group, unless specified otherwise.

As the substituent which substitutes the hydrogen atom on the α-position of acrylamide, the same substituents as those described above for the substituent ($R^{\alpha 0}$)) on the α-position of the aforementioned α-position of the aforementioned α-substituted acrylate ester can be mentioned.

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) of hydroxystyrene refers to the carbon atom having the benzene ring bonded thereto, unless specified otherwise.

As the substituent which substitutes the hydrogen atom on the α-position of hydroxystyrene, the same substituents as those described above for the substituent ($R^{α0}$) on the α-position of the aforementioned α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) of vinylbenzoic acid refers to the carbon atom having the benzene ring bonded thereto, unless specified otherwise.

The term "styrene" is a concept including styrene and compounds in which the hydrogen atom at the α-position of styrene is substituted with other substituent such as an alkyl group and a halogenated alkyl group.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include alkyl groups of 1 to 5 carbon atoms, such as a methyl group, an ethyl group, an n-propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

(Method of Forming a Resist Pattern)

The method of forming a resist pattern according to the present invention includes forming a resist film on a substrate using a resist composition which generates acid upon exposure and exhibits changed solubility in a developing solution under action of the acid, conducting exposure of the resist film, and patterning the exposed resist film by negative-tone development using a developing solution containing an organic solvent to form a resist pattern.

The method for forming a resist pattern can be performed, for example, as follows.

Firstly, a resist composition which generates acid upon exposure and exhibits changed solubility in a developing solution under action of the acid is applied to a substrate using a spinner or the like, and a bake treatment (post applied bake (PAB)) is conducted at a temperature of 80 to 150° C. for 40 to 120 seconds, preferably 60 to 90 seconds, to form a resist film.

As the resist composition, the resist composition described later can be used.

Subsequently, the resist film is selectively exposed, either by exposure through a photomask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a photomask pattern.

Then, baking treatment (post exposure baking (PEB)) is conducted under temperature conditions of 80 to 150° C. for 40 to 120 seconds, and preferably 60 to 90 seconds.

Next, the resist film which has been subjected to the exposure and the baking (PEB) treatment is subjected to a negative-tone development. The negative-tone developing treatment is conducted using a developing solution containing an organic solvent (organic developing solution).

In the method of forming the resist pattern according to the aforementioned embodiment, by virtue of forming a resist pattern by a negative-tone development using an organic developing solution, even when a fine pattern having a size of 50 nm or smaller is formed, a pattern can be formed with a high resolution. Moreover, the method of forming the resist pattern exhibits large process margin, and the formed resist pattern exhibits excellent lithography properties and an excellent shape.

After the negative-tone development, it is preferable to conduct a rinse treatment. The rinse treatment is preferably conducted using a rinse liquid containing an organic solvent. After the negative-tone development or the rinse treatment, the organic developing solution or the rinse liquid remaining on the resist pattern can be removed by a treatment using a supercritical fluid.

After the negative-tone development or the rinse treatment, drying is conducted. If desired, bake treatment (post bake) can be conducted following the negative-tone development.

As a result of these operations, a fine resist pattern can be formed.

The aforementioned substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The method of forming a resist pattern according to the present embodiment is effective to KrF excimer laser, ArF excimer laser, EB and EUV, and particularly effective to ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based organic solvents and hydrocarbon-based organic solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As the organic solvent contained in the organic developing solution used in a negative-tone developing process, any of the conventional organic solvents can be used which are capable of dissolving the component (A1) described later (the component (A1) prior to exposure). Specific examples of the organic solvent include polar solvents such as ketone organic solvents, ester organic solvents, alcohol organic solvents, nitrile organic solvents, amide organic solvents and ether organic solvents, and hydrocarbon organic solvents.

A ketone organic solvent is an organic solvent containing C—C(=O)—C within the structure thereof. An ester organic solvent is an organic solvent containing C—C(=O)—O—C within the structure thereof. An alcohol organic solvent is an organic solvent containing an alcoholic hydroxy group within the structure thereof, and an "alcoholic hydroxy group" refers to a hydroxy group bonded to a carbon atom of an aliphatic hydrocarbon group. A nitrile organic solvent is an organic solvent containing a nitrile group in the structure thereof. An amide organic solvent is an organic solvent containing an amide group within the structure thereof. An ether organic solvent is an organic solvent containing C—O—C within the structure thereof.

Some organic solvents have a plurality of the functional groups which characterizes the aforementioned solvents within the structure thereof. In such a case, the organic solvent can be classified as any type of the solvent having the characteristic functional group. For example, diethylene glycol monomethylether can be classified as either an alcohol organic solvent or an ether organic solvent.

A hydrocarbon organic solvent consists of a hydrocarbon which may be halogenated, and does not have any substituent other than a halogen atom. Examples of the halogen atom include a fluorine atom, a chlorine atom, a bromine atom and an iodine atom, and a fluorine atom is preferable.

Among these, a developing solution used in the negative-tone development preferably contains at least one member selected from the group consisting of an ester organic solvent and ketone organic solvent, and more preferably contains ester organic solvent, as a resist pattern with a high resolution can be reliably obtained.

Examples of ester organic solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3- methoxypropionate, ethyl-3-methoxypropionate, ethyl-3-ethoxypropionate and propyl-3-methoxypropionate.

Among these, as an ester organic solvent, butyl acetate is preferable.

Examples of ketone organic solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylene carbonate, γ-butyrolactone and methyl amyl ketone (2-heptanone).

Among these, as a ketone organic solvent, methyl amyl ketone (2-heptanone) is preferable.

If desired, the organic developing solution may have a conventional additive blended. Examples of the additive include surfactants. The surfactant is not particularly limited, and for example, an ionic or non-ionic fluorine and/or silicon surfactant can be used.

As the surfactant, a non-ionic surfactant is preferable, and a fluorine surfactant or a silicon surfactant is more preferable.

When a surfactant is added to the organic developing solution, the amount thereof based on the total amount of the organic developing solution is generally 0.001 to 5% by weight, preferably 0.005 to 2% by weight, and more preferably 0.01 to 0.5% by weight.

The negative-tone developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

As the organic solvent contained in the rinse liquid used in the rinse treatment after the negative-tone development, any of the aforementioned organic solvents contained in the organic developing solution can be used which hardly dissolves the resist pattern. In general, at least one solvent selected from the group consisting of hydrocarbon organic solvents, ketone organic solvents, ester organic solvents, alcohol organic solvents, amide organic solvents and ether organic solvents is used. Among these, at least one solvent selected from the group consisting of hydrocarbon organic solvents, ketone organic solvents, ester organic solvents, alcohol organic solvents and amide organic solvents is preferable, more preferably at least one solvent selected from the group consisting of ester organic solvents and ketone organic solvents, and an ester organic solvent is particularly desirable.

These organic solvents can be used individually, or at least 2 solvents may be mixed together. Further, an organic solvent other than the aforementioned examples or water may be mixed together. However, in consideration of the development characteristics, the amount of water within the rinse liquid, based on the total amount of the rinse liquid is preferably 30% by weight or less, more preferably 10% by weight or less, still more preferably 5% by weight or less, and most preferably 3% by weight or less.

If desired, the rinse solution may have a conventional additive blended. Examples of the additive include surfactants. As the surfactant, the same surfactants as those described above can be mentioned, and a non-ionic surfactant is preferable, and a fluorine surfactant or a silicon surfactant is more preferable.

When a surfactant is added, the amount thereof based on the total amount of the rinse liquid is generally 0.001 to 5% by weight, preferably 0.005 to 2% by weight, and more preferably 0.01 to 0.5% by weight.

The rinse treatment using a rinse liquid (washing treatment) can be conducted by a conventional rinse method. Examples of the rinse treating method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

<Resist Composition>

In the method of forming a resist pattern according to the present invention, a resist composition which generates acid upon exposure and exhibits changed solubility in a developing solution under action of acid is used.

Examples of the resist composition include a resist composition containing a base component (A) (hereafter, referred to as "component (A)") which exhibits decreased solubility in an organic solvent contained in an organic developing solution under action of acid.

When a resist film is formed using the resist composition and the formed resist film is subjected to a selective exposure, acid is generated at exposed portions of the resist film, and the generated acid acts on the component (A) to decrease the solubility of the component (A) in an organic solvent contained in an organic developing solution, whereas the solubility of the component (A) in the organic solvent contained in the organic developing solution is not changed at unexposed portions of the resist film, thereby generating difference in solubility in the organic solvent between exposed portions and unexposed portions. As a result, by developing the resist film using an organic developing solution, the unexposed portions are dissolved and removed, thereby forming a negative-tone resist pattern.

In the present specification, a resist composition which forms a negative resist pattern by dissolving and removing the unexposed portions is called a negative resist composition, and a resist composition which forms a positive resist pattern by dissolving and removing the exposed portions is called a positive resist composition.

The resist composition of the present embodiment has a function of generating acid upon exposure, and in the resist composition, the component (A) may generate acid upon exposure, or an additive component other than the component (A) may generate acid upon exposure.

Specifically, the resist composition of the present embodiment may be a resist composition (1) containing an acid generator component (B) which generates acid upon exposure (hereafter, referred to as "component (B)";

a resist composition (2) in which the component (A) is a component which generates acid upon exposure; or a resist composition (3) in which the component (A) is a component which generates acid upon exposure, and further containing an acid generator component (B).

That is, when the resist composition of the present invention is the aforementioned resist composition (2) or (3), the component (A) is a "base component which generates acid upon exposure and exhibits decreased solubility in an organic solvent contained in an organic developing solution under action of acid". In this case, the component (A1) described later is preferably a polymeric compound which generates acid upon exposure and exhibits decreased solubility in an organic solvent contained in an organic developing solution under action of acid. As the polymeric compound, a resin having a structural unit which generates acid upon exposure can be used. As the structural unit which generates acid upon exposure, a conventional structural unit can be used.

The resist composition of the present embodiment is preferably the aforementioned resist composition (1).

<<Base Component (A)>>

In the present invention, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" or a "polymeric compound" refers to a polymer having a molecular weight of 1,000 or more.

As the molecular weight of the polymer, the weight average molecular weight in terms of the polystyrene equivalent value determined by gel permeation chromatography (GPC) is used.

As the component (A) usable in the resist composition of the present embodiment, at least the component (A1) is used, and a polymeric compound and/or a low molecular weight compound may be used in combination with the component (A1).

[Component (A1)]

In the resist composition according to the present embodiment, the component (A) contains a polymeric compound including a structural unit (a01) represented by general formula (a01-1) and a structural unit (a04) represented by general formula (a04-1) (hereafter, this polymeric compound is referred to as "polymeric compound (A1)").

When a resist film formed using the resist composition containing the component (A1) is exposed, at least part of the structure within the structural unit (a04) is cleaved by the action of acid, and the polarity is increased. As a result, the resist composition of the present embodiment becomes a negative-type when a developing solution is an organic developing solution (in a solvent developing process), and a positive-type when a developing solution is an alkali developing solution (in an alkali developing process). Since the polarity of the component (A1) is changed prior to and after exposure, by using the component (A1), an excellent development contrast can be achieved not only in an alkali developing process, but also in a solvent developing process.

That is, in the case of applying a solvent developing process, the component (A1) exhibits high solubility in an organic developing solution prior to exposure. When acid is generated upon exposure, the polarity is increased by the action of the generated acid, and thereby the solubility in an organic developing solution decreases. Therefore, in the formation of a resist pattern, by conducting selective exposure of a resist film formed by applying the resist composition to a substrate, the exposed portions changes from an soluble state to an insoluble state in an organic developing solution, whereas the unexposed portions remain soluble in an organic developing solution. As a result, by conducting development using an organic developing solution, a contrast can be made between the exposed portions and unexposed portions, thereby enabling the formation of a negative resist pattern.

Structural Unit (a01)

The structural unit (a01) is represented by general formula (a01-1) shown below. By virtue of including the structural unit (a01), the glass transition temperature (Tg) of the polymeric compound can be enhanced.

By using the component (A1) having such a structural unit (a01), in the formation of a resist pattern, diffusion of acid generated upon exposure can be especially suppressed, and a resist pattern can be formed with reduced roughness and an excellent shape.

[Chemical Formula 3]

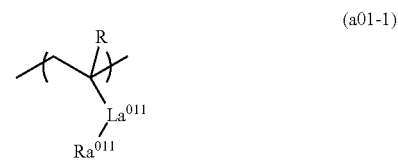

(a01-1)

In the formula, R represents a hydrogen atom, an alkyl group of 1 to 5 carbon atoms or a halogenated alkyl group of 1 to 5 carbon atoms. $La^{011}$ represents —CO—, —CO—O—($Va^{01}$-CO—O—)$n_{a011}$-, —O—CO—, —CO—N(R')—, —CO—NH—CO— or —CO—NH—CS—. $Va^{01}$ represents a divalent linking group or a single bond. $n_{a011}$ represents 0 or 1. R' represents a hydrogen atom or a methyl group. $Ra^{011}$ represents a polycyclic group containing at least one structure selected from the group consisting of —O—CO— and —SO$_2$— in the ring skeleton thereof, a cyclic group containing a structure —CO—N< in the ring skeleton thereof, or a cyclic group which may have a group represented by $Va^{011}$-N($Ra^{012}$)($Ra^{013}$) as a substituent. $Va^{001}$ represents —CO— or —SO$_2$. $Ra^{012}$ and $Ra^{013}$ each independently represents a hydrogen atom, —CO—$Ra^{014}$ or —SO$_2$—$Ra^{015}$. $Ra^{014}$ and $Ra^{015}$ each independently represents an alkyl group of 1 to 5 carbon atoms; provided that, when $La^{011}$ represents —CO—N(R')—, $Ra^{011}$ may represent a monocyclic group containing —O—CO— in the ring skeleton thereof.

In general formula (a01-1), R represents a hydrogen atom, an alkyl group of 1 to 5 carbon atoms or a halogenated alkyl group of 1 to 5 carbon atoms.

As the alkyl group for R, a linear or branched alkyl group of 1 to 5 carbon atoms is preferable, and specific examples thereof include a methyl group, an ethyl group, a n-propyl group, an isopropyl group, an n-butyl group, an isobutyl group, a tert-butyl group, a pentyl group, an isopentyl group and a neopentyl group.

The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, a hydrogen atom or an alkyl group of 1 to 5 carbon atoms is more preferable in terms of industrial availability, an alkyl group of 1 to 5 carbon atoms is still more preferable, and a methyl group is particularly desirable.

In the aforementioned formula (a01-1), $La^{011}$ represents —CO—, —CO—O—$(Va^{01}$—CO—O—$)n_{a011}$-, —O—CO—, —CO—N(R')—, —CO—NH—CO— or —CO—NH—CS—.

$Va^{01}$ for $La^{011}$ represents a divalent linking group or a single bond.

The divalent linking group for $Va^{01}$ is not particularly limited, and preferable examples thereof include a divalent hydrocarbon group which may have a substituent and a divalent linking group containing a hetero atom.

Divalent Hydrocarbon Group which May have a Substituent

The divalent hydrocarbon group may be either an aliphatic hydrocarbon group or an aromatic hydrocarbon group.

The aliphatic hydrocarbon group as the divalent hydrocarbon group for $Va^{01}$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear aliphatic hydrocarbon group preferably has 1 to 10 carbon atoms, more preferably 1 to 6, still more preferably 1 to 4, and most preferably 1 to 3.

The branched aliphatic hydrocarbon group preferably has 3 to 10 carbon atoms, more preferably 3 to 6, still more preferably 3 or 4, and most preferably 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$-] and a pentamethylene group [—$(CH_2)_5$—].

As the branched aliphatic hydrocarbon group, branched alkylene groups are preferred, and specific examples include various alkylalkylene groups, including alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C($CH_3$)$_2$$CH_2$—, —CH($CH_2CH_3$)$CH_2$—, and —C($CH_2CH_3$)$_2$—$CH_2$—; alkyltrimethylene groups such as —CH($CH_3$)$CH_2CH_2$—, and —$CH_2$CH($CH_3$)$CH_2$—; and alkyltetramethylene groups such as —CH($CH_3$)$CH_2CH_2CH_2$—, and —$CH_2$CH($CH_3$)$CH_2CH_2$—. As the alkyl group within the alkylalkylene group, a linear alkyl group of 1 to 5 carbon atoms is preferable.

As examples of the hydrocarbon group containing a ring in the structure thereof an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which 2 hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group as the divalent hydrocarbon group for $Va^{01}$ is a hydrocarbon group having an aromatic ring.

The aromatic ring contained in the aromatic hydrocarbon group is not particularly limited, as long as it is a cyclic conjugated compound having (4n+2) π electrons, and may be either monocyclic or polycyclic. The aromatic ring preferably has 5 to 30 carbon atoms, more preferably 5 to 20, still more preferably 6 to 15, and most preferably 6 to 12. Here, the number of carbon atoms within a substituent(s) is not included in the number of carbon atoms of the aromatic hydrocarbon group.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include pyridine ring, thiophene ring, and the like.

Specific examples of the aromatic hydrocarbon group for $Va^{01}$ include a group in which two hydrogen atoms have been removed from the aromatic hydrocarbon ring described above or an aromatic hetero ring (arylene group or heteroarylene group); a group in which two hydrogen atoms have been removed from an aromatic compound having two or more aromatic rings (biphenyl, fluorene or the like); and a group in which one hydrogen atom of the aforementioned arylene group or heteroarylene group has been substituted with an alkylene group (a group in which one hydrogen atom has been removed from the aryl group within the aforementioned arylalkyl group such as a benzyl group, a phenethyl group, a 1-naphthylmethyl group, a 2-naphthylmethyl group, a 1-naphthylethyl group, or a 2-naphthylethyl group).

The alkylene group which is bonded to the aforementioned aromatic hydrocarbon group or aromatic hetero ring preferably has 1 to 4 carbon atoms, more preferably 1 or 2 carbon atoms, and most preferably 1 carbon atom.

The divalent hydrocarbon group for $Va^{01}$ may have a substituent.

The linear or branched aliphatic hydrocarbon group as the divalent hydrocarbon group may or may not have a substituent. Examples of the substituent include a fluorine atom, a fluorinated alkyl group of 1 to 5 carbon atoms, and a carbonyl group.

The aliphatic hydrocarbon group containing a ring in the structure thereof as the divalent hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

The alicyclic hydrocarbon group may have part of the carbon atoms constituting the ring structure thereof substituted with a substituent containing a hetero atom. As the substituent containing a hetero atom, —O—, —C(=O)—O—, —S—, —S(=O)$_2$— or —S(=O)$_2$—O— is preferable.

With respect to the aromatic hydrocarbon group as the divalent hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is particularly desirable.

As the alkoxy group, the halogen atom and the halogenated alkyl group for the substituent, the same groups as the aforementioned substituent groups for substituting a hydrogen atom within the alicyclic hydrocarbon group can be used.

Divalent Linking Group Containing a Hetero Atom

With respect to a divalent linking group containing a hetero atom, a hetero atom is an atom other than carbon and hydrogen, and examples thereof include an oxygen atom, a nitrogen atom, a sulfur atom and a halogen atom.

In the case where Va$^{01}$ represents a divalent linking group containing a hetero atom, preferable examples of the linking group include —O—, —C(=O)—O—, —C(=O)—, —O—C(=O)—O—, —C(=O)—NH—, —NH—, —NH—C(=NH)— (wherein H may be substituted with a substituent such as an alkyl group or an acyl group), —S—, —S(=O)$_2$—, —S(=O)$_2$—O—, a group represented by general formula —Y$^{21}$—O—Y$^{22}$—, —Y$^{21}$—O—, —Y$^{21}$—C(=O)—O—, —C(O)—O—Y$^{21}$, —[Y$^{21}$C(O)—O]$_{m'}$—Y$^{22}$— or —Y$^{21}$—O—C(=O)—Y$^{22}$— [in the formulae, Y$^{21}$ and Y$^{22}$ each independently represents a divalent hydrocarbon group which may have a substituent, and O represents an oxygen atom; and m' represents an integer of 0 to 3.

The divalent linking group containing a hetero atom represents —C(=O)—NH—, —NH—, or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In formulae —Y$^{21}$—O—Y$^{22}$—, —Y$^{21}$—O—, —Y$^{21}$—C(=O)O—, —C(=O)—O—Y$^{21}$, —[Y$^{21}$—C(=O)—O]$_{m''}$—Y$^{22}$— and —Y$^{21}$—O—C(=O)—Y$^{22}$—, Y$^{21}$ and Y$^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As Y$^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As Y$^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[Y$^{21}$—C(=O)—O]$_{m''}$-Y$^{22}$—, m'' represents an integer of 0 to 3, preferably an integer of 0 to 2, more preferably 0 or 1, and most preferably 1. Namely it is particularly desirable that the group represented by the formula —[Y$^{21}$—C(=O)—O]$_{m''}$-Y$^{22}$— is a group represented by the formula —Y$^{21}$—C(=O)—O—Y$^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

Va$^{01}$ is preferably a single bond, a linear or branched alkylene group, a combination of a linear or branched alkylene group and an ester bond [—C(=O)—O—], a combination of a linear or branched alkylene group and an ether bond (—O—), or a combination of a linear or branched alkylene group, an ester bond [—C(=O)—O—] and an ether bond (—O—), and more preferably a linear or branched alkylene group.

In the aforementioned formula (a01-1), n$_{a011}$ for La$^{011}$ is 0 or 1, and preferably 1 in terms of formation of a resist pattern with more excellent shape.

In general formula (a01-1), R' for La$^{011}$ represents a hydrogen atom or a methyl group.

In aforementioned formula (a01-1), Ra$^{011}$ represents a polycyclic group containing at least one structure selected from the group consisting of —O—CO— and —SO$_2$— in the ring skeleton thereof a cyclic group containing a structure —CO—N< in the ring skeleton thereof or a cyclic group which may have a group represented by -Va$^{001}$-N(Ra$^{012}$)(Ra$^{013}$) as a substituent.

However, when La$^{011}$ represents —CO—N(R')—, Ra$^{011}$ may represent a monocyclic group containing —O—CO— in the ring skeleton thereof.

Polycyclic Group Containing —O—CO— in Ring Skeleton Thereof

Examples of a polycyclic group containing —O—CO— in the ring skeleton thereof for Ra$^{011}$ include a lactone-containing polycyclic group and a carbonate ring-containing polycyclic group.

The term "lactone-containing polycyclic group" refers to a polycyclic group including a ring containing a —O—C(=O)— structure in the ring skeleton thereof (lactone ring). The lactone ring is counted as the first ring, and groups containing other ring structures are described as polycyclic groups regardless of the structure of the other rings.

The lactone-containing polycyclic group for $Ra^{011}$ is not particularly limited, and an arbitrary group may be used. Specific examples include groups represented by general formulae (a2-r-1) to (a2-r-6) shown below.

In the present specification, "*" in the chemical formula represents a valence bond.

[Chemical Formula 4]

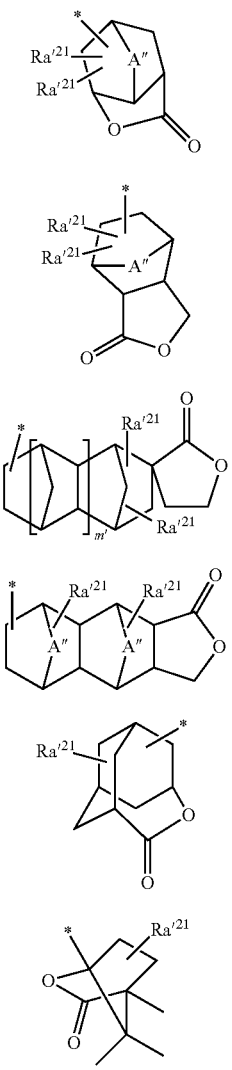

In the formulae, each $Ra'^{21}$ independently represents a hydrogen atom, an alkyl group, an alkoxy group, a halogen atom, a halogenated alkyl group, a hydroxy group, $-COOR_{02}"$, $-OC(=O)R_{02}"$, a hydroxyalkyl group or a cyano group; $R_{02}"$ represents a hydrogen atom, an alkyl group or a lactone-containing polycyclic group; A" represents an alkylene group of 1 to 5 carbon atoms which may contain an oxygen atom (—O—) or a sulfur atom, an oxygen atom, or a sulfur atom; and m' represents 0 or 1.

In formulae (a2-r-1) to (a2-r-6), the alkyl group for $Ra'^{21}$ is preferably an alkyl group of 1 to 6 carbon atoms. Further, the alkyl group is preferably a linear alkyl group or a branched alkyl group. Specific examples include a methyl group, an ethyl group, an n-propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

The alkoxy group for $Ra'^{21}$ is preferably an alkoxy group of 1 to 6 carbon atoms. Further, the alkoxy group is preferably a linear or branched alkoxy group. Specific examples of the alkoxy groups include the aforementioned alkyl groups for $Ra'^{21}$ having an oxygen atom (—O—) bonded thereto.

As examples of the halogen atom for $Ra'^{21}$, a fluorine atom, chlorine atom, bromine atom and iodine atom can be given. Among these, a fluorine atom is preferable.

Examples of the halogenated alkyl group for $Ra'^{21}$ include groups in which part or all of the hydrogen atoms within the aforementioned alkyl group for $Ra'^{21}$ has been substituted with the aforementioned halogen atoms. As the halogenated alkyl group, a fluorinated alkyl group is preferable, and a perfluoroalkyl group is particularly desirable.

With respect to $-COOR_{02}"$ and $-OC(=O)R_{02}"$ for $Ra'^{21}$, $R_{02}"$ represents a hydrogen atom, an alkyl group or a lactone-containing polycyclic group.

The alkyl group for $R_{02}"$ may be linear, branched or cyclic, and preferably has 1 to 15 carbon atoms. When $R_{02}"$ represents a linear or branched alkyl group, it is preferably an alkyl group of 1 to 10 carbon atoms, more preferably an alkyl group of 1 to 5 carbon atoms, and most preferably a methyl group or an ethyl group. When $R_{02}"$ is a cyclic alkyl group (cycloalkyl group), it preferably has 3 to 15 carbon atoms, more preferably 4 to 12 carbon atoms, and most preferably 5 to 10 carbon atoms. Specific examples include groups in which one or more hydrogen atoms have been removed from a monocycloalkane or a polycycloalkane such as a bicycloalkane, tricycloalkane or tetracycloalkane which may or may not be substituted with a fluorine atom or a fluorinated alkyl group. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

Examples of the lactone-containing polycyclic group for $R_{02}"$ include groups represented by the aforementioned general formulae (a2-r-1) to (a2-r-6).

The hydroxyalkyl group for $Ra'^{21}$ preferably has 1 to 6 carbon atoms, and specific examples thereof include the alkyl groups for $Ra'^{21}$ in which at least one hydrogen atom has been substituted with a hydroxy group.

In aforementioned formulae (a2-r-1), (a2-r-2) and (a2-r-4), as the alkylene group of 1 to 5 carbon atoms represented by A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—. As A", an alkylene group of 1 to 5 carbon atoms or —O— is preferable, more preferably an alkylene group of 1 to 5 carbon atoms, and most preferably a methylene group.

Specific examples of the groups represented by the general formulae (a2-r-1) to (a2-r-6) are shown below.

[Chemical Formula 5]
(r-lc-1-1) 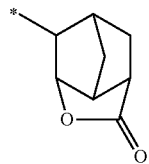
(r-lc-1-2) 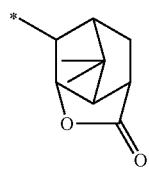
(r-lc-1-3) 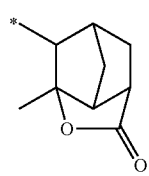
(r-lc-1-4) 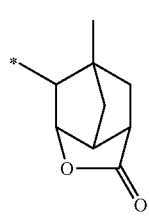
(r-lc-1-5) 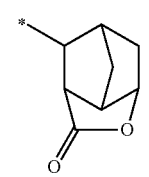
(r-lc-1-6) 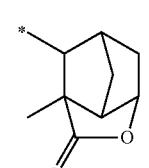
(r-lc-1-7) 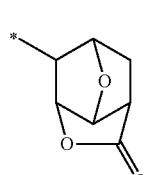
(r-lc-1-8) 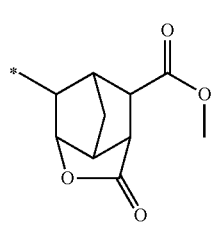
(r-lc-1-9) 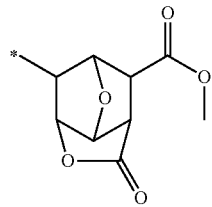
(r-lc-1-10) 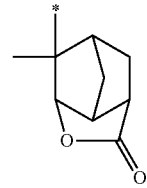
(r-lc-1-11) 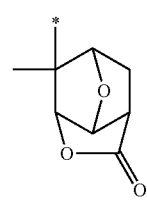
(r-lc-1-12) 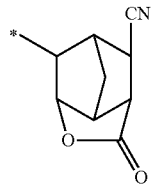
(r-lc-1-13) 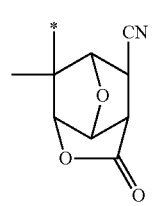
(r-lc-1-14) 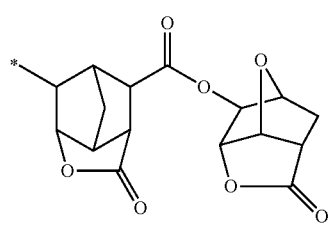
(r-lc-1-15) 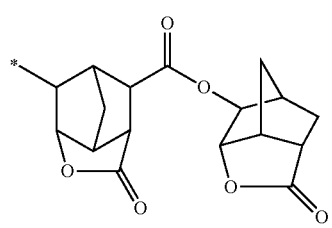

(r-lc-1-16)
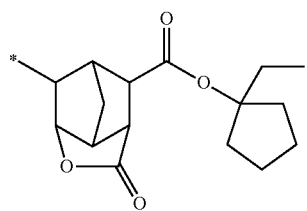
(r-lc-2-1)
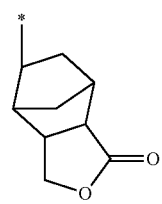
(r-lc-2-2)
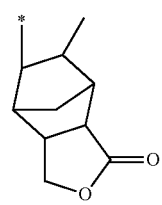
(r-lc-2-3)
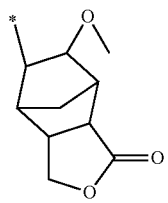
(r-lc-2-4)
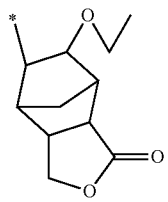
(r-lc-2-5)
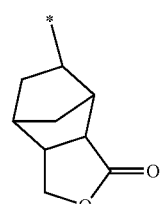
[Chemical Formula 6]
(r-lc-3-1)
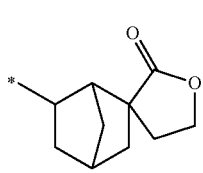
(r-lc-3-2)
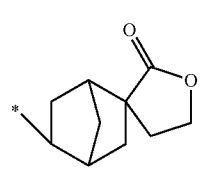
(r-lc-3-3)
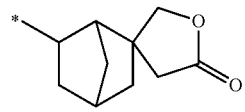
(r-lc-3-4)
(r-lc-3-5)
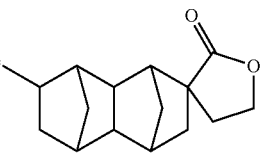
(r-lc-3-6)
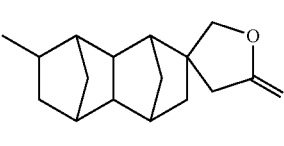
(r-lc-3-7)
(r-lc-3-8)
(r-lc-3-9)
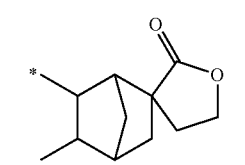
(r-lc-4-1)
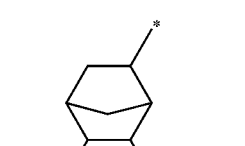
(r-lc-4-2)
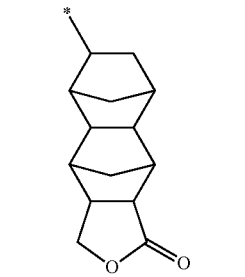

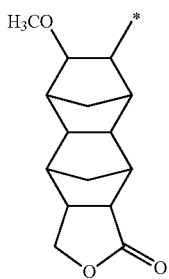
(r-1c-4-3)

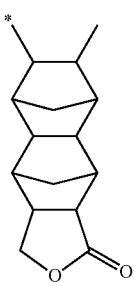
(r-1c-4-4)

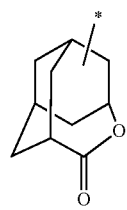
(r-1c-5-1)

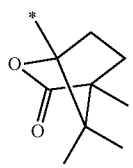
(r-1c-6-1)

Among these examples, as the lactone-containing polycyclic group, a group represented by the aforementioned formula (a2-r-1) or a group represented by the aforementioned formula (a2-r-5) is preferable.

Among the groups represented by the aforementioned formula (a2-r-1), a group represented by the aforementioned chemical formula (r-1c-1-1) or a group represented by chemical formula (r-1c-1-7) is particularly desirable.

Among the groups represented by the aforementioned formula (a2-r-5), a group represented by the aforementioned chemical formula (r-1c-5-1) is particularly desirable.

The term "carbonate-containing polycyclic group" refers to a polycyclic group including a ring containing a —O—C(=O)—O— in the ring skeleton thereof (carbonate ring). The carbonate ring is counted as the first ring, and groups containing other ring structures are described as polycyclic groups regardless of the structure of the other rings.

The carbonate-containing cyclic group for $Ra^{011}$ is not particularly limited, and an arbitrary group may be used. Specific examples include groups represented by general formulae (ax3-r-2) to (ax3-r-3) shown below.

[Chemical Formula 7]

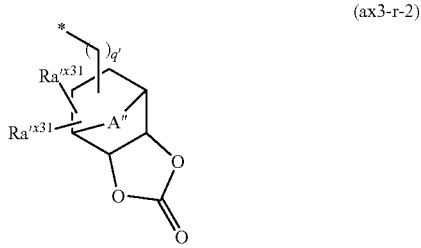
(ax3-r-2)

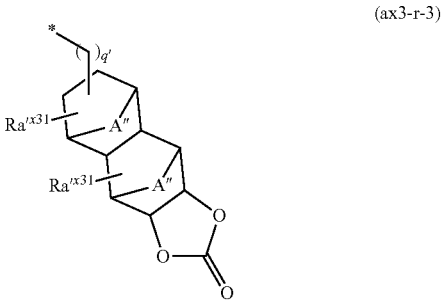
(ax3-r-3)

In the formulae, each $Ra'^{x31}$ independently represents a hydrogen atom, an alkyl group, an alkoxy group, a halogen atom, a halogenated alkyl group, a hydroxy group, —COOR$_{o3}$", —OC(=O)R$_{o3}$", a hydroxyalkyl group or a cyano group; R$_{o3}$" represents a hydrogen atom, an alkyl group or a lactone-containing polycyclic group; A" represents an alkylene group of 1 to 5 carbon atoms which may contain an oxygen atom (—O—) or a sulfur atom (—S—), an oxygen atom, or a sulfur atom; and q' represents 0 or 1.

In the aforementioned general formulae (ax3-r-2) to (ax3-r-3), A" is the same as defined for A" in general formula (a2-r-1).

Examples of the alkyl group, alkoxy group, halogen atom, halogenated alkyl group and hydroxyalkyl group for $Ra'^{x31}$ include the same groups as those described above in the explanation of $Ra'^{21}$ in the aforementioned general formulae (a2-r-1) to (a2-r-6).

The alkyl group for R$_{o3}$" is the same as defined for the alkyl group for R$_{o2}$".

Examples of the carbonate-containing polycyclic group for R$_{o3}$" include groups represented by the aforementioned general formulae (ax3-r-2) to (ax3-r-3).

Specific examples of the groups represented by general formulae (ax3-r-2) to (ax3-r-3) are shown below.

[Chemical Formula 8]

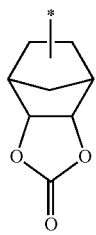
(r-cr-2-1)

(r-cr-2-2)
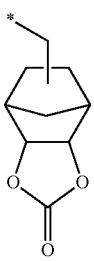

(r-cr-2-3)
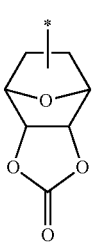

(r-cr-2-4)
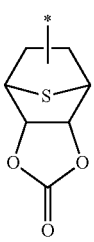

(r-cr-3-1)
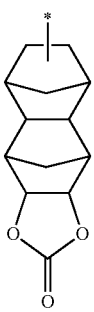

(r-cr-3-2)
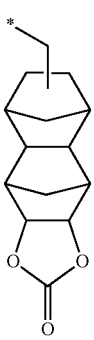

(r-cr-3-3)

(r-cr-3-4)
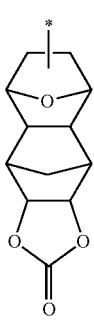

(r-cr-3-5)
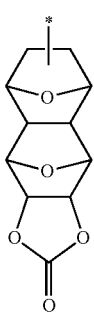

Polycyclic Group Containing —SO$_2$— in Ring Skeleton Thereof

A polycyclic group containing —SO$_2$— in the ring skeleton thereof (—SO$_2$-containing cyclic group) refers to a polycyclic group in which the sulfur atom (S) within SO$_2$— forms part of the ring skeleton of the cyclic group. The ring containing —SO$_2$-within the ring skeleton thereof is counted as the first ring. A group containing other ring structures is described as a polycyclic group regardless of the structure of the other rings.

As the —SO$_2$— containing polycyclic group for Ra$^{o11}$, a polycyclic group containing —O—SO$_2$— within the ring skeleton thereof, i.e., a polycyclic group containing a sultone ring in which —O—S— within the O—SO$_2$— group forms part of the ring skeleton thereof is particularly desirable. More specific examples of the —SO$_2$— containing polycyclic group include groups represented by general formulae (a5-r-1) to (a5-r-2) shown below.

[Chemical Formula 9]

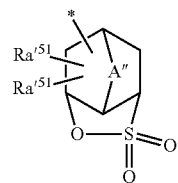
(a5-r-1)

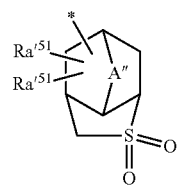
(a5-r-2)

In the formulae, each $Ra'^{51}$ independently represents a hydrogen atom, an alkyl group, an alkoxy group, a halogen atom, a halogenated alkyl group, a hydroxy group, —$COOR_{05}''$, —$OC(=O)R_{05}''$, a hydroxyalkyl group or a cyano group; $R_{05}''$ represents a hydrogen atom, an alkyl group or a —$SO_2$— containing polycyclic group; A" represents an alkylene group of 1 to 5 carbon atoms which may contain an oxygen atom (—O—) or a sulfur atom (—S—), an oxygen atom, or a sulfur atom.

In the aforementioned general formulae (a5-r-1) to (a5-r-2), A" is the same as defined for A" in the aforementioned general formula (a2-r-1).

Examples of the alkyl group, alkoxy group, halogen atom, halogenated alkyl group and hydroxyalkyl group for $Ra'^{51}$ include the same groups as those described above in the explanation of $Ra'^{21}$ in the aforementioned general formulae (a2-r-1) to (a2-r-6).

The alkyl group for $R_{05}''$ is the same as defined for the alkyl group for $R_{02}''$.

Examples of the —$SO_2$— containing polycyclic group for $R_{05}''$ include groups represented by the aforementioned general formulae (a5-r-1) to (a5-r-2).

Specific examples of the groups represented by the aforementioned general formulae (a5-r-1) to (a5-r-2) are shown below. In the formulae shown below, "Ac" represents an acetyl group.

[Chemical Formula 10]

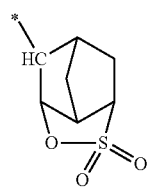
(r-sl-1-1)

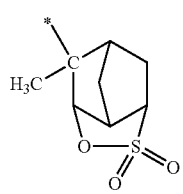
(r-sl-1-2)

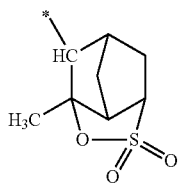
(r-sl-1-3)

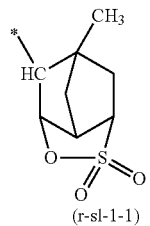
(r-sl-1-4)

(r-sl-1-1)

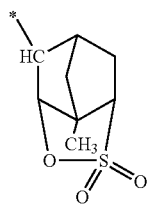
(r-sl-1-5)

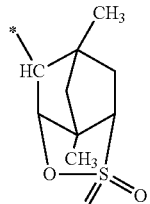
(r-sl-1-6)

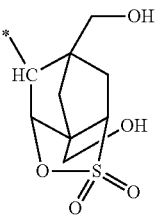
(r-sl-1-7)

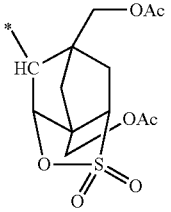
(r-sl-1-8)

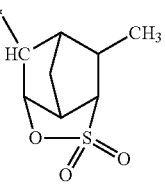
(r-sl-1-9)

(r-sl-1-10) (r-sl-1-18)
(r-sl-1-11) (r-sl-1-19)
(r-sl-1-12) (r-sl-1-20)
(r-sl-1-13) (r-sl-1-21)

[Chemical Formula 11]

(r-sl-1-14)
(r-sl-1-22)
(r-sl-1-15)
(r-sl-1-16) (r-sl-1-23)
(r-sl-1-17) (r-sl-1-24)

(r-sl-1-25) 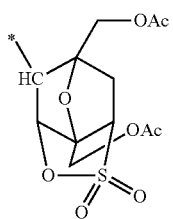

(r-sl-1-26) 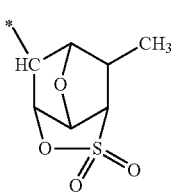

(r-sl-1-27) 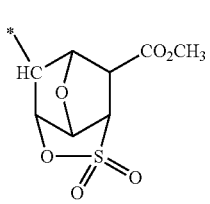

(r-sl-1-28) 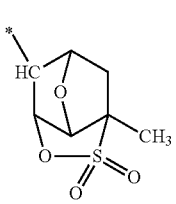

(r-sl-1-29) 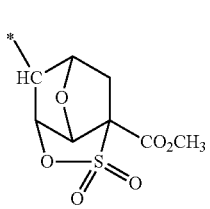

(r-sl-1-30) 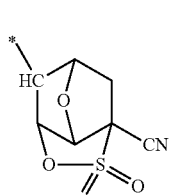

(r-sl-1-31) 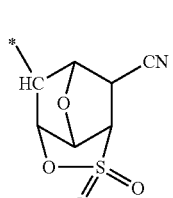

(r-sl-1-32) 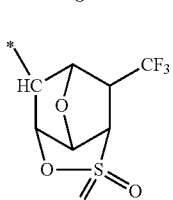

(r-sl-1-33) 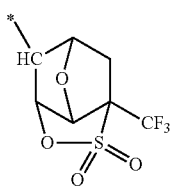

[Chemical Formula 12]

(r-sl-2-1) 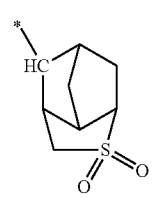

(r-sl-2-2) 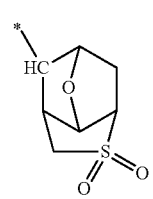

As the —$SO_2$— containing polycyclic group, a group represented by the aforementioned general formula (a5-r-1) is preferable, the groups represented by the aforementioned chemical formulae (r-s1-1-1) and (r-s1-1-18) are more preferable, and a group represented by aforementioned chemical formula (r-s1-1-1) is most preferable.

Cyclic Group Containing —CO—N< in Ring Skeleton Thereof

A cyclic group containing —CO—N< in the ring skeleton thereof for $Ra^{011}$ refers to a cyclic group in which the carbon atom (C) and the nitrogen atom (N) within —CO—N< form part of the ring skeleton of the cyclic group.

Specific examples of the cyclic group containing —CO—N< in the ring skeleton thereof are shown below.

[Chemical Formula 13]

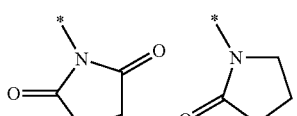

Cyclic Group which May have a Group Represented by -$Va^{011}$-N($Ra^{012}$)($Ra^{013}$) as Substituent Examples of the cyclic group for $Ra^{011}$ include an alicyclic hydrocarbon group (a group in which two hydrogen atoms have been removed from an aliphatic hydrocarbon ring), an aromatic hydrocarbon group (a group in which two or more hydrogen atoms have been removed from an aromatic hydrocarbon ring), and an alicyclic hydrocarbon group (a group in which two or more hydrogen atoms have been removed from an aliphatic hydrocarbon ring) is desirable.

The aliphatic cyclic ring may be either polycyclic or monocyclic. The monocyclic aliphatic hydrocarbon ring preferably has 3 to 6 carbon atoms, and specific examples thereof include cyclopentane and cyclohexane. The polycyclic aliphatic hydrocarbon ring preferably has 7 to 12 carbon atoms, and specific examples thereof include adamantane, norbornane, isobornane, tricyclodecane and tetracyclododecane.

Among these examples, polycyclic aliphatic hydrocarbon ring is preferable. Therefore, the cyclic group for Ra$^{o11}$ is preferably a group in which two or more hydrogen atoms have been removed from a polycyclic aliphatic hydrocarbon ring. Among these, groups in which two or more hydrogen atoms have been removed from adamantane, norbornane or tetracyclododecane are preferred in consideration of industrial availability.

Substituent Represented by -Va$^{o11}$-N(Ra$^{o12}$)(Ra$^{o13}$)

Va$^{o11}$ in the formula representing the substituent represents —CO— or —SO$_2$.

In the aforementioned formula, Ra$^{o12}$ and Ra$^{o13}$ independently represent a hydrogen atom, —CO—Ra$^{o14}$ or —SO$_2$—Ra$^{o15}$.

Ra$^{o14}$ and Ra$^{o15}$ independently represents an alkyl group of 1 to 5 carbon atoms, preferably an alkyl group of 1 to 3 carbon atoms, and more preferably a methyl group.

Specific examples of the substituent represented by -Va$^{o01}$-N(Ra$^{o12}$)(Ra$^{o13}$) are shown below.

[Chemical Formula 14]

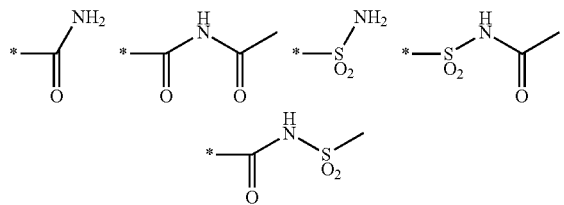

However, when La$^{o11}$ represents —CO—N(R')— in the aforementioned formula (a01-1), Ra$^{o11}$ may represents a monocyclic group containing —O—CO— in the ring skeleton thereof.

Examples of a monocyclic group containing —O—CO— in the ring skeleton thereof for Ra$^{o11}$ include a lactone-containing monocyclic group and a carbonate ring-containing monocyclic group.

The term "lactone-containing monocyclic group" refers to a cyclic group consisting of a ring containing a —O—C(=O)— structure (lactone ring).

The lactone-containing monocyclic group for Ra$^{o11}$ is not particularly limited, and an arbitrary group may be used. Specific examples include a group represented by general formula (a2-r-7) shown below.

[Chemical Formula 15]

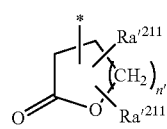

(a2-r-7)

In the formulae, each Ra'$^{211}$ independently represents a hydrogen atom, an alkyl group, an alkoxy group, a halogen atom, a halogenated alkyl group, a hydroxy group, —COOR$_2$", —OC(=O)R$_2$", a hydroxyalkyl group or a cyano group; R$_2$" represents a hydrogen atom, an alkyl group or a lactone-containing monocyclic group; and n' represents an integer of 0 to 2.

In the aforementioned formula (a2-r-7), examples of the alkyl group, alkoxy group, halogen atom, halogenated alkyl group and hydroxyalkyl group for Ra'$^{211}$ include the same groups as Ra'$^{21}$ in the aforementioned general formulae (a2-r-1) to (a2-r-6).

In —COOR$_2$" and —OC(=O)R$_2$" for Ra'$^{211}$, the alkyl group of R$_2$" is the same as defined for the alkyl group of R$_{02}$" for Ra'$^{21}$ in the aforementioned formulae (a2-r-1) to (a2-r-6).

Examples of the lactone-containing monocyclic group for R$_2$" include a group represented by the aforementioned general formula (a2-r-7).

n' represents an integer of 0 to 2, preferably 0 or 1, and most preferably 1.

Specific examples of the group represented by general formula (a2-r-7) are shown below.

[Chemical Formula 16]

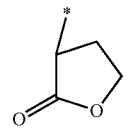

(r-lc-7-1)

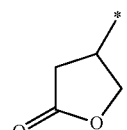

(r-lc-7-2)

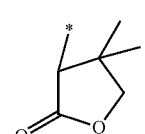

(r-lc-7-3)

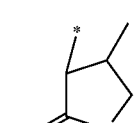

(r-lc-7-4)

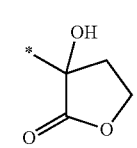

(r-lc-7-5)

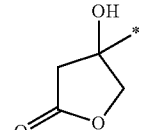

(r-lc-7-6)

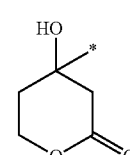

(r-lc-7-7)

The term "carbonate-containing monocyclic group" refers to a cyclic group consisting of a ring containing a —O—C(=O)—O— structure (carbonate ring).

The carbonate-containing monocyclic group for Ra$^{o11}$ is not particularly limited, and an arbitrary group may be used.

Specific examples include a group represented by general formula (ax3-r-1) shown below.

[Chemical Formula 17]

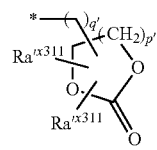

(ax3-r-1)

In the formulae, each $Ra'^{x311}$ independently represents a hydrogen atom, an alkyl group, an alkoxy group, a halogen atom, a halogenated alkyl group, a hydroxy group, —COOR$_3$", —OC(=O)R$_3$", a hydroxyalkyl group or a cyano group; R$_3$" represents a hydrogen atom, an alkyl group or a carbonate ring-containing monocyclic group; p' represents an integer of 0 to 3; and q' represents 0 or 1.

In the aforementioned general (ax3-r-1), examples of the alkyl group, alkoxy group, halogen atom, halogenated alkyl group, —COOR$_3$", —OC(=O)R$_3$" and hydroxyalkyl group for $Ra'^{x311}$ include the same groups as those described above in the explanation of $Ra'^{21}$ in the general formulas (a2-r-1) to (a2-r-6).

Specific examples of the group represented by general formula (ax3-r-1) are shown below.

[Chemical Formula 18]

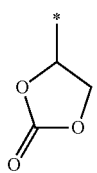

(r-cr-1-1)

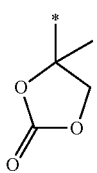

(r-cr-1-2)

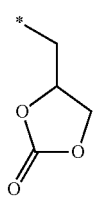

(r-cr-1-3)

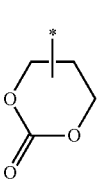

(r-cr-1-4)

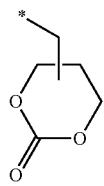

(r-cr-1-5)

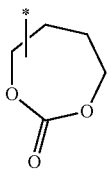

(r-cr-1-6)

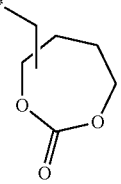

(r-cr-1-6)

Among these, $Ra^{011}$ in the aforementioned formula (a01-1) is preferably a polycyclic group containing at least one structure selected from the group consisting of —O—CO— and —SO$_2$— in the ring skeleton thereof, or a cyclic group containing a hydroxy group as a substituent. Of these, a combination of a polycyclic group containing at least one structure selected from the group consisting of —O—CO— and —SO$_2$— in the ring skeleton thereof with a cyclic group containing a hydroxy group is particularly desirable, in terms of pattern shape, resolution and process margin.

Specific examples of preferable structural units for the structural unit (a01) include structural units represented by general formula (a01-1-1) shown below.

[Chemical Formula 19]

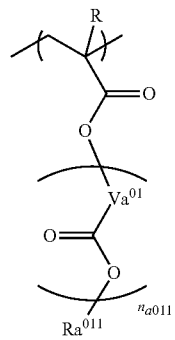

(a01-1-1)

In the formula, R, $Va^{01}$, $n_{a011}$ and $Ra^{011}$ are the same as defined above for R, $Va^{01}$, $n_{a011}$ and $Ra^{011}$.

Specific examples of the structural unit (a01) are shown below. In the formulas shown below, $R^{\alpha}$ represents a hydrogen atom, a methyl group or a trifluoromethyl group. $Ra'^{011}$ represents a cyclic group, in the case that $Ra^{011}$ represents a cyclic group having a group represented by -$Va^{001}$-N($Ra^{012}$)($Ra^{013}$ as a substituent.

[Chemical Formula 20]
(a01-1-101)
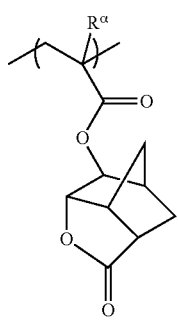
(a01-1-102)
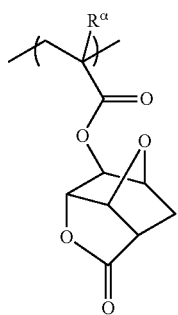
(a01-1-103)
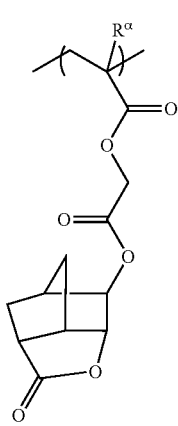
(a01-1-104)
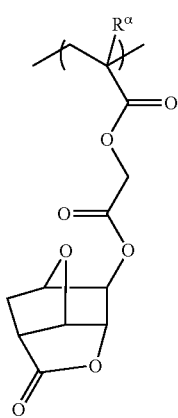
(a01-1-105)
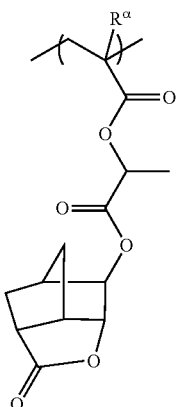
(a01-1-106)
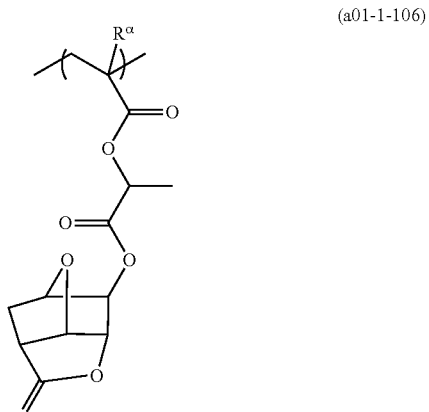
[Chemical Formula 21]
(a01-1-107)
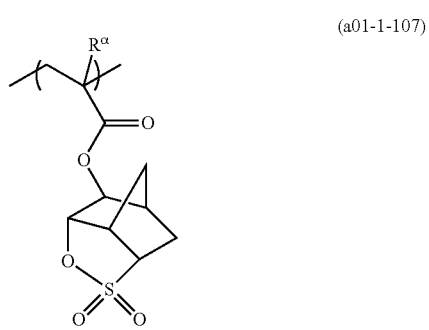
(a01-1-108)
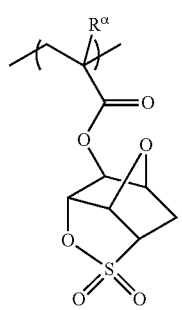

(a01-1-109)
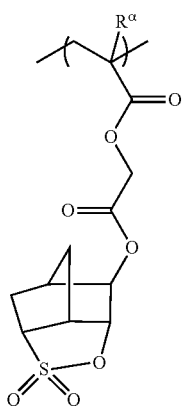
(a01-1-110)
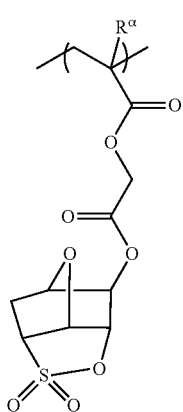
(a01-1-111)
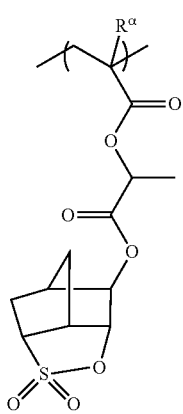
(a01-1-112)
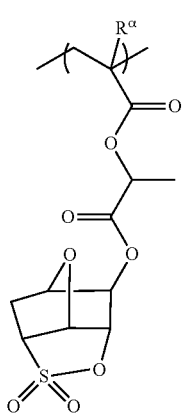
[Chemical Formula 22]
(a01-1-113)
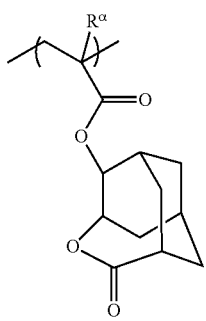
(a01-1-114)
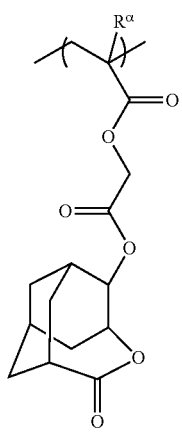
(a01-1-115)
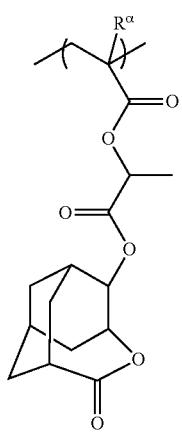
(a01-1-116)
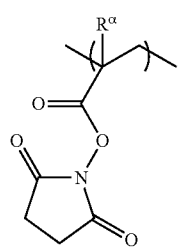

[Chemical Formula 23]

(a01-1-121)
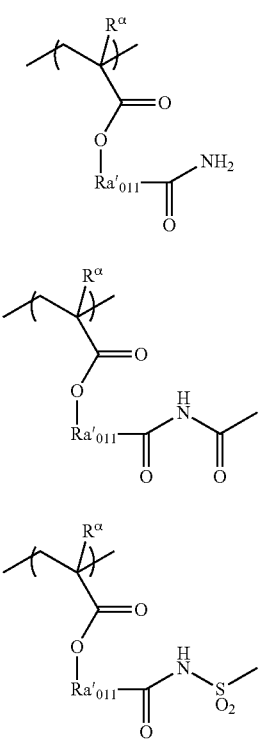

(a01-1-122)

(a01-1-123)

[Chemical Formula 24]

(a01-1-124)
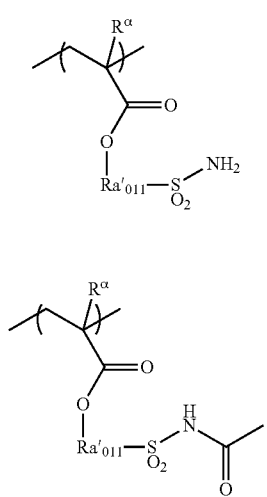

(a01-1-125)

[Chemical Formula 25]

(a01-2-01)
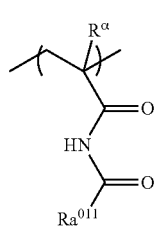

(a01-2-02)
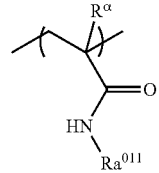

(a01-2-03)
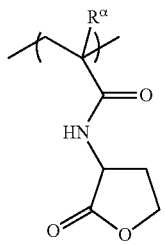

(a01-3-01)
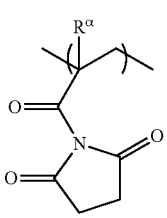

(a01-3-02)
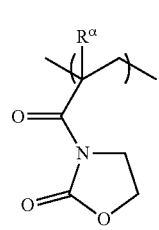

Of these, as the structural unit (a01), it is preferable to use at least one structural unit selected from the group consisting of formulas (a01-1-101) to (a01-1-11).

Among these, at least one member selected from the group consisting of a structural unit represented by any one of chemical formulae (a01-1-101), (a01-1-102), (a01-1-107) to (a01-1-112) and (a01-1-113) is more preferable.

As the structural unit (a01) contained in the component (A1), 1 kind of structural unit may be used, or 2 or more kinds may be used.

The amount of the structural unit (a01) within the component (A1) based on the combined total of all structural units constituting the component (A1) is preferably 5 to 70 mol %, more preferably 10 to 60 mol %, and still more preferably 20 to 60 mol %.

When the amount of the structural unit (a01) is at least as large as the lower limit of the above-mentioned range, in the formation of a resist pattern, diffusion of acid to the unexposed portions of the resist film can be especially suppressed, and a resist pattern can be formed with reduced roughness and an excellent shape. On the other hand, when the amount of the structural unit (a01) is no more than the upper limit of the above-mentioned range, a good balance can be achieved with the other structural units, and a resist pattern with further improved lithography properties and an excellent shape may be more reliably obtained.

Structural Unit (a04)

The structural unit (a04) is represented by general formula (a04-1) shown below.

The structural unit (a04) is a structural unit containing an acid decomposable group that exhibits increased polarity by the action of acid. The term "acid decomposable group" refers to a group in which at least a part of the bond within the structure thereof is cleaved by the action of an acid. In the structural unit (a04), an acid decomposable group has relatively low activation energy necessary to cleave a part of the bond within the structure of the acid decomposable group, i.e. the acid decomposable group described later is easily to dissociate under action of acid.

Such acid decomposable groups within the structural unit (a04) are decomposed by the action of an acid to form a polar group (carboxy group). That is, the acid decomposable group is a group in which the aforementioned polar group has been protected with an acid dissociable group (a side chain terminal group having a tertiary carbon atom bonded to oxygen atom).

As a result of forming a polar group (carboxy group), the polarity of the entire component (A1) is increased. As a result, the polarity of the entire component (A1) is increased, so that the solubility of the component (A1) in an organic developing solution is relatively decreased.

By using the component (A1) having such a structural unit (a04), in the formation of a resist pattern, reaction by acid, exposure or heating is uniformly occur in the resist film, and thus a resist pattern with further improved lithography properties can be formed.

[Chemical Formula 26]

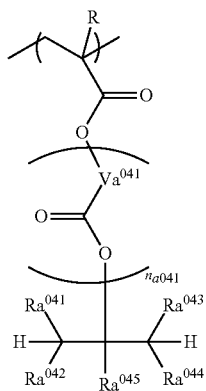

(a04-1)

In the formula, R represents a hydrogen atom, an alkyl group of 1 to 5 carbon atoms or a halogenated alkyl group of 1 to 5 carbon atoms. $Va^{041}$ represents a divalent linking group or a single bond. $n_{a041}$ represents 0 or 1. $Ra^{041}$, $Ra^{042}$, $Ra^{043}$ and $Ra^{044}$ each independently represent a linear or branched alkyl group of 1 to 5 carbon atoms which may have a substituent. $Ra^{045}$ represents a linear or branched alkyl group of 1 to 10 carbon atoms which may have a substituent.

In the aforementioned formula (a04-1), R represents a hydrogen atom, an alkyl group of 1 to 5 carbon atoms or a halogenated alkyl group of 1 to 5 carbon atoms. In the aforementioned formula (a04-1), R is the same as defined for R in the aforementioned formula (a01-1).

As R, a hydrogen atom, an alkyl group of 1 to 5 carbon atoms or a fluorinated alkyl group of 1 to 5 carbon atoms is preferable, a hydrogen atom or an alkyl group of 1 to 5 carbon atoms is more preferable in terms of industrial availability, an alkyl group of 1 to 5 carbon atoms is still more preferable, and a methyl group is particularly desirable.

In the aforementioned formula (a04-1), $Va^{041}$ represents a divalent linking group or a single bond. $Va^{041}$ is the same as defined for $Va^{01}$.

$Va^{041}$ is preferably a single bond, a linear or branched alkylene group, a combination of a linear or branched alkylene group and an ester bond [—C(=O)—O—], a combination of a linear or branched alkylene group and an ether bond (—O—), or a combination of a linear or branched alkylene group, an ester bond [—C(=O)—O—] and an ether bond (—O—), and more preferably a linear or branched alkylene group.

In the aforementioned formula (a04-1), $n_{a041}$ is 0 or 1, and preferably 0 in terms of formation of a resist pattern with more excellent shape.

In the aforementioned formula (a04-1), $Ra^{041}$, $Ra^{042}$, $Ra^{043}$ and $Ra^{044}$ each independently represent a linear or branched alkyl group of 1 to 5 carbon atoms which may have a substituent. Examples of the alkyl group for $Ra^{041}$, $Ra^{042}$, $Ra^{043}$ and $Ra^{044}$ include a methyl group, an ethyl group, a n-propyl group, an isopropyl group, an n-butyl group, an isobutyl group, a tert-butyl group, a pentyl group, an isopentyl group and a neopentyl group.

Among these, $Ra^{041}$, $Ra^{042}$, $Ra^{043}$ and $Ra^{044}$ are preferably a linear alkyl group of 1 to 5 carbon atoms, more preferably a linear alkyl group of 1 to 3 carbon atoms, and most preferably a methyl group.

Examples of the substituent which the alkyl group for $Ra^{041}$, $Ra^{042}$, $Ra^{043}$ and $Ra^{044}$ may have include a hydroxy group, an alkoxy group, a carbonyl group, a carboxy group, a cyano group a fluorine atom, and a chlorine atom.

In the aforementioned formula (a04-1), $Ra^{045}$ represents a linear or branched alkyl group of 1 to 10 carbon atoms which may have a substituent.

Specific examples of the alkyl group for $Ra^{045}$ include a methyl group, an ethyl group, an n-propyl group, an isopropyl group, an n-butyl group, an isobutyl group, a tert-butyl group, a pentyl group, an isopentyl group, a neopentyl group, a 1,1-dimethylethyl group, a 1,1-diethylpropyl group, a 2,2-dimethylpropyl group and a 2,2-dimethylbutyl group.

Among these, $Ra^{045}$ is preferably a linear or branched alkyl group of 1 to 5 carbon atoms, and more preferably a linear or branched alkyl group of 1 to 3 carbon atoms.

Specific examples of the structural unit (a04) are shown below. In the formulas shown below, $R^\alpha$ represents a hydrogen atom, a methyl group or a trifluoromethyl group.

[Chemical Formula 27]

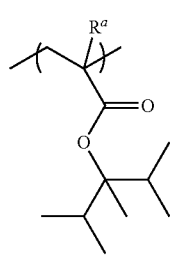

(a04-1-1)

-continued

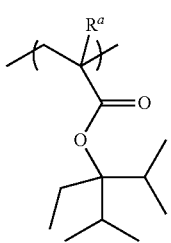
(a04-1-2)

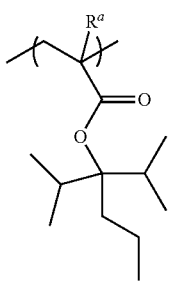
(a04-1-3)

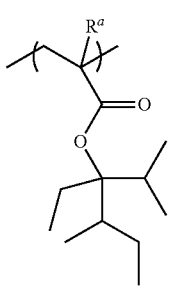
(a04-1-4)

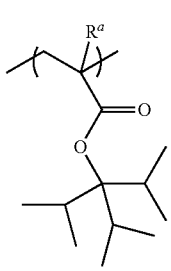
(a04-1-5)

Among these, as the structural unit (a04), at least one structural unit selected from the group consisting of formulae (a04-1-1) to (a04-1-5) is preferable in terms of reduction of roughness, and at least one structural unit selected from the group consisting of formulae (a04-1-1), (a04-1-3) and (a04-1-5) is more preferable.

As the structural unit (a04) contained in the component (A1), 1 kind of structural unit may be used, or 2 or more kinds may be used.

The amount of the structural unit (a04) within the component (A1) based on the combined total of all structural units constituting the component (A1) is preferably 5 to 70 mol %, more preferably 10 to 60 mol %, and still more preferably 10 to 50 mol %.

When the amount of the structural unit (a04) is at least as large as the lower limit of the above-mentioned range, in the formation of a resist pattern, reaction by acid, exposure or heating is uniformly occur in the resist film, and a resist pattern with further improved lithography properties can be formed. On the other hand, when the amount of the structural unit (a04) is no more than the upper limit of the above-mentioned range, a good balance can be achieved with the other structural units, and a resist pattern with further improved lithography properties and an excellent shape may be more reliably obtained.

Other Structural Units

The component (A1) may further include other structural unit, as well as the structural unit (a01) and the structural unit (a04).

As such a structural unit, any other structural unit which cannot be classified as one of the above structural unit (a01) and the structural unit (a04) can be used without any particular limitation, and any of the multitude of conventional structural units used within resist resins for ArF excimer lasers or KrF excimer lasers (and particularly for ArF excimer lasers) can be used. Examples include a structural unit (a02), a structural unit (a03), a structural unit (a05) and a structural unit which generates acid upon exposure.

Structural Unit (a02):

The structural unit (a02) is preferably at least one member selected from the group consisting of structural units represented by general formula (a02-1-1) shown below and structural units represented by general formula (a02-2-1) shown below.

[Chemical Formula 28]

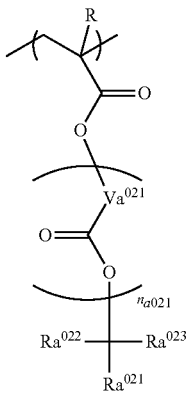
(a02-1-1)

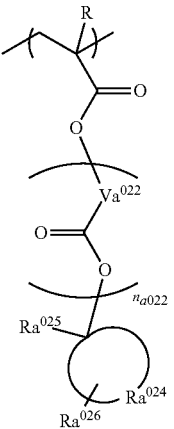
(a02-2-1)

In the formulae, each R independently represents a hydrogen atom, an alkyl group of 1 to 5 carbon atoms or a halogenated alkyl group of 1 to 5 carbon atoms. $Va^{021}$ and $Va^{022}$ each independently represent a divalent linking group or a single bond. $n_{a021}$ and $n_{a022}$ independently represents 0 or 1. $Ra^{021}$ represents a polycyclic alicyclic hydrocarbon group. $Ra^{022}$ and $Ra^{23}$ independently represent an alkyl group of 1 to 5 carbon atoms. $Ra^{024}$ is a group which forms an alicyclic hydrocarbon group with the carbon atom bonded to $Ra^{025}$. $Ra^{026}$ represents an alicyclic hydrocarbon group which may have a substituent or a hydrogen atom. When the total number of carbon atoms within the alicyclic hydrocarbon group formed by $Ra^{024}$ and $Ra^{026}$ is 3 to 7, $Ra^{025}$ is an alkyl group of 1 to 10 carbon atoms. When the total number of carbon atoms is 8 or more, $Ra^{025}$ is an alkyl group of 2 to 10 carbon atoms.

Structural Unit Represented by General Formula (a02-1-1)

The structural unit represented by general formula (a02-1-1) (hereafter, sometimes referred to as "structural unit (a02-1)") is a structural unit containing an acid decomposable group that exhibits increased polarity by the action of acid.

Such acid decomposable groups within the structural unit (a02-1) are decomposed by the action of an acid to form a polar group (carboxy group). That is, the acid decomposable group is a group in which the aforementioned polar group has been protected with an acid dissociable group (a side chain terminal group having a tertiary carbon atom bonded to oxygen atom).

As a result of forming a polar group (carboxy group), the polarity of the entire component (A1) is increased. As a result, the polarity of the entire component (A1) is increased, so that the solubility of the component (A1) in an organic developing solution is relatively decreased.

In the aforementioned formula (a02-1-1), R independently represents a hydrogen atom, an alkyl group of 1 to 5 carbon atoms or a halogenated alkyl group of 1 to 5 carbon atoms. In the aforementioned formula (a02-1-1), R is the same as defined for R in the aforementioned formula (a01-1).

As R, a hydrogen atom, an alkyl group of 1 to 5 carbon atoms or a fluorinated alkyl group of 1 to 5 carbon atoms is preferable, a hydrogen atom or an alkyl group of 1 to 5 carbon atoms is more preferable in terms of industrial availability, an alkyl group of 1 to 5 carbon atoms is still more preferable, and a methyl group is particularly desirable.

In the aforementioned formula (a02-1-1), $Va^{021}$ represents a divalent linking group or a single bond. $Va^{021}$ is the same as defined for $Va^{01}$.

$Va^{021}$ is preferably a single bond, a linear or branched alkylene group, a combination of a linear or branched alkylene group and an ester bond [—C(=O)—O—], a combination of a linear or branched alkylene group and an ether bond (—O—), or a combination of a linear or branched alkylene group, an ester bond [—C(=O)—O—] and an ether bond (—O—), and more preferably a linear or branched alkylene group.

In the aforementioned formula (a02-1-1), $n_{a021}$ is 0 or 1, and preferably 0 in terms of formation of a resist pattern with more excellent shape.

In aforementioned formula (a02-1-1), $Ra^{021}$ represents a polycyclic alicyclic hydrocarbon group. As the polycyclic alicyclic hydrocarbon group for $Ra^{021}$, a group in which one hydrogen atom has been removed from a polycycloalkane is preferable. The polycycloalkane preferably has 7 to 12 carbon atoms, and specific examples thereof include adamantane, norbornane, isobornane, tricyclodecane and tetracyclododecane.

In the aforementioned formula (a02-1-1), $Ra^{022}$ and $Ra^{023}$ each independently represents an alkyl group of 1 to 5 carbon atoms. As the alkyl group of 1 to 5 carbon atoms for $Ra^{022}$ and $Ra^{023}$, a linear or branched alkyl group is preferable, and specific examples thereof include a methyl group, an ethyl group, a n-propyl group, an isopropyl group, an n-butyl group, an isobutyl group, a tert-butyl group, a pentyl group, an isopentyl group and a neopentyl group. Among these, a methyl group or a ethyl group is particularly desirable.

Specific examples of structural units represented by general formula (a02-1-1) are shown below. In the formulas shown below, Ra represents a hydrogen atom, a methyl group or a trifluoromethyl group.

[Chemical Formula 29]

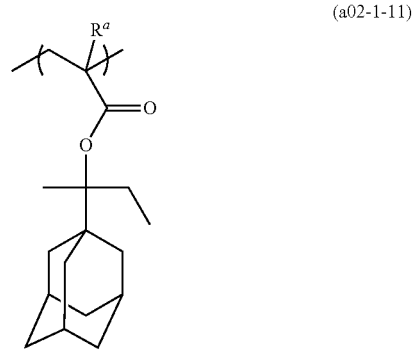

(a02-1-11)

Structural Unit Represented by General Formula (a02-2-1)

The structural unit represented by (a02-2-1) (hereafter, sometimes referred to as "structural unit (a02-2)") is a structural unit containing an acid decomposable group that exhibits increased polarity by the action of acid.

Such acid decomposable groups within the structural unit (a02-2) are decomposed by the action of an acid to form a polar group (carboxy group). That is, the acid decomposable group is a group in which the aforementioned polar group has been protected with an acid dissociable group (a side chain terminal group having a tertiary carbon atom bonded to oxygen atom).

As a result of forming a polar group (carboxy group), the polarity of the entire component (A1) is increased. As a result, the polarity of the entire component (A1) is increased, so that the solubility of the component (A1) in an organic developing solution is relatively decreased.

In the aforementioned formula (a02-2-1), R independently represents a hydrogen atom, an alkyl group of 1 to 5 carbon atoms or a halogenated alkyl group of 1 to 5 carbon atoms. In the aforementioned formula (a02-1-1), R is the same as defined for R in the aforementioned formula (a01-1).

As R, a hydrogen atom, an alkyl group of 1 to 5 carbon atoms or a fluorinated alkyl group of 1 to 5 carbon atoms is preferable, a hydrogen atom or an alkyl group of 1 to 5 carbon atoms is more preferable in terms of industrial availability, an alkyl group of 1 to 5 carbon atoms is still more preferable, and a methyl group is particularly desirable.

In the aforementioned formula (a02-2-1), $Va^{022}$ represents a divalent linking group or a single bond. $Va^{022}$ is the same as defined for $Va^{01}$.

$Va^{022}$ is preferably a single bond, a linear or branched alkylene group, a combination of a linear or branched alkylene group and an ester bond [—C(=O)—O—], a combination of a linear or branched alkylene group and an ether bond (—O—), or a combination of a linear or branched alkylene group, an ester bond [—C(=O)—O—] and an ether bond (—O—), and more preferably a linear or branched alkylene group.

In the aforementioned formula (a02-2-1), $n_{a022}$ is 0 or 1, and preferably 0 in terms of formation of a resist pattern with more excellent shape.

In the aforementioned formula (a02-2-1), $Ra^{024}$ is a group which forms an alicyclic hydrocarbon group with the carbon atom bonded to $Ra^{025}$.

The alicyclic hydrocarbon group formed by $Ra^{024}$ may be either polycyclic or monocyclic. As the monocyclic alicyclic hydrocarbon group, a group in which one or more hydrogen atoms have been removed from a monocycloalkane is preferable. The monocycloalkane preferably has 3 to 8 carbon atoms, and specific examples thereof include cyclopentane, cyclohexane and cyclooctane. As the polycyclic alicyclic hydrocarbon group, a group in which one or more hydrogen atoms have been removed from a polycycloalkane is preferable. The polycycloalkane preferably has 7 to 12 carbon atoms, and specific examples thereof include adamantane, norbornane, isobornane, tricyclodecane and tetracyclododecane. It is particularly desirable that the alicyclic hydrocarbon group formed by $Ra^{024}$ is a polycyclic group, in terms of large process margin.

In the aforementioned formula (a02-2-1), $Ra^{026}$ represents an alicyclic hydrocarbon group which may have a substituent or a hydrogen atom.

The alicyclic hydrocarbon group for $Ra^{026}$ may be either a polycyclic group or a monocyclic group. As the monocyclic aliphatic hydrocarbon group, a group in which 1 hydrogen atom has been removed from a monocycloalkane is preferable. The monocycloalkane preferably has 3 to 8 carbon atoms, and specific examples thereof include cyclopentane, cyclohexane and cyclooctane. As the polycyclic alicyclic hydrocarbon group, a group in which 1 hydrogen atoms have been removed from a polycycloalkane is preferable. The polycycloalkane preferably has 7 to 12 carbon atoms, and specific examples thereof include adamantane, norbornane, isobornane, tricyclodecane and tetracyclododecane. Among these, monocyclic alicyclic hydrocarbon group is preferable, a group in which 1 hydrogen atom have been removed from cyclopentane or cyclohexane is more preferable, and a group in which 1 hydrogen atom have been removed from cyclopentane is still more preferable Examples of the substituent which the alicyclic hydrocarbon group for $Ra^{026}$ may have include a hydroxy group, an alkoxy group, a carbonyl group, a carboxy group, a cyano group a fluorine atom, and a chlorine atom.

In the aforementioned formula (a02-2-1), when the total number of carbon atoms within the alicyclic hydrocarbon group formed by $Ra^{024}$ and $Ra^{026}$ is 3 to 7, $Ra^{025}$ is an alkyl group of 1 to 10 carbon atoms. The alkyl group for $Ra^{025}$ is preferably a linear or branched alkyl group of 1 to 10 carbon atoms, more preferably a linear or branched alkyl group of 1 to 5 carbon atoms, still more preferably a methyl group, an ethyl group, an n-propyl group and an isopropyl group.

In the aforementioned formula (a02-2-1), when the total number of carbon atoms within the alicyclic hydrocarbon group formed by $Ra^{024}$ and $Ra^{026}$ is 8 or more, preferably 8 to 20, $Ra^{025}$ is an alkyl group of 2 to 10 carbon atoms. The alkyl group for $Ra^{025}$ is preferably a linear or branched alkyl group of 2 to 10 carbon atoms, more preferably a linear or branched alkyl group of 2 to 5 carbon atoms, still more preferably an ethyl group, an n-propyl group and an isopropyl group.

Specific examples of structural units represented by general formula (a02-2-1) are shown below. In the formulas shown below, $R^\alpha$ represents a hydrogen atom, a methyl group or a trifluoromethyl group.

[Chemical Formula 30]

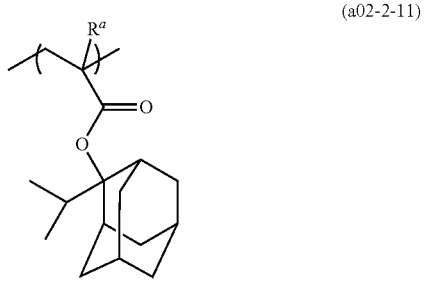

(a02-2-11)

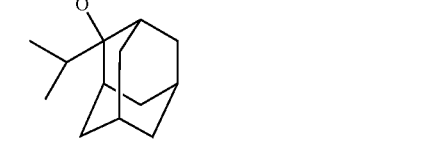

(a02-2-12)

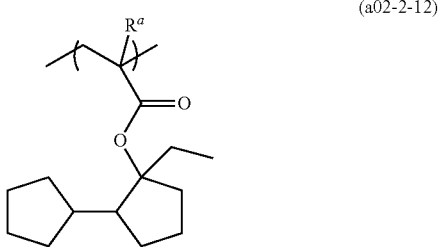

(a02-2-13)

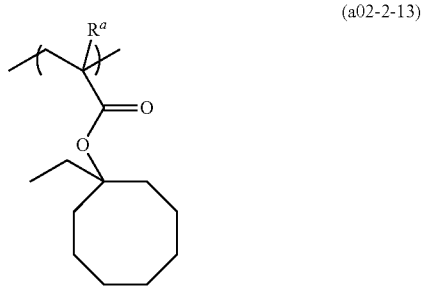

(a02-2-14)

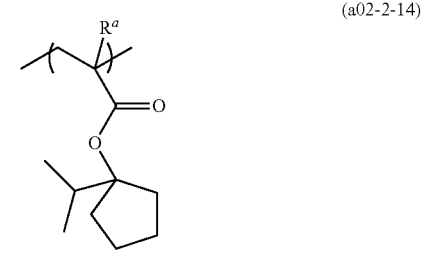

(a02-2-15)

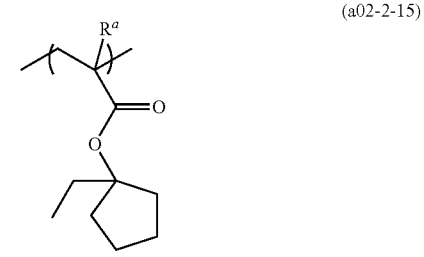

In the component (A1), by virtue of further including a structural unit (a02) as well as the structural unit (a01) and the structural unit (a04), the diffusion length of acid generated upon exposure within the resist film can be reliably controlled in the formation of a resist pattern.

By selecting a structural unit (a02-1) among the structural unit (a02), the acid generated upon exposure within the resist film can be relatively more diffusible, as compared to the case where the structural unit (a02) is not contained.

When a structural unit which has a polycyclic group as an alicyclic hydrocarbon group formed by $Ra^{024}$ is selected among the structural unit (a02-2), the acid generated upon exposure within the resist film can be relatively more diffusible, as compared to the case where the structural unit (a02) is not contained.

When a structural unit which has a monocyclic group as an alicyclic hydrocarbon group formed by $Ra^{024}$ is selected among the structural unit (a02-2), the acid generated upon exposure within the resist film can be relatively more diffusible, as compared to the case where the structural unit (a02) is not contained.

When the structural unit which has a polycyclic group as an alicyclic hydrocarbon group formed by $Ra^{024}$, the acid generated upon exposure within the resist film can be more diffusible as compared to the case that the structural unit has a monocyclic group.

Among these, the case that an acid decomposable group contains a polycyclic alicyclic hydrocarbon group (structural unit (a02-1); in structural unit (a02-2), the case that the alicyclic hydrocarbon group formed by $Ra^{024}$ is a polycyclic group) is desirable, in terms of large process margin, especially in formation of a trench pattern.

As the structural unit (a02) contained in the component (A1), 1 kind of structural unit may be used, or 2 or more kinds may be used.

The amount of the structural unit (a02) within the component (A1) based on the combined total of all structural units constituting the component (A1) is preferably 5 to 70 mol %, more preferably 10 to 60 mol %, and still more preferably 10 to 50 mol %.

When the amount of the structural unit (a02) is at least as large as the lower limit of the above-mentioned preferable range, resolution and process margin are improved in the formation of a resist pattern. On the other hand, when the amount of the structural unit (a02) is no more than the upper limit of the above-mentioned range, a good balance can be achieved with the other structural units, and a resist pattern with further improved lithography properties and an excellent shape may be more reliably obtained.

Structural Unit (a03):

The structural unit (a03) is represented by general formula (a03-1) shown below.

In the component (A1), by virtue of further including a structural unit (a03) as well as the structural unit (a01) and the structural unit (a04), the hydrophobicity of the component (A1) improves. Increase in the hydrophobicity contributes to improvement in terms of resolution, shape of the resist pattern and the like, particularly in a solvent developing process.

[Chemical Formula 31]

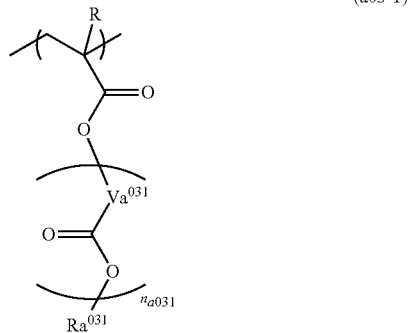

(a03-1)

In the formula, R represents a hydrogen atom, an alkyl group of 1 to 5 carbon atoms or a halogenated alkyl group of 1 to 5 carbon atoms. $Va^{031}$ represents a divalent linking group or a single bond. $n_{a031}$ represents 0 or 1. $Ra^{031}$ represents a hydrocarbon group of 2 or more carbon atoms which may have a fluorine atom.

In the aforementioned formula (a03-1), R represents a hydrogen atom, an alkyl group of 1 to 5 carbon atoms or a halogenated alkyl group of 1 to 5 carbon atoms. In the aforementioned formula (a03-1), R is the same as defined for R in the aforementioned formula (a01-1).

As R, a hydrogen atom, an alkyl group of 1 to 5 carbon atoms or a fluorinated alkyl group of 1 to 5 carbon atoms is preferable, a hydrogen atom or an alkyl group of 1 to 5 carbon atoms is more preferable in terms of industrial availability, an alkyl group of 1 to 5 carbon atoms is still more preferable, and a methyl group is particularly desirable.

In the aforementioned formula (a03-1), $Va^{031}$ represents a divalent linking group or a single bond. $Va^{031}$ is the same as defined for $Va^{01}$.

$Va^{031}$ is preferably a single bond, a linear or branched alkylene group, a combination of a linear or branched alkylene group and an ester bond [—C(═O)—O—], a combination of a linear or branched alkylene group and an ether bond (—O—), or a combination of a linear or branched alkylene group, an ester bond [—C(═O)—O—] and an ether bond (—O—), and more preferably a linear or branched alkylene group.

In the aforementioned formula (a03-1), $n_{a031}$ is 0 or 1, and preferably 0 in terms of formation of a resist pattern with more excellent shape.

In the aforementioned formula (a03-1), $Ra^{031}$ represents a hydrocarbon group of 2 or more carbon atoms which may have a fluorine atom.

The hydrocarbon group of 2 or more carbon atoms for $Ra^{031}$ may be either an aliphatic hydrocarbon group or an aromatic hydrocarbon group.

The aliphatic hydrocarbon group for $Ra^{031}$ may be either saturated or unsaturated, but is preferably saturated. As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 2 to 10 carbon atoms, and more preferably 2 to 5 carbon atoms. Among these, a linear aliphatic hydrocarbon group of 2 to 10 carbon atoms is preferable, and a linear aliphatic hydrocarbon group of 2 to 5 carbon atoms is particularly desirable.

As examples of the hydrocarbon group containing a ring in the structure thereof an alicyclic hydrocarbon group (a group in which one or more hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used. The alicyclic hydrocarbon group preferably has 3 to 20 carbon atoms, and more preferably 3 to 12 carbon atoms. The alicyclic hydrocarbon group may be either a monocyclic group or a polycyclic group. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group for $Ra^{031}$ is a hydrocarbon group having an aromatic ring. The aromatic ring contained in the aromatic hydrocarbon group is not particularly limited, as long as it is a cyclic conjugated compound having (4n+2) π electrons, and may be either monocyclic or polycyclic. The aromatic ring preferably has 5 to 30 carbon atoms, more preferably 5 to 20, still more preferably 6 to 15, and most preferably 6 to 12.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include pyridine ring, thiophene ring, and the like.

Specific examples of the aromatic hydrocarbon group for $Ra^{031}$ include a group in which one or more hydrogen atom has been removed from the aforementioned aromatic hydrocarbon ring or aromatic hetero ring (aryl group or heteroaryl group); a group in which one or more hydrogen atom has been removed from an aromatic compound having two or more aromatic rings (biphenyl, fluorene or the like); and a group in which one hydrogen atom of the aryl group or heteroaryl group has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group). The alkylene group which is bonded to the aforementioned aromatic hydrocarbon group or aromatic hetero ring preferably has 1 to 4 carbon atoms, and more preferably 1 or 2 carbon atoms.

The hydrocarbon group of 2 or more carbon atoms for $Ra^{031}$ may have a fluorine atom.

Among these, $Ra^{031}$ is preferably an aliphatic hydrocarbon group which may have a fluorine atom. Among these, an aliphatic hydrocarbon group containing a ring in the structure thereof is more preferable, an alicyclic hydrocarbon group is still more preferable, and a polycyclic alicyclic hydrocarbon group is particularly desirable in terms of improvement in resolution and shape of the resist pattern.

Specific examples of the structural unit (a03) are shown below. In the formulas shown below, $R^\alpha$ represents a hydrogen atom, a methyl group or a trifluoromethyl group.

[Chemical Formula 32]

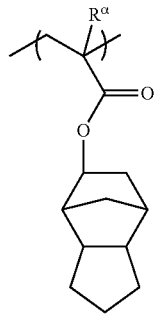

(a03-1-1)

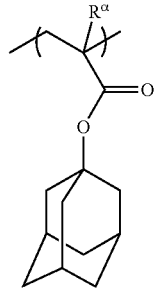

(a03-1-2)

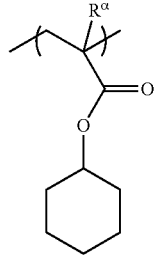

(a03-1-3)

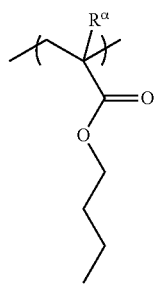

(a03-1-4)

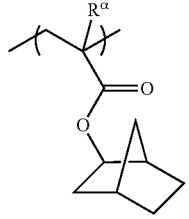

(a03-1-5)

[Chemical Formula 33]

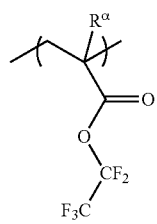
(a03-1-6)

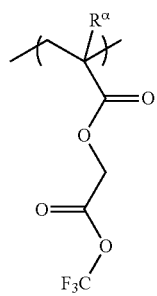
(a03-1-7)

Of these, as the structural unit (a03), it is preferable to use at least one structural unit selected from the group consisting of structural units represented by chemical formulae (a03-1-1) to (a03-1-7), in terms of excellent resolution and excellent shape of the resist pattern. Among these, it is more preferable to use at least one structural unit selected from the group consisting of structural units represented by chemical formulae (a03-1-1) to (a03-1-5), a structural unit represented by chemical formula (a03-1-1) is particularly desirable.

As the structural unit (a03) contained in the component (A1), 1 kind of structural unit may be used, or 2 or more kinds may be used.

The amount of the structural unit (a03) within the component (A1) based on the combined total of all structural units constituting the component (A1) is preferably 5 to 70 mol %, more preferably 10 to 60 mol %, and still more preferably 10 to 50 mol %.

When the amount of the structural unit (a03) is at least as large as the lower limit of the above-mentioned preferable range, the solubility of the resist film in an organic developing solution can be reliably increased, thereby improving the resolution, the shape of the resist pattern and the like. On the other hand, when the amount of the structural unit (a03) is no more than the upper limit of the above-mentioned range, a good balance can be achieved with the other structural units, and a resist pattern with further improved lithography properties and an excellent shape may be more reliably obtained.

Structural Unit (a05)

The structural unit (a05) is a structural unit containing a polar group-containing aliphatic hydrocarbon group (provided that the structural units that fall under the definition of structural units (a01) to (a04) are excluded).

When the component (A1) includes the structural unit (a05), the hydrophilicity of the component (A) is enhanced, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be a monocyclic group or a polycyclic group, and can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

As the structural unit (a05), there is no particular limitation as long as it is a structural unit containing a polar group-containing aliphatic hydrocarbon group, and an arbitrary structural unit may be used.

The structural unit (a05) is preferably a structural unit derived from an acrylate ester which may have the hydrogen atom bonded to the carbon atom on the α-position substituted with a substituent and contains a polar group-containing aliphatic hydrocarbon group.

When the aliphatic hydrocarbon group within the polar group-containing aliphatic hydrocarbon group is a linear or branched hydrocarbon group of 1 to 10 carbon atoms, the structural unit (a05) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 34]

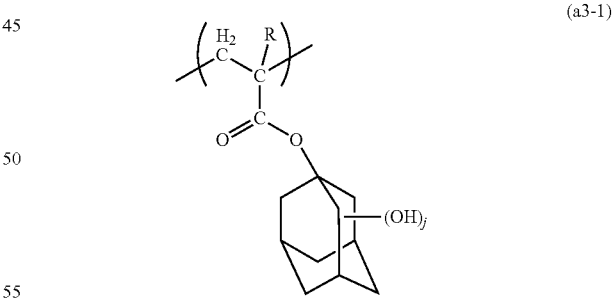
(a3-1)

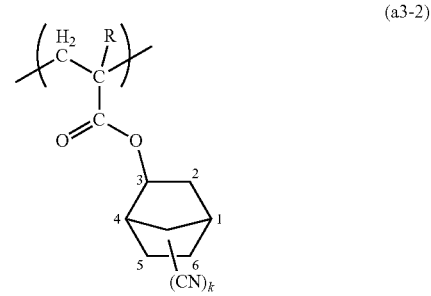
(a3-2)

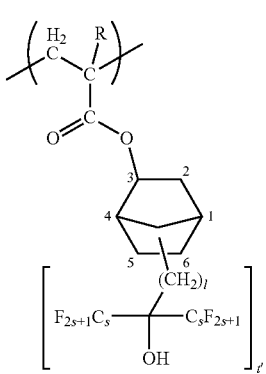

(a3-3)

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1, l is preferably 1, s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a05) contained in the component (A1), 1 type of structural unit may be used, or 2 or more types may be used.

When the component (A1) includes the structural unit (a05), the amount of the structural unit (a05) based on the combined total of all structural units constituting the component (A1) is preferably 5 to 50 mol %, more preferably 5 to 40 mol %, and still more preferably 5 to 35 mol %.

When the amount of the structural unit (a05) is at least as large as the lower limit of the above-mentioned preferable range, the effect of using the structural unit (a05) can be satisfactorily achieved. On the other hand, when the amount of the structural unit (a05) is no more than the upper limit of the above-mentioned preferable range, a good balance can be achieved with the other structural units.

The resist composition of the present embodiment contains a polymeric compound (component (A1)) having the aforementioned structural units (a01) and (a04).

Preferable examples of the component (A1) include a polymeric compound consisting of a repeating structure of the structural unit (a01) and the structural unit (a04); a polymeric compound consisting of a repeating structure of the structural unit (a01), the structural unit (a04) and the structural unit (a02); a polymeric compound consisting of a repeating structure of the structural unit (a01), the structural unit (a04) and the structural unit (a03); a polymeric compound consisting of a repeating structure of the structural unit (a01), the structural unit (a04), the structural unit (a02) and the structural unit (a03); a polymeric compound consisting of a repeating structure of the structural unit (a01), the structural unit (a04) and the structural unit (a05); a polymeric compound consisting of a repeating structure of the structural unit (a01), the structural unit (a04), the structural unit (a02) and the structural unit (a05); a polymeric compound consisting of a repeating structure of the structural unit (a01), the structural unit (a04), the structural unit (a03) and the structural unit (a05); and a polymeric compound consisting of a repeating structure of the structural unit (a01), the structural unit (a04), the structural unit (a02), the structural unit (a03) and the structural unit (a05).

Among these, a polymeric compound having the structural unit (a01), the structural unit (a04) and the structural unit (a02) is preferable in terms of improvement in roughness, resolution and process margin. More preferable examples include a polymeric compound consisting of a repeating structure of the structural unit (a01), the structural unit (a04), the structural unit (a02) and the structural unit (a03); a polymeric compound consisting of a repeating structure of the structural unit (a01), the structural unit (a04), the structural unit (a02) and the structural unit (a05); a polymeric compound consisting of a repeating structure of the structural unit (a01), the structural unit (a04), the structural unit (a02), the structural unit (a03) and the structural unit (a05). Further, a polymeric compound consisting of a repeating structure of the structural unit (a01), the structural unit (a04), the structural unit (a02), the structural unit (a03) and the structural unit (a05) is particularly desirable.

The weight average molecular weight (Mw) (the polystyrene equivalent value determined by gel permeation chromatography) of the component (A1) is not particularly limited, but is preferably 1,000 to 50,000, more preferably 1,500 to 30,000, and still more preferably 2,000 to 20,000.

When the Mw of the component (A1) is no more than the upper limit of the above-mentioned preferable range, the resist composition exhibits a satisfactory solubility in a resist solvent. On the other hand, when the Mw of the component (A1) is at least as large as the lower limit of the above-mentioned preferable range, dry etching resistance and the cross-sectional shape of the resist pattern becomes more satisfactory.

Further, the dispersity (Mw/Mn) of the component (A1) is not particularly limited, but is preferably 1.0 to 5.0, more preferably 1.0 to 4.0, and most preferably 1.0 to 3.0. Here, Mn is the number average molecular weight.

As the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is at least as large as the lower limit of the above-mentioned preferable range, the resolution of the pattern improves and process margin such as depth of focus (DOF) properties becomes more satisfactory.

[Component (A2)]

In the resist composition of the present embodiment, as the component (A), a base component which exhibits decreased solubility in an organic solvent contained in an organic developing solution under action of acid, other than the component (A1), (hereafter, referred to as "component (A2)") may be used in combination.

The component (A2) is not particularly limited, and any of the multitude of conventional base components used within chemically amplified resist compositions (e.g., base resins used within chemically amplified resist compositions for ArF excimer lasers or KrF excimer lasers, preferably ArF excimer lasers) can be used. As the component (A2), one kind of resin may be used, or two or more kinds of resins may be used in combination.

In the resist composition of the present embodiment, as the component (A), one type may be used, or two or more types of compounds may be used in combination.

In the resist composition of the present embodiment, the amount of the component (A) can be appropriately adjusted depending on the thickness of the resist film to be formed, and the like.

<Other Components>

The resist composition of the present embodiment may contain, in addition to the aforementioned component (A), any other components other than the component (A). Examples of the other components include the component (B), the component (D), the component (E), the component (F) and the component (S) described below.

[Component (B): Acid-Generator Component]

The resist composition of the present embodiment may include, in addition to the component (A), an acid-generator component (hereafter, referred to as "component (B)").

As the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators. Among these, it is preferable to use an onium salt acid generator.

Examples of the onium salt acid generator includes a compound represented by general formula (b-1) below (hereafter, sometimes referred to as "component (b-1)"), a compound represented by general formula (b-2) below (hereafter, sometimes referred to as "component (b-2)") and a compound represented by general formula (b-3) below (hereafter, sometimes referred to as "component (b-3)").

[Chemical Formula 35]

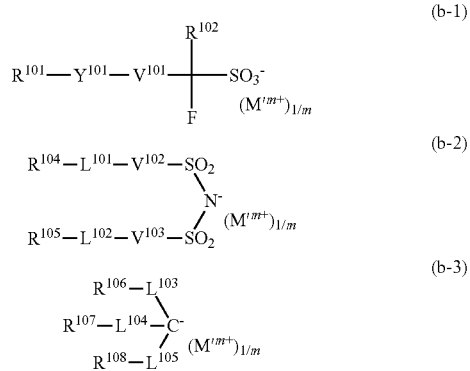

In the formulae, $R^{101}$ and $R^{104}$ to $R^{108}$ each independently represents a cyclic group which may have a substituent, a chain-like alkyl group which may have a substituent or a chain-like alkenyl group which may have a substituent, provided that $R^{104}$ and $R^{105}$ may be mutually bonded to form a ring; $R^{102}$ represents a fluorine atom or a fluorinated alkyl group of 1 to 5 carbon atoms. $Y^{101}$ represents a single bond or a divalent linking group containing an oxygen atom. $V^{101}$ to $V^{103}$ each independently represents a single bond, an alkylene group or a fluorinated alkylene group. $L^{101}$ and $L^{102}$ each independently represent a single bond or an oxygen atom. $L^{103}$ to $L^{105}$ each independently represents a single bond, —CO— or —SO$^2$—. m represents an integer of 1 or more, and $M'^{m+}$ represents an m-valent onium cation.

{Anion Moiety}

Anion Moiety of Component (b-1)

In the formula (b-1), $R^{101}$ represents a cyclic group which may have a substituent, a chain-like alkyl group which may have a substituent or a chain-like alkenyl group which may have a substituent.

Cyclic group which may have a substituent:

The cyclic group is preferably a cyclic hydrocarbon group, and the cyclic hydrocarbon group may be either an aromatic hydrocarbon group or an aliphatic hydrocarbon group. An "aliphatic hydrocarbon group" refers to a hydrocarbon group that has no aromaticity. The aliphatic hydrocarbon group may be either saturated or unsaturated, but in general, the aliphatic hydrocarbon group is preferably saturated.

The aromatic hydrocarbon group for $R^{101}$ is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group represented by $R^{101}$ include benzene, fluorene, naphthalene, anthracene, phenanthrene and biphenyl; and aromatic hetero rings in which part of the carbon atoms constituting the aforementioned aromatic rings has been substituted with a hetero atom. Examples of the hetero atom within the aromatic hetero rings include an oxygen atom, a sulfur atom and a nitrogen atom.

Specific examples of the aromatic hydrocarbon group represented by $R^{101}$ include a group in which one hydrogen atom has been removed from the aforementioned aromatic ring (i.e., an aryl group, such as a phenyl group or a naphthyl group), and a group in which one hydrogen of the aforementioned aromatic ring has been substituted with an alkylene group (e.g., an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atom, more preferably 1 or 2, and most preferably 1.

Examples of the cyclic aliphatic hydrocarbon group for $R^{101}$ include aliphatic hydrocarbon groups containing a ring in the structure thereof.

As examples of the hydrocarbon group containing a ring in the structure thereof, an alicyclic hydrocarbon group (a group in which one hydrogen atom has been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the polycyclic group preferably has 7 to 30 carbon atoms. Among polycycloalkanes, a polycycloalkane having a bridged ring polycyclic skeleton, such as adamantane, norbornane, isobornane, tricyclodecane or tetracyclododecane, and a polycycloalkane having a condensed ring polycyclic skeleton, such as a cyclic group having a steroid skeleton are preferable.

Among these examples, as the cyclic aliphatic hydrocarbon group for $R^{101}$, a group in which one or more hydrogen atoms have been removed from a monocycloalkane or a polycycloalkane is preferable, a group in which one or more hydrogen atoms have been removed from a polycycloalkane is more preferable, an adamantyl group or a norbornyl group is still more preferable, and an adamantyl group is most preferable.

The linear or branched aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$-] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The cyclic hydrocarbon group for $R^{101}$ may contain a hetero atom such as a heterocycle. Specific examples include lactone-containing cyclic groups represented by the aforementioned general formulae (a2-r-1) to (a2-r-7), the —$SO_2$— containing polycyclic group represented by the aforementioned formulae (a5-r-1) to (a5-r-2), and other heterocyclic groups represented by chemical formulae (r-hr-1) to (r-hr-16) shown below.

[Chemical Formula 36]

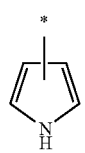

(r-hr-1)

(r-hr-2)

(r-hr-3)

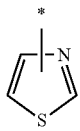

(r-hr-4)

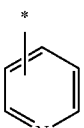

(r-hr-5)

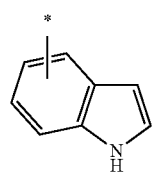

(r-hr-6)

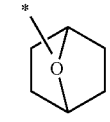

(r-hr-7)

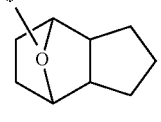

(r-hr-8)

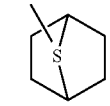

(r-hr-9)

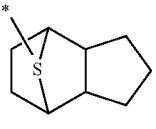

(r-hr-10)

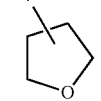

(r-hr-11)

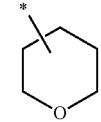

(r-hr-12)

(r-hr-13)

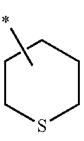
(r-hr-14)

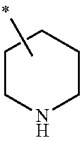
(r-hr-15)

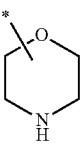
(r-hr-16)

As the substituent for the cyclic group for $R^{101}$, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The carbonyl group as the substituent is a group that substitutes a methylene group (—$CH_2$—) constituting the cyclic hydrocarbon group.

Chain-like alkyl group which may have a substituent:
The chain-like alkyl group for $R^{101}$ may be linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

Chain-like alkenyl group which may have a substituent:
The chain-like alkenyl group for $R^{101}$ may be linear or branched, and preferably has 2 to 10 carbon atoms, more preferably 2 to 5 carbon atoms, still more preferably 2 to 4 carbon atoms, and most preferably 3 carbon atoms. Examples of linear alkenyl groups include a vinyl group, a propenyl group (an allyl group) and a butynyl group. Examples of branched alkenyl groups include a 1-methylvinyl group, a 2-methylvinyl group, a 1-methylpropenyl group and a 2-methylpropenyl group.

Among these examples, as the chain-like alkenyl group, a linear alkenyl group is preferable, a vinyl group or a propenyl group is more preferable, and a vinyl group is most preferable.

As the substituent for the chain-like alkyl group or alkenyl group for $R^{101}$, an alkoxy group, a halogen atom, a halogenated alkyl group, a hydroxyl group, a carbonyl group, a nitro group, an amino group, a cyclic group for $R^{101}$ or the like can be used.

Among these examples, as $R^{101}$, a cyclic group which may have a substituent and a chain-like alkyl group which may have a substituent are preferable, a cyclic group which may have a substituent is more preferable, and a cyclic hydrocarbon group which may have a substituent is still more preferable.

Among these, a phenyl group, a naphthyl group, a group in which one or more hydrogen atoms have been removed from a polycycloalkane, a lactone-containing cyclic group represented by any one of the aforementioned formula (a2-r-1) to (a2-r-7), and an —$SO_2$— containing polycyclic group represented by any one of the aforementioned formula (a5-r-1) to (a5-r-2) are preferable. Of these, a group in which one or more hydrogen atoms have been removed from a polycycloalkane and —$SO_2$— containing polycyclic group represented by any one of the aforementioned formula (a5-r-1) to (a5-r-2) are more preferable.

In formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group. Furthermore, the combinations may have a sulfonyl group (—$SO_2$—) bonded thereto. Examples of divalent linking groups containing an oxygen atom include linking groups represented by general formulae (y-a1-1) to (y-a1-7) shown below.

[Chemical Formula 37]

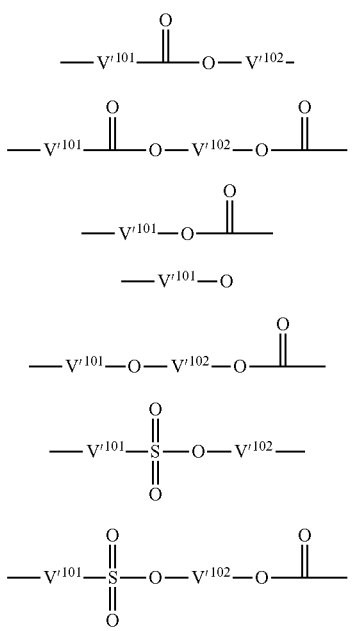

In the formulae, $V'^{101}$ represents a single bond or an alkylene group of 1 to 5 carbon atoms; $V'^{102}$ represents a divalent saturated hydrocarbon group of 1 to 30 carbon atoms.

The divalent saturated hydrocarbon group for $V'^{102}$ is preferably an alkylene group of 1 to 30 carbon atoms, more preferably an alkylene group of 1 to 10 carbon atoms, and still more preferably an alkylene group of 1 to 5 carbon atoms.

The alkylene group for $V'^{101}$ and $V'^{102}$ may be a linear alkylene group or a branched alkylene group, and a linear alkylene group is preferable.

Specific examples of the alkylene group for $V'^{101}$ and $V'^{102}$ include a methylene group [—$CH_2$—]; an alkylmethylene group, such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; an ethylene group [—$CH_2CH_2$—]; an alkylethylene group, such as —$CH(CH_3)CH_2$—, —$CH(CH_3)CH(CH_3)$—, —$C(CH_3)_2CH_2$— and —$CH(CH_2CH_3)CH_2$—; a trimethylene group (n-propylene group) [—$CH_2CH_2CH_2$—]; an alkyltrimethylene group, such as —$CH(CH_3)CH_2CH_2$— and —$CH_2CH(CH_3)CH_2$—; a tetramethylene group [—$CH_2CH_2CH_2CH_2$—]; an alkyltetramethylene group, such as —$CH(CH_3)CH_2CH_2CH_2$—, —$CH_2CH(CH_3)CH_2CH_2$—; and a pentamethylene group [—$CH_2CH_2CH_2CH_2CH_2$—].

Further, part of methylene group within the alkylene group for $V'^{101}$ and $V'^{102}$ may be substituted with a divalent aliphatic cyclic group of 5 to 10 carbon atoms. The aliphatic cyclic group is preferably a divalent group in which one hydrogen atom has been removed from the cyclic aliphatic hydrocarbon group (monocyclic aliphatic hydrocarbon group or polycyclic aliphatic hydrocarbon group) for $Ra^{031}$ in the aforementioned formula (a03-1), and a cyclohexylene group, 1,5-adamantylene group or 2,6-adamantylene group is more preferable.

$Y^{101}$ is preferably a divalent linking group containing an ether bond or a divalent linking group containing an ester bond, groups represented by the aforementioned formulas (y-a1-1) to (y-a1-5) are more preferable, and groups represented by the aforementioned formulas (y-a1-1) to (y-a1-3) are still more preferable.

In formula (b-1), $V^{101}$ represents a single bond, an alkylene group or a fluorinated alkylene group. The alkylene group and the fluorinated alkylene group for $V^{101}$ preferably have 1 to 4 carbon atoms. Examples of the fluorinated alkylene group for $V^{101}$ include a group in which part or all of the hydrogen atoms within the alkylene group for $V^{101}$ have been substituted with fluorine. Among these examples, as $V^{101}$, a single bond or a fluorinated alkylene group of 1 to 4 carbon atoms is preferable.

In formula (b-1), $R^{102}$ represents a fluorine atom or a fluorinated alkyl group of 1 to 5 carbon atoms. $R^{102}$ is preferably a fluorine atom or a perfluoroalkyl group of 1 to 5 carbon atoms, and more preferably a fluorine atom.

As a specific example of the anion moiety for the component (b-1), in the case where $Y^{101}$ a single bond, a fluorinated alkylsulfonate anion such as a trifluoromethanesulfonate anion or a perfluorobutanesulfonate anion can be mentioned; and in the case where $Y^{101}$ represents a divalent linking group containing an oxygen atom, anions represented by formulae (an-1) to (an-3) shown below can be mentioned.

[Chemical Formula 38]

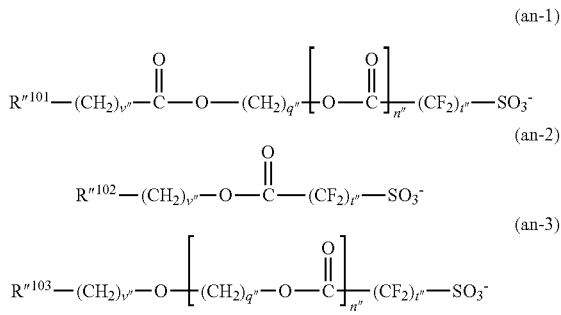

In the formulae, $R'''^{101}$ represents an aliphatic cyclic group which may have a substituent, a group represented by any one of the aforementioned formulas (r-hr-1) to (r-hr-6) or a chain-like alkyl group which may have a substituent; $R'''^{102}$ represents an aliphatic cyclic group which may have a substituent, a lactone-containing cyclic group represented by any one of the aforementioned formulae (a2-r-1) to (a2-r-7) or an —$SO_2$— containing polycyclic group represented by any one of the aforementioned formulae (a5-r-1) to (a5-r-2); $R'''^{103}$ represents an aromatic cyclic group which may have a substituent, an aliphatic cyclic group which may have a substituent or a chain-like alkenyl group which may have a substituent; $v''$ represents an integer of 0 to 3; $q''$ represents an integer of 1 to 20; $t''$ represents an integer of 1 to 3; and $n''$ represents 0 or 1.

As the aliphatic cyclic group for $R'''^{101}$, $R'''^{102}$ and $R'''^{103}$ which may have a substituent, the same groups as the cyclic aliphatic hydrocarbon group for $R^{101}$ described above are preferable. As the substituent, the same groups as those described above for substituting the cyclic aliphatic hydrocarbon group for $R^{101}$ can be mentioned.

As the aromatic cyclic group for $R'''^{103}$ which may have a substituent, the same groups as the aromatic hydrocarbon group for the cyclic hydrocarbon group represented by $R^{101}$ described above are preferable. The substituent is the same as defined for the substituent for the aromatic hydrocarbon group represented by $R^{101}$.

As the chain-like alkyl group for $R'''^{101}$ which may have a substituent, the same groups as those described above for $R^{101}$ are preferable. As the chain-like alkenyl group for $R'''^{103}$ which may have a substituent, the same groups as those described above for $R^{101}$ are preferable.

Anion Moiety of Component (b-2)

In formula (b-2), $R^{104}$ and $R^{105}$ each independently represents a cyclic group which may have a substituent, a chain-like alkyl group which may have a substituent or a chain-like alkenyl group which may have a substituent, and is the same as defined for $R^{101}$ in formula (b-1). $R^{104}$ and $R^{105}$ may be mutually bonded to form a ring.

As $R^{104}$ and $R^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, more preferably 1 to 7 carbon atoms, and still more preferably 1 to 3 carbon atoms. The smaller the number of carbon atoms of the chain-like alkyl group for $R^{104}$ and $R^{105}$, the more the solubility in a resist solvent is improved. Further, in the chain-like alkyl group for $R^{104}$ and $R^{105}$, it is preferable that the number of hydrogen atoms substituted with fluorine atoms is as large as possible because the acid strength increases and the transparency to high energy radiation of 200 nm or less or electron beam is improved.

The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), $V^{102}$ and $V^{103}$ each independently represents a single bond, an alkylene group or a fluorinated alkylene group, and is the same as defined for $V^{101}$ in formula (b-1).

In formula (b-2), $L^{101}$ and $L^{102}$ each independently represents a single bond or an oxygen atom.

Anion Moiety of Component (b-3)

In formula (b-3), $R^{106}$ to $R^{108}$ each independently represents a cyclic group which may have a substituent, a chain-like alkyl group which may have a substituent or a chain-like alkenyl group which may have a substituent, and is the same as defined for $R^{101}$ in formula (b-1).

$L^{103}$ to $L^{105}$ each independently represents a single bond, —CO— or —SO$_2$—.

{Cation Moiety}

In formulae (b-1), (b-2) and (b-3), m represents an integer of 1 or more, $M^{m+}$ represents an onium cation having a valency of m, preferably a sulfonium cation or an iodonium cation, and most preferably an organic cation represented by any one of the following formulae (ca-1) to (ca-4).

[Chemical Formula 39]

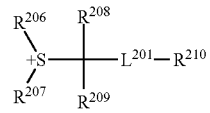
(ca-1)

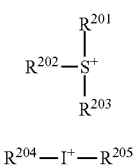
(ca-2)

-continued

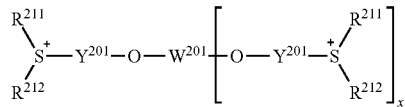
(ca-3)

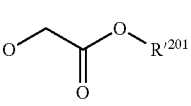
(ca-4)

In the formulae, $R^{201}$ to $R^{207}$, $R^{211}$ and $R^{212}$ independently represents an aryl group, an alkyl group or an alkenyl group, provided that two of $R^{201}$ to $R^{203}$, $R^{206}$ and $R^{207}$, or $R^{211}$ and $R^{212}$ may be mutually bonded to form a ring with the sulfur atom; $R^{208}$ and $R^{209}$ each independently represents a hydrogen atom or an alkyl group of 1 to 5 carbon atoms; $R^{210}$ represents an aryl group which may have a substituent, an alkyl group which may have a substituent, an alkenyl group which may have a substituent, or an —SO$_2$— containing cyclic group which may have a substituent; $L^{201}$ represents —C(=O)— or —C(=O)—O—; $Y^{201}$ each independently represents an arylene group, an alkylene group or an alkenylene group; x represents 1 or 2; and $W^{201}$ represents a linking group having a valency of (x+1).

As the aryl group for $R^{201}$ to $R^{207}$, $R^{211}$ and $R^{212}$, an unsubstituted aryl group of 6 to 20 carbon atoms can be mentioned, and a phenyl group or a naphthyl group is preferable.

The alkyl group for $R^{201}$ to $R^{207}$, $R^{211}$ and $R^{212}$ is preferably a chain-like or cyclic alkyl group having 1 to 30 carbon atoms.

The alkenyl group for $R^{201}$ to $R^{207}$, $R^{211}$ and $R^{212}$ preferably has 2 to 10 carbon atoms.

Specific examples of the substituent which $R^{201}$ to $R^{207}$ and $R^{210}$ to $R^{212}$ may have include an alkyl group, a halogen atom, a halogenated alkyl group, a carbonyl group, a cyano group, an amino group, an aryl group, and groups represented by formulae (ca-r-1) to (ca-r-7) shown below.

[Chemical Formula 40]

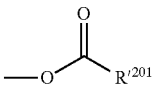
[ca-r-1]

[ca-r-2]

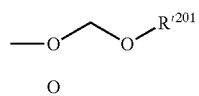
[ca-r-3]

[ca-r-4]

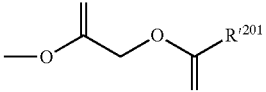
[ca-r-5]

[ca-r-6]

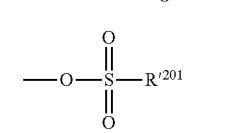

[ca-r-7]

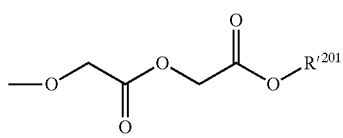

In the formulae, each $R'^{201}$ independently represents a hydrogen atom, a cyclic group which may have a substituent, a chain-like alkyl group which may have a substituent, or a chain-like alkenyl group which may have a substituent.

The cyclic group which may have a substituent, the chain-like alkyl group which may have a substituent and the chain-like alkenyl group which may have a substituent for $R'^{201}$ are the same groups as those defined above for $R'^{101}$ in the aforementioned formula (b-1). The cyclic group which may have a substituent and the chain-like alkyl group which may have a substituent for $R'^{201}$ are the same groups as those defined above as acid decomposable groups for the structural unit (a02-1) or the structural unit (a02-2).

When $R^{201}$ to $R^{303}$, $R^{206}$, $R^{207}$, $R^{211}$ and $R^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —SO$_2$—, —SO$_3$—, —COO—, —CONH— or —N(R$_N$)— (wherein R$_N$ represents an alkyl group of 1 to 5 carbon atoms). The ring containing the sulfur atom in the skeleton thereof is preferably a 3 to 10-membered ring, and most preferably a 5 to 7-membered ring. Specific examples of the ring formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

$R^{208}$ and $R^{209}$ each independently represents a hydrogen atom or an alkyl group of 1 to 5 carbon atoms, preferably a hydrogen atom or an alkyl group of 1 to 3 carbon atoms, and when $R^{208}$ and $R^{209}$ each represents an alkyl group, $R^{208}$ and $R^{209}$ may be mutually bonded to form a ring.

$R^{210}$ represents an aryl group which may have a substituent, an alkyl group which may have a substituent, an alkenyl group which may have a substituent, or an —SO$_2$— containing cyclic group which may have a substituent.

Examples of the aryl group for $R^{210}$ include an unsubstituted aryl group of 6 to 20 carbon atoms, and a phenyl group or a naphthyl group is preferable.

As the alkyl group for $R^{210}$, a chain-like or cyclic alkyl group having 1 to 30 carbon atoms is preferable.

The alkenyl group for $R^{210}$ preferably has 2 to 10 carbon atoms.

The —SO$_2$— containing cyclic group for $R^{210}$ which may have a substituent is preferably the aforementioned "—SO$_2$— containing polycyclic group", and the group represented by general formula (a5-r-1) is more preferable.

Each $Y^{201}$ independently represents an arylene group, an alkylene group or an alkenylene group.

Examples of the arylene group for $Y^{201}$ include groups in which one hydrogen atom has been removed from an aryl group given as an example of the aromatic hydrocarbon group for $R^{101}$ in the aforementioned formula (b-1).

Examples of the alkylene group and alkenylene group for $Y^{201}$ include groups in which one hydrogen atom has been removed from the chain-like alkyl group or the chain-like alkenyl group given as an example of $R^{101}$ in the aforementioned formula (b-1).

In the formula (ca-4), x represents 1 or 2.

$W^{201}$ represents a linking group having a valency of (x+1), i.e., a divalent or trivalent linking group.

As the divalent linking group for $W^{201}$, a divalent hydrocarbon group which may have a substituent is preferable, and as examples thereof, the same divalent hydrocarbon groups which may have a substituent, as those described above for Va$^{01}$ for La$^{011}$ in the aforementioned general formula (a01-1) can be mentioned. The divalent linking group for $W^{201}$ may be linear, branched or cyclic, and cyclic is more preferable. Among these, an arylene group having two carbonyl groups, each bonded to the terminal thereof is preferable. Examples of the arylene group include a phenylene group and a naphthylene group, and a phenylene group is particularly desirable.

As the trivalent linking group for $W^{201}$, a group in which one hydrogen atom has been removed from the aforementioned divalent linking group for $W^{201}$ and a group in which the divalent linking group has been bonded to another divalent linking group can be mentioned. The trivalent linking group for $W^{201}$ is preferably a group in which 2 carbonyl groups are bonded to an arylene group.

Specific examples of preferable cations represented by formula (ca-1) include cations represented by formulae (ca-1-1) to (ca-1-67) shown below.

[Chemical Formula 41]

(ca-1-1)

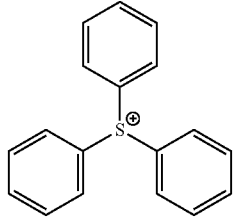

(ca-1-2)

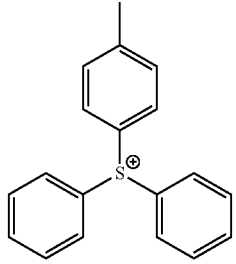

(ca-1-3)

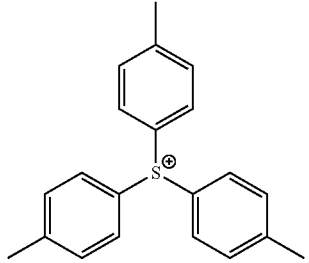

-continued
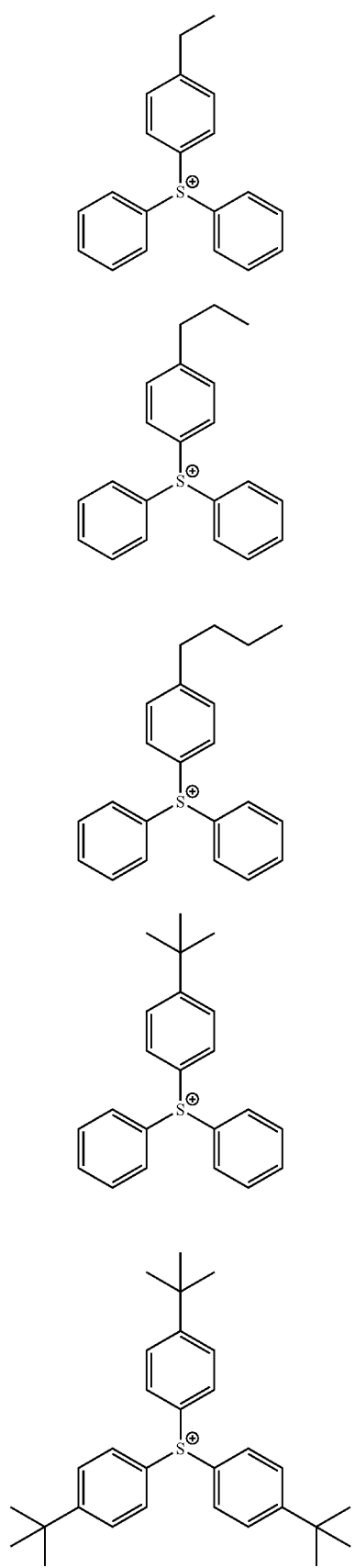
(ca-1-4)
(ca-1-5)
(ca-1-6)
(ca-1-7)
(ca-1-8)
-continued
(ca-1-9)
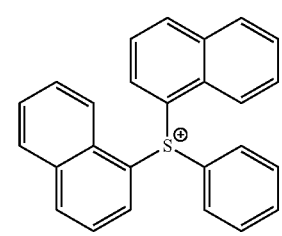
(ca-1-10)
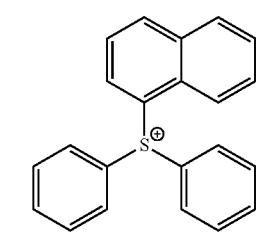
(ca-1-11)
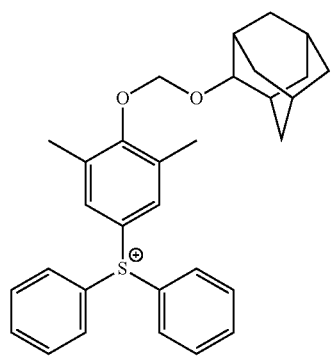
(ca-1-12)
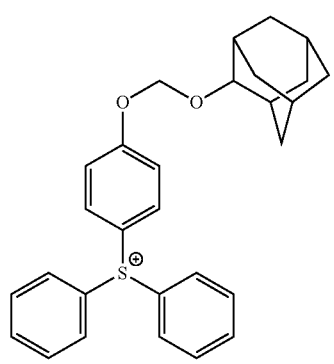
(ca-1-13)
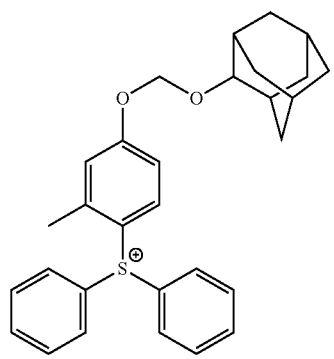

-continued
(ca-1-14)
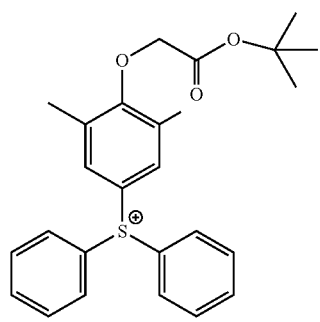
(ca-1-15)
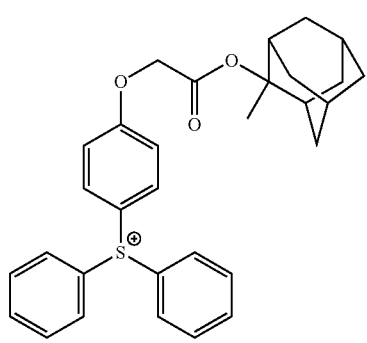
(ca-1-16)
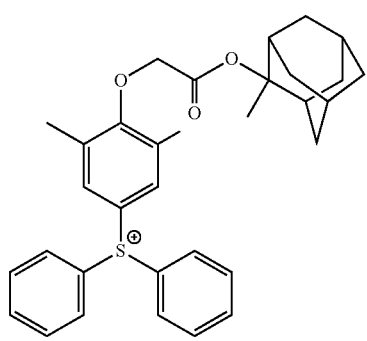
[Chemical Formula 42]
(ca-1-17)
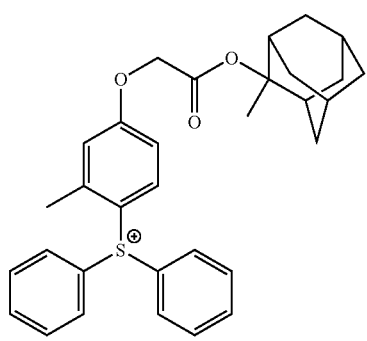
-continued
(ca-1-18)
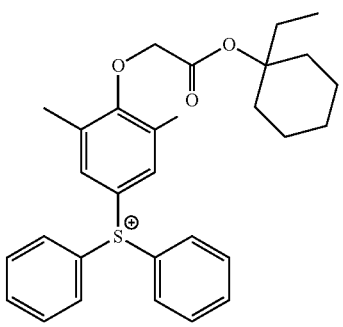
(ca-1-19)
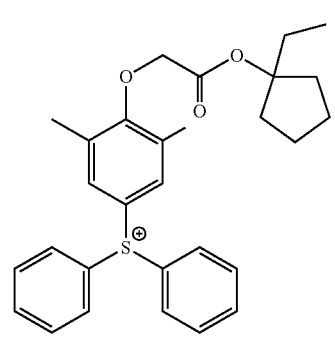
(ca-1-20)
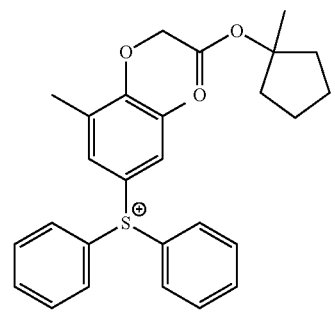
(ca-1-21)
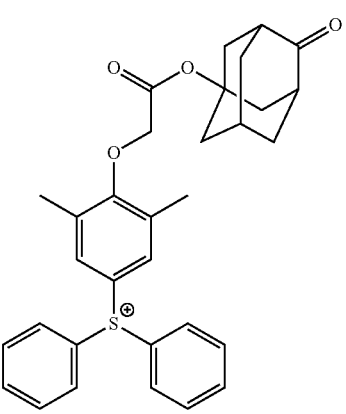

77
-continued
(ca-1-22)
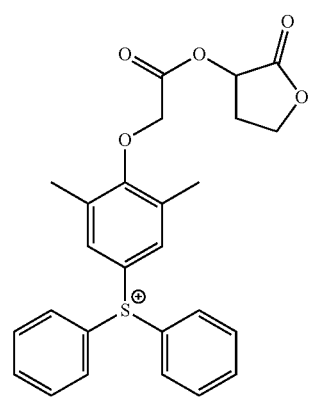
(ca-1-23)
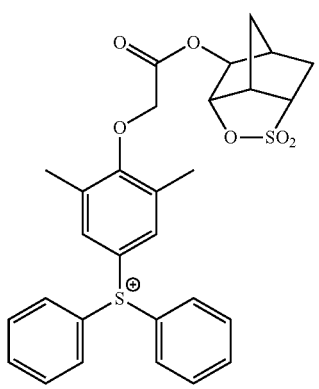
(ca-1-24)
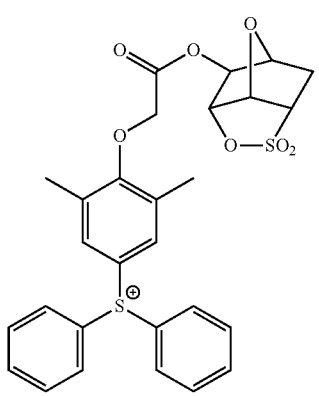
(ca-1-25)
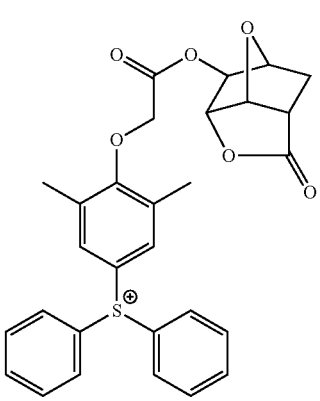
78
-continued
(ca-1-26)
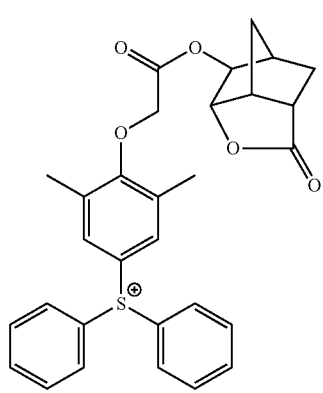
(ca-1-27)
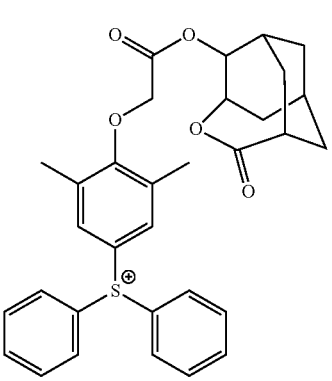
(ca-1-28)
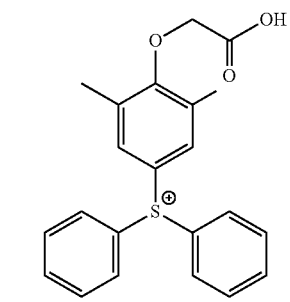
(ca-1-29)
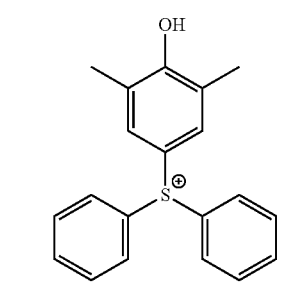
(ca-1-30)
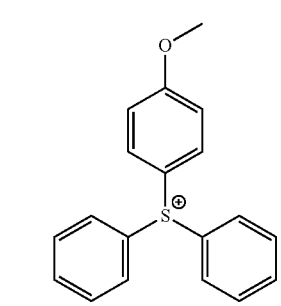

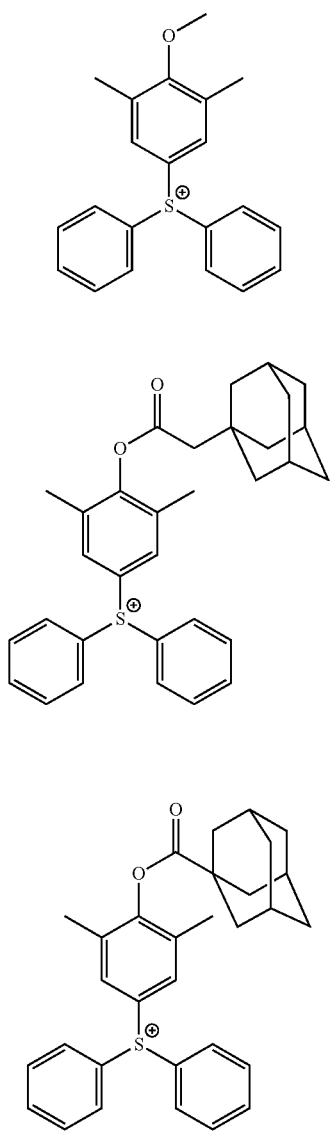
(ca-1-31)
(ca-1-32)
(ca-1-33)
[Chemical Formula 43]
(ca-1-34)
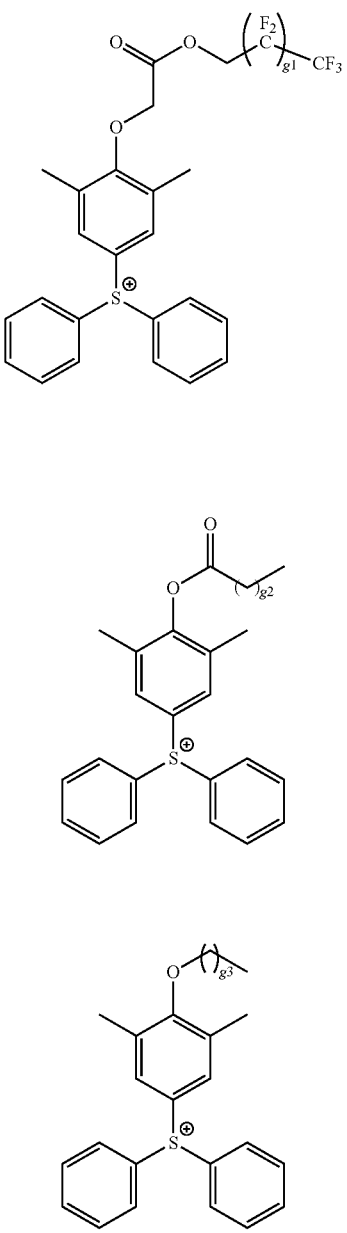
(ca-1-35)
(ca-1-36)
(ca-1-37)
(ca-1-38)

-continued
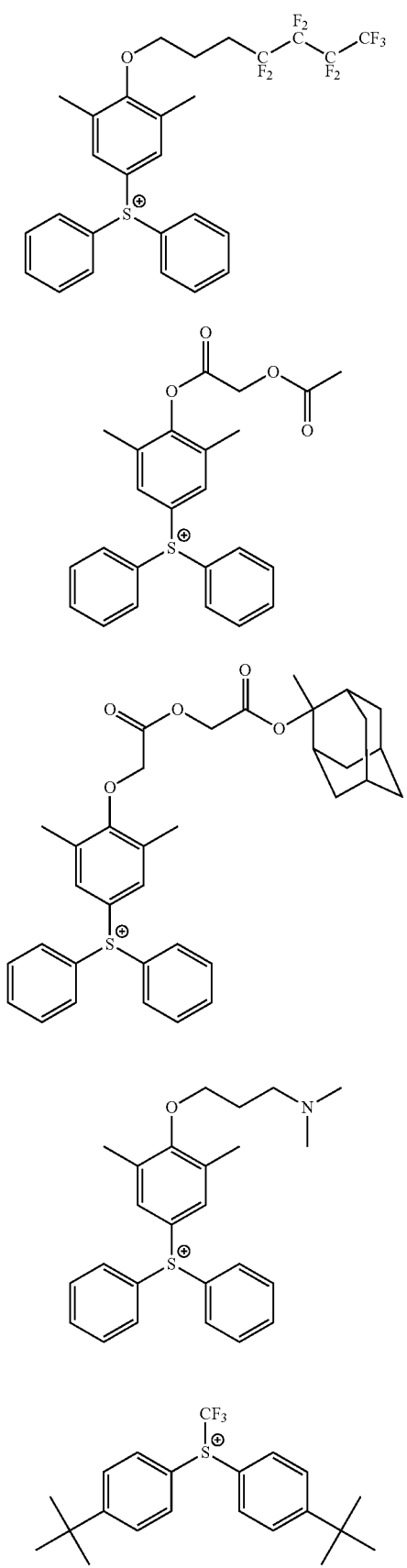
(ca-1-39)
(ca-1-40)
(ca-1-41)
(ca-1-42)
(ca-1-43)
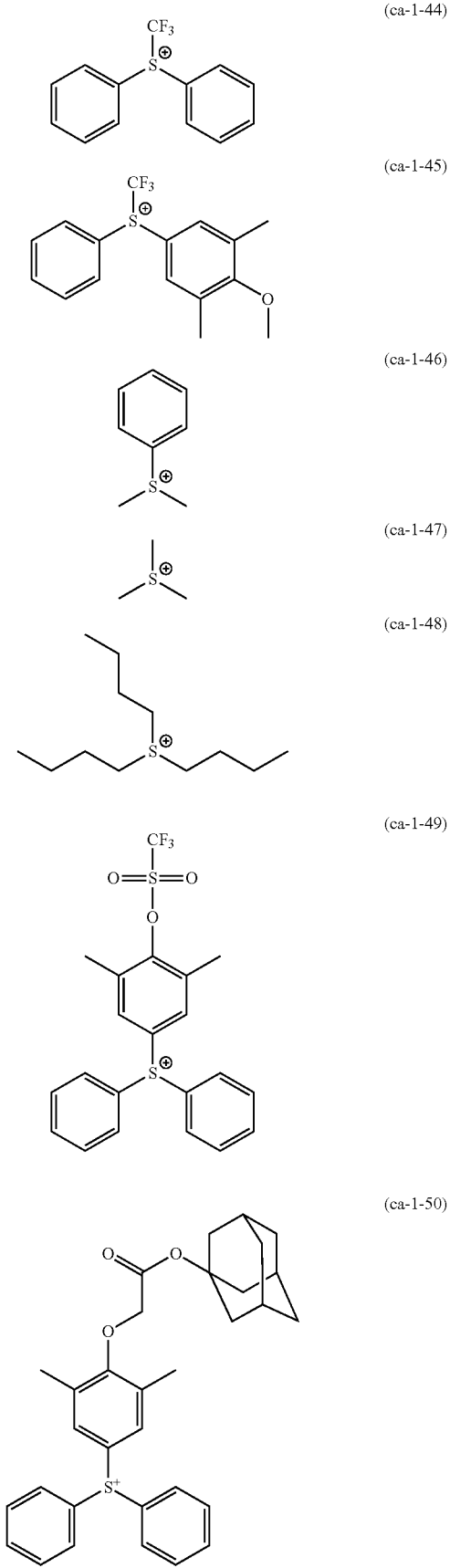
(ca-1-44)
(ca-1-45)
(ca-1-46)
(ca-1-47)
(ca-1-48)
(ca-1-49)
(ca-1-50)

(ca-1-51)
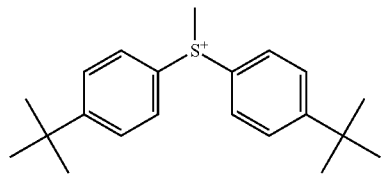
In the formulae, g1, g2 and g3 represent recurring numbers, wherein g1 is an integer of 1 to 5, g2 is an integer of 0 to 20, and g3 is an integer of 0 to 20.
[Chemical Formula 44]
(ca-1-52)
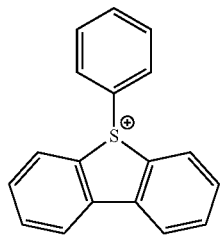
(ca-1-53)
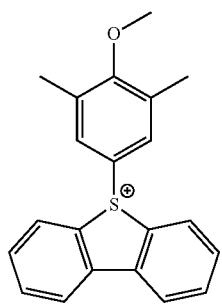
(ca-1-54)
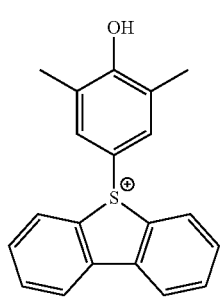
(ca-1-55)
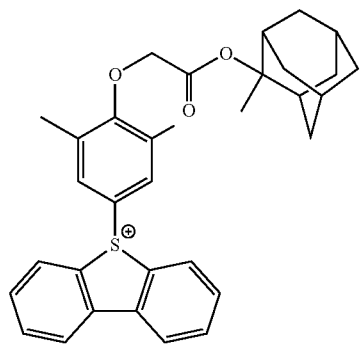
(ca-1-56)
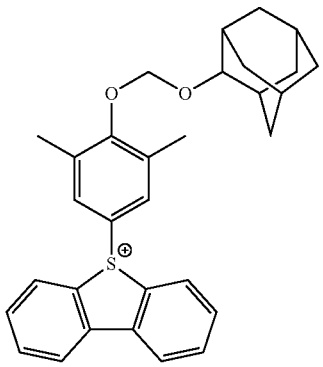
(ca-1-57)
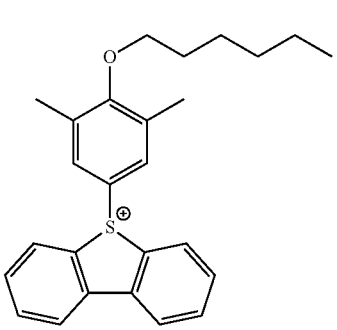
(ca-1-58)
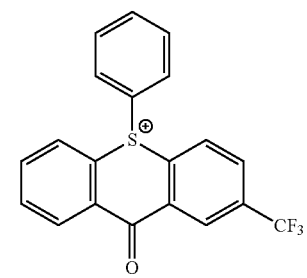
(ca-1-59)
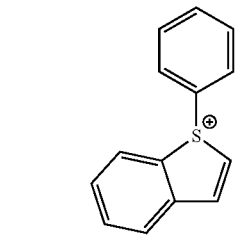
(ca-1-60)
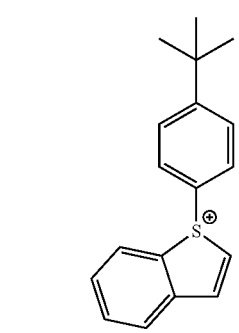

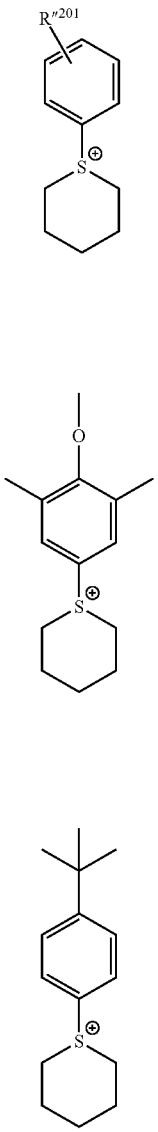

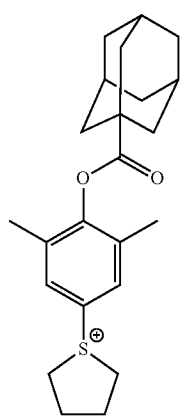

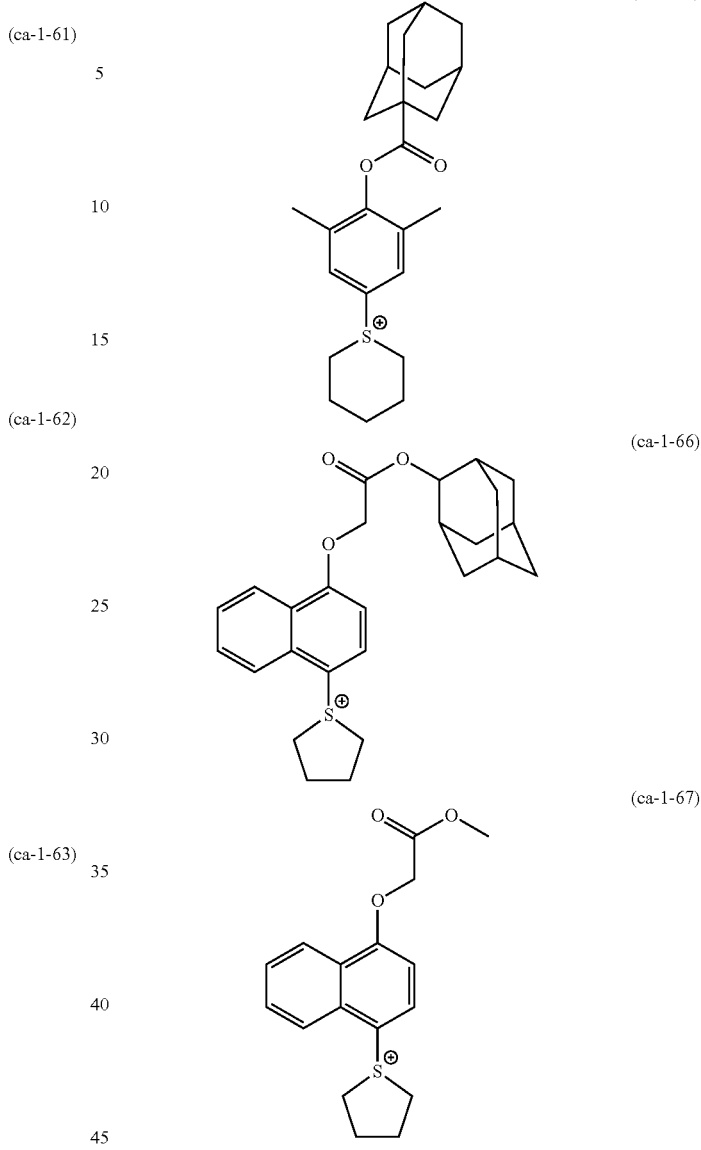

In the formulae, $R''^{201}$ represents a hydrogen atom or a substituent, and as the substituent, the same groups as those described above for substituting $R^{201}$ to $R^{207}$ and $R^{210}$ to $R^{212}$ can be mentioned.

Specific examples of preferable cations represented by the formula (ca-2) include a diphenyliodonium cation and a bis(4-tert-butylphenyl)iodonium cation.

Specific examples of preferable cations represented by formula (ca-3) include cations represented by formulae (ca-3-1) to (ca-3-6) shown below.

[Chemical Formula 45]

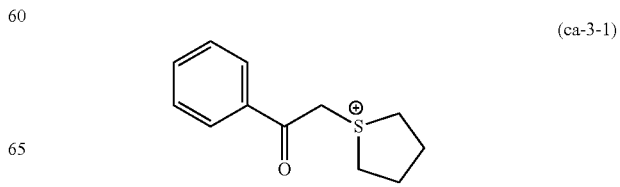

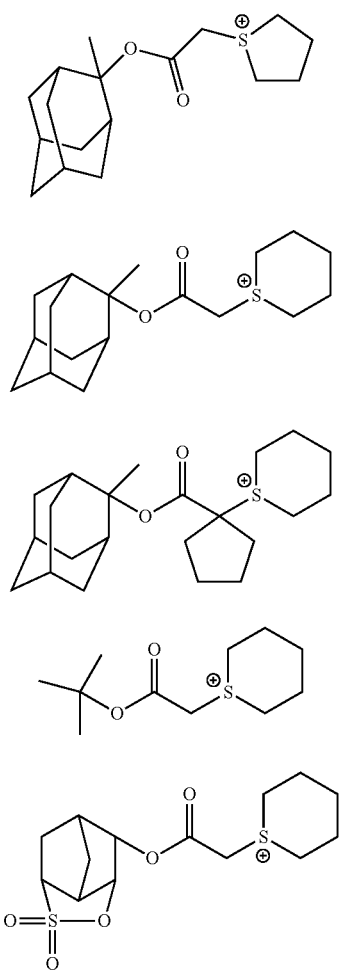

(ca-3-2)
(ca-3-3)
(ca-3-4)
(ca-3-5)
(ca-3-6)

Specific examples of preferable cations represented by formula (ca-4) include cations represented by formulae (ca-4-1) and (ca-4-2) shown below.

[Chemical Formula 46]

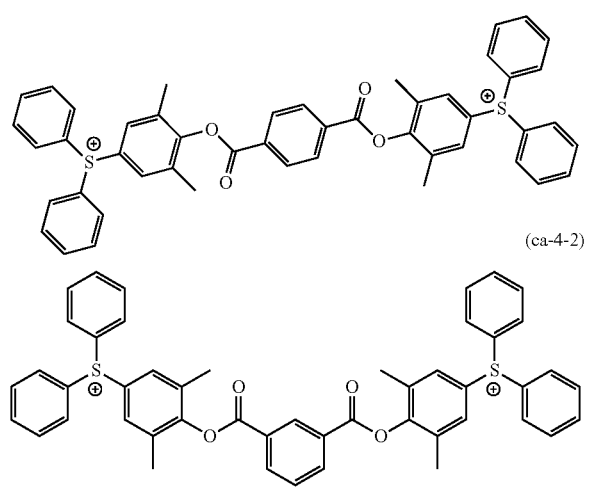

(ca-4-1)
(ca-4-2)

Among the above examples, as the cation moiety $[(M^{m+})_{1/m}]$, a cation represented by general formula (ca-1) is preferable, and a cation represented by any one of formulae (ca-1-1) to (ca-1-67) is more preferable.

As the component (B), one type of these acid generators may be used alone, or two or more types may be used in combination.

When the resist composition contains the component (B), the amount of the component (B) relative to 100 parts by weight of the component (A) is preferably within a range from 0.5 to 60 parts by weight, more preferably from 1 to 50 parts by weight, and still more preferably from 1 to 40 parts by weight.

When the amount of the component (B) is within the above-mentioned range, formation of a resist pattern can be satisfactorily performed. Further, by virtue of the above-mentioned range, when each of the components are dissolved in an organic solvent, a homogeneous solution may be more reliably obtained and the storage stability of the resist composition becomes satisfactory.

[Component (D): Acid Diffusion Control Agent]

Moreover, the resist composition of the present embodiment may include an acid diffusion control agent component (hereafter, frequently referred to as "component (D)"), in addition to the component (A), or in addition to the component (A) and the component (B). The component (D) functions as an acid diffusion control agent, i.e., a quencher which traps the acid generated in the resist composition upon exposure.

The component (D) may be a photodecomposable base (D1) (hereafter, referred to as "component (D1)") which is decomposed upon exposure and then loses the ability of controlling of acid diffusion, or a nitrogen-containing organic compound (D2) (hereafter, referred to as "component (D2)") which does not fall under the definition of component (D1).

Component (D1)

When a resist pattern is formed using a resist composition containing the component (D1), the contrast between exposed portions and unexposed portions is improved.

The component (D1) is not particularly limited, as long as it is decomposed upon exposure and then loses the ability of controlling of acid diffusion. As the component (D1), at least one compound selected from the group consisting of a compound represented by general formula (d1-1) shown below (hereafter, referred to as "component (d1-1)"), a compound represented by general formula (d1-2) shown below (hereafter, referred to as "component (d1-2)") and a compound represented by general formula (d1-3) shown below (hereafter, referred to as "component (d1-3)") is preferably used.

At exposed portions of the resist film, the components (d1-1) to (d1-3) are decomposed and then lose the ability of controlling of acid diffusion (i.e., basicity), and therefore the components (d1-1) to (d1-3) cannot function as a quencher, whereas at unexposed portions, the components (d1-1) to (d1-3) functions as a quencher.

[Chemical Formula 47]

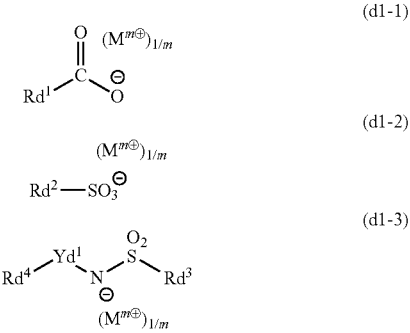

In the formulae, $Rd^1$ to $Rd^4$ represent a cyclic group which may have a substituent, a chain-like alkyl group which may have a substituent or a chain-like alkenyl group which may have a substituent, provided that, the carbon atom adjacent to the sulfur atom within the $Rd^2$ in the formula (d1-2) has no fluorine atom bonded thereto; $Yd^1$ represents a single bond or a divalent linking group; m represents an integer of 1 or more; and each $M^{m+}$ independently represents an organic cation having a valency of m.

{Component (d1-1)}
Anion Moiety

In formula (d1-1), $Rd^1$ represents a cyclic group which may have a substituent, a chain-like alkyl group which may have a substituent or a chain-like alkenyl group which may have a substituent, and is the same groups as those defined above for $R^{101}$ in the aforementioned formula (b-1).

Among these, as the group for $Rd^1$, an aromatic hydrocarbon group which may have a substituent, an aliphatic cyclic group which may have a substituent and a chain-like alkyl group which may have a substituent are preferable. Examples of the substituent for these groups include a hydroxy group, an oxo group, an alkyl group, an aryl group, a fluorine atom, a fluorinated alkyl group, a lactone-containing cyclic group represented by any one of the aforementioned formulae (a2-r-1) to (a2-r-7), an ether bond, an ester bond, and a combination thereof. In the case where an ether bond or an ester bond is included as the substituent, the substituent may be bonded via an alkylene group, and a linking group represented by any one of the aforementioned formulae (y-a1-1) to (y-a1-5) is preferable as the substituent.

The aromatic hydrocarbon group is preferably a phenyl group or a naphthyl group.

Examples of the aliphatic cyclic group include groups in which one or more hydrogen atoms have been removed from a polycycloalkane such as adamantane, norbornane, isobornane, tricyclodecane or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

In the case where the chain-like alkyl group is a fluorinated alkyl group having a fluorine atom or a fluorinated alkyl group, the fluorinated alkyl group preferably has 1 to 11 carbon atoms, more preferably 1 to 8 carbon atoms, and still more preferably 1 to 4 carbon atoms. The fluorinated alkyl group may contain an atom other than fluorine.

Examples of the atom other than fluorine include an oxygen atom, a sulfur atom and a nitrogen atom.

As $Rd^1$, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is particularly desirable.

Specific examples of preferable anion moieties for the component (d1-1) are shown below.

[Chemical Formula 48]

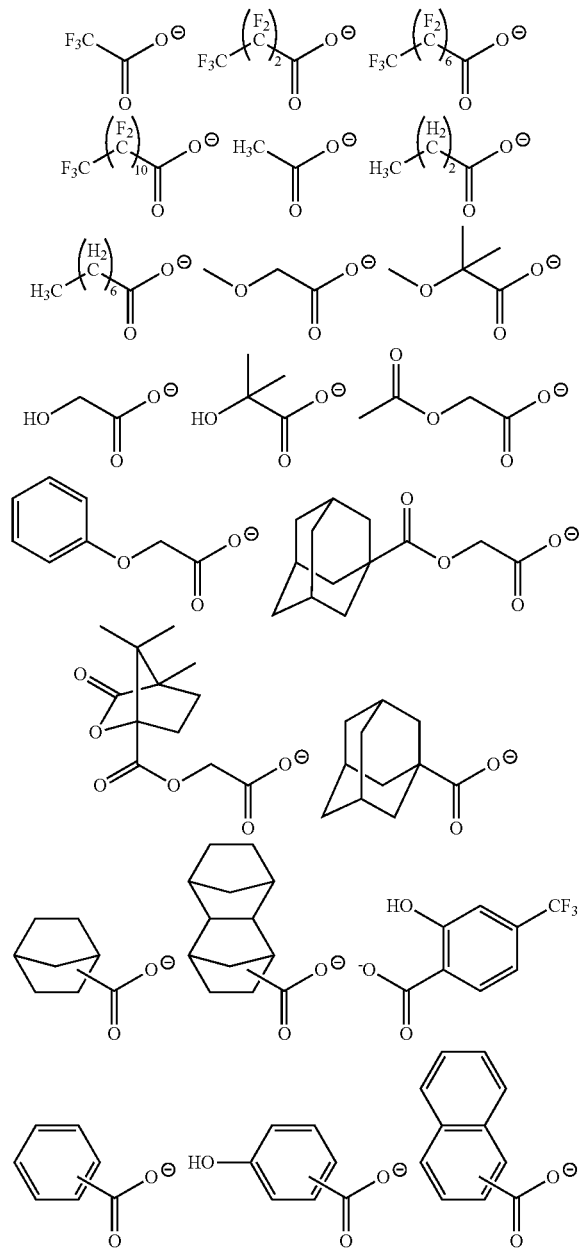

-continued

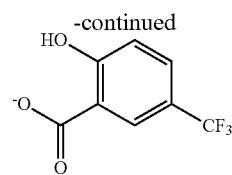

Cation Moiety

In formula (d1-1), $M^{m+}$ represents an organic cation having a valency of m.

As the organic cation for $M^{m+}$, for example, the same cation moieties as those represented by the aforementioned formulae (ca-1) to (ca-4) are preferable, cation moieties represented by the aforementioned general formulae (ca-1) is preferable, and cation moieties represented by the aforementioned formulae (ca-1-1) to (ca-1-67) are still more preferable.

As the component (d1-1), one type of compound may be used, or two or more types of compounds may be used in combination.

{Component (d1-2)}
Anion Moiety

In formula (d1-2), $Rd^2$ represents a cyclic group which may have a substituent, a chain-like alkyl group which may have a substituent or a chain-like alkenyl group which may have a substituent, and is the same groups as those defined above for $R^{101}$ in the aforementioned formula (b-1).

The carbon atom adjacent to the sulfur atom within $Rd^2$ group has no fluorine atom bonded thereto (i.e., the carbon atom adjacent to the sulfur atom within $Rd^2$ group does not substituted with a fluorine atom). As a result, the anion of the component (d1-2) becomes an appropriately weak acid anion, thereby improving the quenching ability of the component (D).

As $Rd^2$, a chain-like alkyl group which may have a substituent or an aliphatic cyclic group which may have a substituent is preferable. The chain-like alkyl group preferably has 1 to 10 carbon atoms, and more preferably 3 to 10 carbon atoms. As the aliphatic cyclic group, a group in which one or more hydrogen atoms have been removed from adamantane, norbornane, isobornane, tricyclodecane, tetracyclododecane or camphor (which may have a substituent) is more preferable.

The hydrocarbon group for $Rd^2$ may have a substituent. As the substituent, the same groups as those described above for substituting the hydrocarbon group (e.g., aromatic hydrocarbon group, aliphatic cyclic group, chain-like alkyl group) for $Rd^1$ in the formula (d1-1) can be mentioned.

Specific examples of preferable anion moieties for the component (d1-2) are shown below.

[Chemical Formula 49]

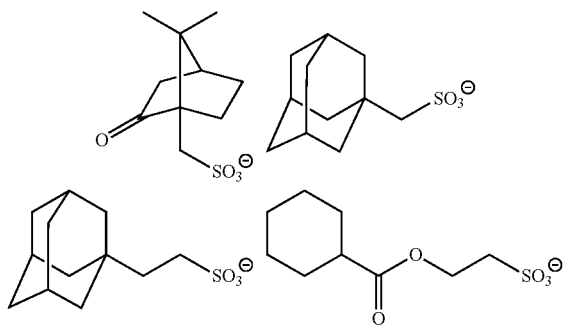

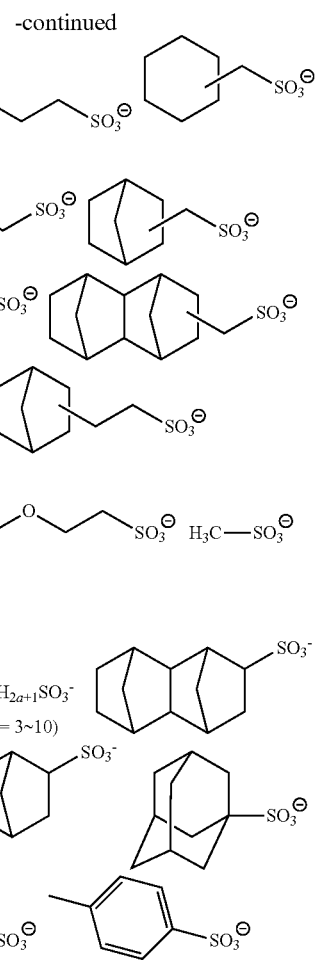

Cation Moiety

In formula (d1-2), $M^{m+}$ is an organic cation having a valency of m, and is the same as defined for $M^{m+}$ in the aforementioned formula (d1-1).

As the component (d1-2), one type of compound may be used, or two or more types of compounds may be used in combination.

{Component (d1-3)}
Anion Moiety

In formula (d1-3), $Rd^3$ represents a cyclic group which may have a substituent, a chain-like alkyl group which may have a substituent or a chain-like alkenyl group which may have a substituent, and is the same groups as those defined above for $R^{101}$ in the aforementioned formula (b-1), and a cyclic group containing a fluorine atom, a chain-like alkyl group or a chain-like alkenyl group is preferable. Among these, a fluorinated alkyl group is preferable, and more preferably the same fluorinated alkyl groups as those described above for $Rd^1$.

In formula (d1-3), $Rd^4$ represents a cyclic group which may have a substituent, a chain-like alkyl group which may have a substituent or a chain-like alkenyl group which may have a substituent, and is the same groups as those defined above for $R^{101}$ in the aforementioned formula (b-1).

Among these, an alkyl group which may have substituent, an alkoxy group which may have substituent, an alkenyl group which may have substituent or a cyclic group which may have substituent is preferable.

The alkyl group for $Rd^4$ is preferably a linear or branched alkyl group of 1 to 5 carbon atoms, and specific examples include a methyl group, an ethyl group, an n-propyl group, an isopropyl group, an n-butyl group, an isobutyl group, a tert-butyl group, a pentyl group, an isopentyl group, and a neopentyl group. Part of the hydrogen atoms within the alkyl group for $Rd^4$ may be substituted with a hydroxy group, a cyano group or the like.

The alkoxy group for $Rd^4$ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are preferable.

As the alkenyl group for $Rd^4$, the same groups as those described above for $R^{101}$ in the aforementioned formula (b-1) can be mentioned, and a vinyl group, a propenyl group (an allyl group), a 1-methylpropenyl group and a 2-methylpropenyl group are preferable. These groups may have an alkyl group of 1 to 5 carbon atoms or a halogenated alkyl group of 1 to 5 carbon atoms as a substituent.

As the cyclic group for $Rd^4$, the same groups as those described above for $R^{101}$ in the aforementioned formula (b-1) can be mentioned. Among these, as the cyclic group, an alicyclic group (e.g., a group in which one or more hydrogen atoms have been removed from a cycloalkane such as cyolopentane, cyclohexane, adamantane, norbornane, isobornane, tricyclodecane or tetracyclododecane) or an aromatic group (e.g., a phenyl group or a naphthyl group) is preferable. When $Rd^4$ is an alicyclic group, the resist composition can be satisfactorily dissolved in an organic solvent, thereby improving the lithography properties. Alternatively, when $Rd^4$ is an aromatic group, the resist composition exhibits an excellent photoabsorption efficiency in a lithography process using EUV or the like as the exposure source, thereby resulting in the improvement of the sensitivity and the lithography properties.

In formula (d1-3), $Yd^1$ represents a single bond or a divalent linking group.

The divalent linking group for $Yd^1$ is not particularly limited, and examples thereof include a divalent hydrocarbon group (aliphatic hydrocarbon group, or aromatic hydrocarbon group) which may have a substituent and a divalent linking group containing a hetero atom. The divalent linking groups are the same as defined for the divalent hydrocarbon group which may have a substituent and the divalent linking group containing a hetero atom explained above as the divalent linking group for $Va^{o1}$ in $La^{o11}$ of the aforementioned formula (a01-1).

As $Yd^1$, a carbonyl group, an ester bond, an amide bond, an alkylene group or a combination of these is preferable. As the alkylene group, a linear or branched alkylene group is more preferable, and a methylene group or an ethylene group is still more preferable.

Specific examples of preferable anion moieties for the component (d1-3) are shown below.

[Chemical Formula 50]

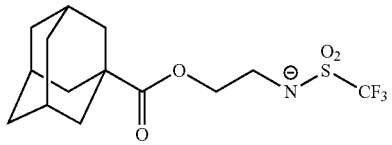

-continued

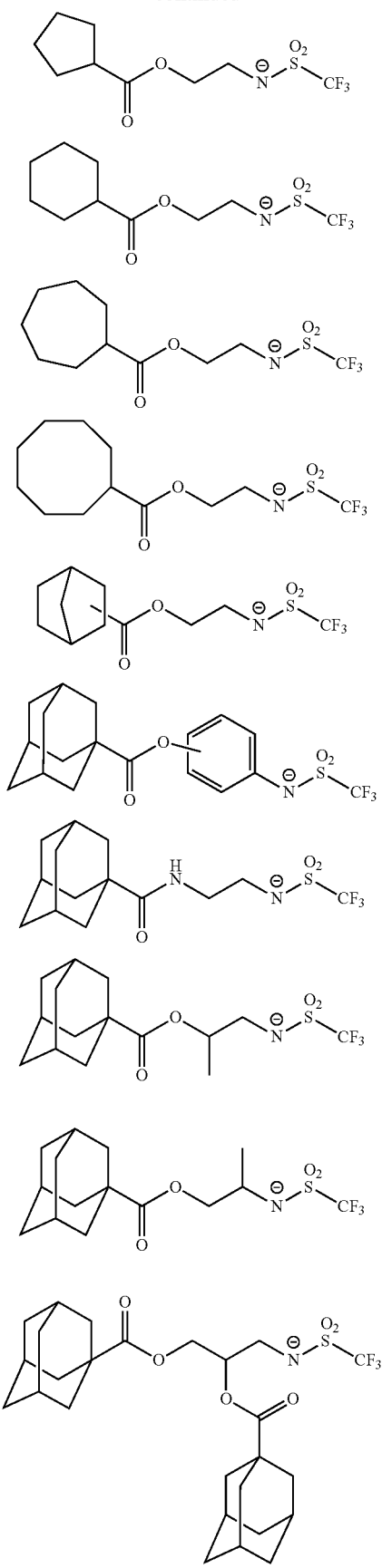

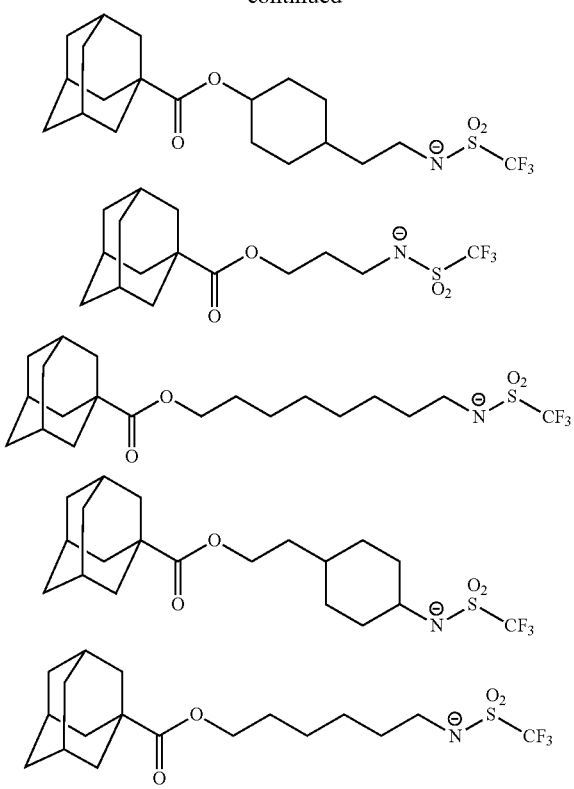

[Chemical Formula 51]

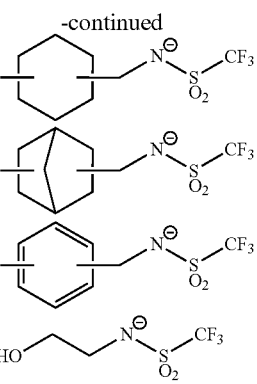

Cation Moiety

In formula (d1-3), $M^{m+}$ is an organic cation having a valency of m, and is the same as defined $M^{m+}$ in the aforementioned formula (d1-1).

As the component (d1-3), one type of compound may be used, or two or more types of compounds may be used in combination.

As the component (D1), one type of the aforementioned components (d1-1) to (d1-3), or at least two types of the aforementioned components (d1-1) to (d1-3) can be used in combination.

It is preferable to use at least the component (d1-1) as the component (D1).

When the resist composition contains the component (D1), the amount of the component (D1) relative to 100 parts by weight of the component (A) is preferably within a range from 0.5 to 10 parts by weight, more preferably from 0.5 to 8, and still more preferably 1 to 8.

When the amount of the component (D1) is at least as large as the lower limit of the above-mentioned range, excellent lithography properties and excellent resist pattern shape can be more reliably obtained. On the other hand, when the amount of the component (D1) is no more than the upper limit of the above-mentioned range, sensitivity can be maintained at a satisfactory level, and through-put becomes excellent.

Production Method of Component (D1):

The production methods of the components (d1-1) and (d1-2) are not particularly limited, and the components (d1-1) and (d1-2) can be produced by conventional methods.

Further, the production method of the component (d1-3) is not particularly limited, and the component (d1-3) can be produced in the same manner as disclosed in US2012-0149916.

Component (D2)

The acid diffusion control component may contain a nitrogen-containing organic compound (D2) (hereafter, referred to as component (D2)) which does not fall under the definition of component (D1).

The component (D2) is not particularly limited, as long as it functions as an acid diffusion control agent, and does not fall under the definition of the component (D1). As the component (D2), any of the conventionally known compounds may be selected for use. Among these, an aliphatic amine is preferable, and a secondary aliphatic amine or tertiary aliphatic amine is more preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl)amine, tris[2-(2-(2-hydroxyethoxy)ethoxy}ethyl]amine and triethanolamine triacetate, and triethanolamine triacetate is preferable.

Further, as the component (D2), an aromatic amine may be used.

Examples of aromatic amines include 4-dimethylaminopyridine, pyrrole, indole, pyrazole, imidazole and derivatives thereof, as well as tribenzylamine, 2,6-diisopropylaniline and N-tert-butoxycarbonylpyrrolidine.

As the component (D2), one type of compound may be used alone, or two or more types may be used in combination.

When the resist composition contains the component (D2), the amount of the component (D2) is typically used in an amount within a range from 0.01 to 5 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

[Component (E): At Least One Compound Selected from the Group Consisting of Organic Carboxylic Acids, and Phosphorus Oxo Acids and Derivatives Thereof]

Furthermore, in the resist composition of the present embodiment, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

As the component (E), one type may be used alone, or two or more types may be used in combination.

When the resist composition contains the component (E), the amount of the component (E) is typically used in an amount within a range from 0.01 to 5 parts by weight, relative to 100 parts by weight of the component (A).

[Component (F): Fluorine Additive]

The resist composition according to the present embodiment may further include a fluorine additive component (hereafter, referred to as "component (F)") for imparting water repellency to the resist film.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application. First Publication No. 2010-277043, Japanese Unexamined Patent Application, First Publication No. 2011-13569, and Japanese Unexamined Patent Application, First Publication No. 2011-128226 can be used. Specific examples of the component (F) include polymers having a structural unit (f1) represented by general formula (f1-1) shown below. However, polymeric compounds that fall under the definition of the aforementioned component (A1) are excluded.

As the polymer containing the aforementioned structural unit (f1), a polymer (homopolymer) consisting of a structural unit (f1); a copolymer of the structural unit (f1) and a structural unit represented by general formula (a-1) shown below; and a copolymer of the structural unit (f1), a structural unit derived from acrylic acid or methacrylic acid and the structural unit (a-1) shown below are preferable.

As the structural unit represented by general formula (a-1), a structural unit derived from 1-ethyl-1-cyclooctyl (meth)acrylate and a structural unit derived from 1-methyl-1-adamantyl (meth)acrylate are preferable.

[Chemical Forumla 52]

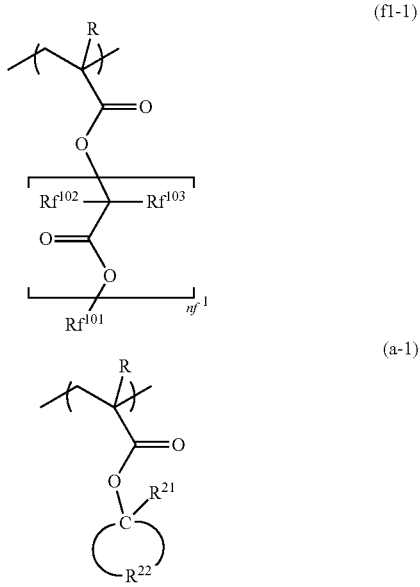

(f1-1)

(a-1)

In the formulae, each R independently represents a hydrogen atom, an alkyl group of 1 to 5 carbon atoms or a halogenated alkyl group of 1 to 5 carbon atoms. In the formula (f1-1), $Rf^{102}$ and $Rf^{103}$ each independently represents a hydrogen atom, a halogen atom, an alkyl group of 1 to 5 carbon atoms, or a halogenated alkyl group of 1 to 5 carbon atoms, provided that $Rf^{102}$ and $Rf^{103}$ may be the same or different. $nf^1$ represents an integer of 0 to 5; and $R^{101}$ represents an organic group containing a fluorine atom. In the formula (a-1), $R^{21}$ represents an alkyl group; and $R^{22}$ is a group which forms an aliphatic cyclic group together with the carbon atom bonded to the $R^{22}$.

In the aforementioned formula (f1-1), R represents a hydrogen atom, an alkyl group of 1 to 5 carbon atoms or a halogenated alkyl group of 1 to 5 carbon atoms. In the aforementioned formula (f1-1), R is the same as defined for R in the aforementioned formula (a01-1).

As R, a hydrogen atom, an alkyl group of 1 to 5 carbon atoms or a fluorinated alkyl group of 1 to 5 carbon atoms is preferable, a hydrogen atom or an alkyl group of 1 to 5 carbon atoms is more preferable in terms of industrial availability, an alkyl group of 1 to 5 carbon atoms is still more preferable, and a methyl group is particularly desirable.

In formula (f1-1), examples of the halogen atom for $Rf^{102}$ and $Rf^{103}$ include a fluorine atom, a chlorine atom, a bromine atom and an iodine atom, and a fluorine atom is particularly desirable. Examples of the alkyl group of 1 to 5 carbon atoms for $Rf^{102}$ and $Rf^{103}$ include the same alkyl group of 1 to 5 carbon atoms as those described above for R, and a methyl group or an ethyl group is preferable. Specific examples of the halogenated alkyl group of 1 to 5 carbon atoms represented by $Rf^{102}$ or $Rf^{103}$ include groups in which part or all of the hydrogen atoms of the aforementioned alkyl groups of 1 to 5 carbon atoms have been substituted with halogen atoms.

Examples of the halogen atom include a fluorine atom, a chlorine atom, a bromine atom and an iodine atom, and a fluorine atom is particularly desirable. Among these examples, as $Rf^{102}$ and $Rf^{103}$, a hydrogen atom, a fluorine atom or an alkyl group of 1 to 5 carbon atoms is preferable, and a hydrogen atom, a fluorine atom, a methyl group or an ethyl group is more preferable.

In formula (f1-1), $nf^1$ represents an integer of 0 to 5, preferably an integer of 0 to 3, and more preferably 0 or 1.

In formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group of 1 to 5 carbon atoms is preferable, and a trifluoromethyl group, $—CH_2—CF_3$, $—CH_2—CF_2—CF_3$, $—CH(CF_3)_2$, $—CH_2—CH_2—CF_3$, and $—CH_2—CH_2—CF_2—CF_2—CF_2—CF_3$ are most preferable.

In formula (a-1), the alkyl group for $R^{21}$ may be linear, branched or cyclic, and is preferably linear or branched. The linear alkyl group preferably has 1 to 5 carbon atoms, more preferably 1 to 4, and still more preferably 1 or 2. Examples include a methyl group, an ethyl group, an n-propyl group, an n-butyl group and n-pentyl group, a methyl group, an ethyl group oar n-butyl group is more preferable, and a methyl group or an ethyl group is still more preferable. The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is particularly desirable.

In formula (a-1), $R^{22}$ is a group which forms an alicyclic group together with the carbon atom bonded to the $R^{22}$. The alicyclic group formed by $R^{22}$ may be either polycyclic or monocyclic. As the monocyclic aliphatic hydrocarbon group, a group in which one or more hydrogen atoms have been removed from a monocycloalkane is preferable. The monocycloalkane preferably has 3 to 10 carbon atoms, and specific examples thereof include cyclopentane, cyclohexane, cyclooctane and the like. As the polycyclic alicyclic group, a group in which one or more hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

When the resist composition contains the component (F), the component (F) is used in an amount within a range from 0.5 to 10 parts by weight, relative to 100 parts by weight of the component (A).

If desired, other miscible additives can also be added to the resist composition of the present invention. Examples of such miscible additives include additive resins for improving the performance of the resist film, dissolution inhibitors, plasticizers, stabilizers, colorants, halation prevention agents, and dyes.

[Component (S): Organic Solvent]

The resist composition of the present embodiment can be prepared by dissolving the resist materials for the resist composition in an organic solvent (hereafter, frequently referred to as "component (S)").

The component (S) may be any organic solvent which can dissolve the respective components to give a homogeneous solution, and any organic solvent can be appropriately selected from those which have been conventionally known as solvents for a chemically amplified resist composition.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

The component (S) can be used individually, or in combination as a mixed solvent.

Among these, PGMEA, PGME, γ-butyrolactone, EL and cyclohexanone are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL or cyclohexanone weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3. Furthermore, a mixed solvent of PGMEA, PGME and cyclohexanone is also preferable.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate. In general, the component (S) is used in an amount such that the solid content of the resist composition becomes within the range from 1 to 20% by weight, and preferably from 2 to 15% by weight.

By the method of forming a resist pattern according to the present embodiment, a finer resist pattern can be formed with an excellent shape. As the finer resist pattern, a resist pattern having a size of 50 nm or smaller can be formed. For example, an extremely fine line and space pattern can be formed without pattern collapse. In addition, an extremely fine trench pattern can be formed with a high resolution.

When such a fine pattern having a size of 50 nm or smaller is tried to be formed on a substrate, the intensity of the light irradiated to the resist film in the exposure becomes non-uniform in each of the exposed portions and the unexposed portions.

Further, a region where the optical strength becomes weak is likely to be generated, especially in the film thickness direction of exposed portions in the resist film.

In contrast, the method of forming a resist pattern according to the present invention uses the polymeric compound (component (A1)) having the structural unit (a01) which increases Tg; and the structural unit (a04) in which the activation energy to cleave a part of the bond within the structure of the acid decomposable group under action of acid is low. By using the polymeric compound having such two kinds of structural units, in the formation of a resist pattern, diffusion of acid to the unexposed portion of the resist film can be especially suppressed. In addition, reaction by acid, exposure or heating uniformly occurs in the resist film. Further, in the method of forming a resist pattern according to the present invention, by using negative-tone developing process in combination with an organic developing solution, the region where the optical strength is weak is selectively removed.

The present invention uses a resist composition containing the (A1) component having two specific structural units in combination with an organic developing solution, i.e., adopting a negative-tone developing process. As a result, the effects of the present invention are exhibited.

In the method of forming a resist pattern according to the embodiment as described above, by using the component (A1) as a resin component of the resist composition, the solubility of the unexposed portion of the resist film in an organic developing solution is enhanced. Further, the film retention ratio was high before and after development, and thus the thickness loss of the resist film is suppressed.

EXAMPLES

As follows is a description of examples of the present invention, although the scope of the present invention is by no way limited by these examples.

<Base Component of Resist Composition: Polymeric Compound>

Polymeric compounds A-1 to A-21 used in the present examples were obtained by using and radically polymerizing the following monomers which derived the structural units constituting each polymeric compound with a predetermined molar ratio.

[Chemical Formula 53]
(a011)
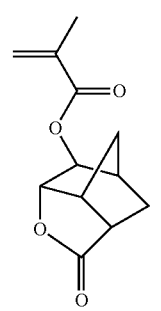
(a012)
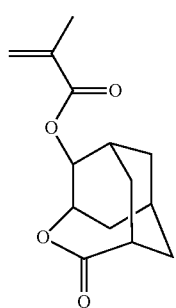
(a013)
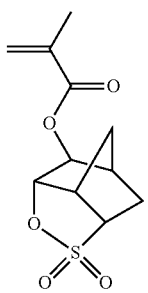
(a014)
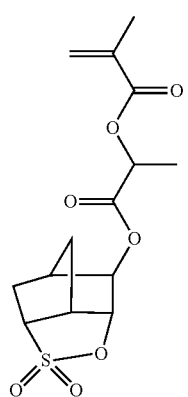
(a051)
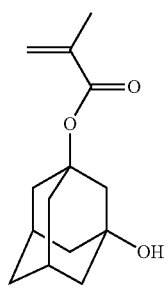
[Chemical Formula 54]
(a041)
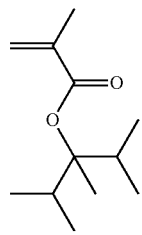
(a042)
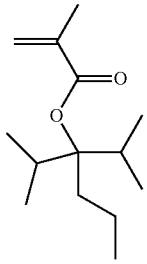
(a043)
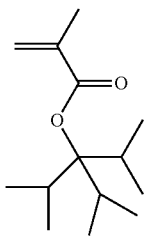
[Chemical Formula 55]
(a021)
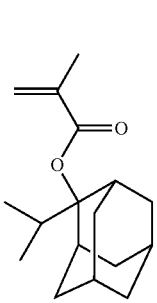
(a022)
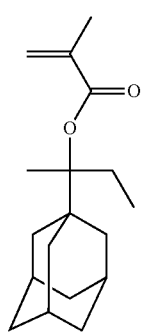

-continued

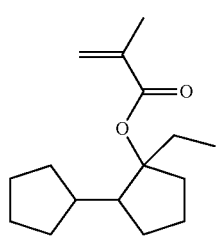
(a023)

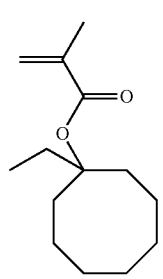
(a024)

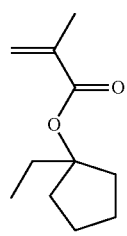
(025)

[Chemical Formula 56]

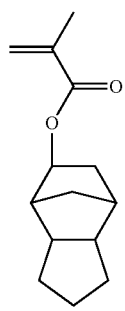
(a031)

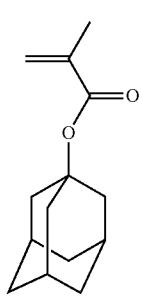
(a032)

-continued

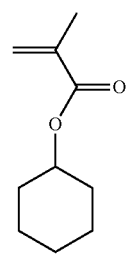
(a033)

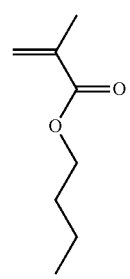
(a034)

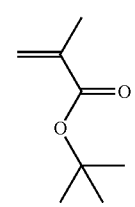
(a11)

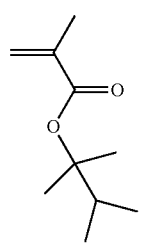
(a12)

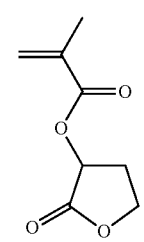
(a2)

With respect to the obtained polymeric compounds A-1 to A-21, the compositional ratio of the polymeric compounds (the ratio (molar ratio) of the respective structural units in the polymeric compound) determined by $^{13}$C-NMR, the weight average molecular weight (Mw) and the molecular weight dispersity (Mw/Mn) determined by the polystyrene equivalent value as measured by GPC are shown in Table 1.

TABLE 1

| Polymeric Compound | (a01) Structural unit | mol % | (a05) Structural unit | mol % | (a04) Structural unit | mol % | (a02) Structural unit | mol % | (a03) Structural unit | mol % | その他 Structural unit | mol % | Mw | Mw/Mn |
|---|---|---|---|---|---|---|---|---|---|---|---|---|---|---|
| A-1 | a011 | 40 | a051 | 10 | a041 | 20 | a021 | 20 | a031 | 10 | — | — | 9600 | 1.66 |
| A-2 | a011 | 40 | a051 | 10 | a041 | 10 | a021 | 30 | a031 | 10 | — | — | 10100 | 1.75 |
| A-3 | a011 | 40 | a051 | 10 | — | — | a021 | 40 | a031 | 10 | — | — | 9000 | 1.64 |
| A-4 | a011 | 50 | — | — | a041 | 20 | a021 | 20 | a031 | 10 | — | — | 10600 | 1.78 |
| A-5 | a012 | 40 | a051 | 10 | a041 | 20 | a021 | 20 | a031 | 10 | — | — | 9900 | 1.7 |
| A-6 | a013 | 40 | a051 | 10 | a041 | 20 | a021 | 20 | a031 | 10 | — | — | 10800 | 1.78 |
| A-7 | a014 | 40 | a051 | 10 | a041 | 20 | a021 | 20 | a031 | 10 | — | — | 10000 | 1.71 |
| A-8 | — | — | a051 | 10 | a041 | 20 | a021 | 20 | a031 | 10 | a2 | 40 | 9300 | 1.58 |
| A-9 | a011 | 40 | a051 | 10 | a042 | 20 | a021 | 20 | a031 | 10 | — | — | 10500 | 1.6 |
| A-10 | a011 | 40 | a051 | 10 | a043 | 20 | a021 | 20 | a031 | 10 | — | — | 9400 | 1.65 |
| A-11 | a011 | 40 | a051 | 10 | — | — | a021 | 20 | a031 | 10 | a11 | 20 | 9600 | 1.7 |
| A-12 | a011 | 40 | a051 | 10 | — | — | a021 | 20 | a031 | 10 | a12 | 20 | 9900 | 1.66 |
| A-13 | a011 | 40 | a051 | 10 | a041 | 20 | a022 | 20 | a031 | 10 | — | — | 11000 | 1.72 |
| A-14 | a011 | 40 | a051 | 10 | a041 | 20 | a023 | 20 | a031 | 10 | — | — | 10800 | 1.67 |
| A-15 | a011 | 40 | a051 | 10 | a041 | 20 | a024 | 20 | a031 | 10 | — | — | 9700 | 1.61 |
| A-16 | a011 | 40 | a051 | 10 | a041 | 20 | a025 | 20 | a031 | 10 | — | — | 9800 | 1.74 |
| A-17 | a011 | 40 | a051 | 10 | a041 | 40 | — | — | a031 | 10 | — | — | 9500 | 1.63 |
| A-18 | a011 | 40 | a051 | 10 | a041 | 20 | a021 | 20 | a032 | 10 | — | — | 9200 | 1.66 |
| A-19 | a011 | 40 | a051 | 10 | a041 | 20 | a021 | 20 | a033 | 10 | — | — | 10000 | 1.68 |
| A-20 | a011 | 40 | a051 | 10 | a041 | 20 | a021 | 20 | a034 | 10 | — | — | 11200 | 1.64 |
| A-21 | a011 | 50 | a051 | 10 | a041 | 20 | a021 | 20 | — | — | — | — | 9700 | 1.63 |

<Resist Composition>

The components shown in Table 2 were mixed together and dissolved to obtain each resist composition used in the each method of forming the resist pattern.

TABLE 2

| | Component (A) | Component (B) | Component (D) | Component (F) | Component (S) | |
|---|---|---|---|---|---|---|
| Ex. 1 | (A)-1 [100] | (B)-1 [5.86] | (D)-1 [5.00] | (F)-1 [1.50] | (S)-1 [100] | (S)-2 [2800] |
| Ex. 2 | (A)-2 [100] | (B)-1 [5.86] | (D)-1 [5.00] | (F)-1 [1.50] | (S)-1 [100] | (S)-2 [2800] |
| Comp. Ex. 1 | (A)-3 [100] | (B)-1 [5.86] | (D)-1 [5.00] | (F)-1 [1.50] | (S)-1 [100] | (S)-2 [2800] |
| Ex. 3 | (A)-4 [100] | (B)-1 [5.86] | (D)-1 [5.00] | (F)-1 [1.50] | (S)-1 [100] | (S)-2 [2800] |
| Ex. 4 | (A)-5 [100] | (B)-1 [5.86] | (D)-1 [5.00] | (F)-1 [1.50] | (S)-1 [100] | (S)-2 [2800] |
| Ex. 5 | (A)-6 [100] | (B)-1 [5.86] | (D)-1 [5.00] | (F)-1 [1.50] | (S)-1 [100] | (S)-2 [2800] |
| Ex. 6 | (A)-7 [100] | (B)-1 [5.86] | (D)-1 [5.00] | (F)-1 [1.50] | (S)-1 [100] | (S)-2 [2800] |
| Comp. Ex. 2 | (A)-8 [100] | (B)-1 [5.86] | (D)-1 [5.00] | (F)-1 [1.50] | (S)-1 [100] | (S)-2 [2800] |
| Ex. 7 | (A)-9 [100] | (B)-1 [5.86] | (D)-1 [5.00] | (F)-1 [1.50] | (S)-1 [100] | (S)-2 [2800] |
| Ex. 8 | (A)-10 [100] | (B)-1 [5.86] | (D)-1 [5.00] | (F)-1 [1.50] | (S)-1 [100] | (S)-2 [2800] |
| Comp. Ex. 3 | (A)-11 [100] | (B)-1 [5.86] | (D)-1 [5.00] | (F)-1 [1.50] | (S)-1 [100] | (S)-2 [2800] |
| Comp. Ex. 4 | (A)-12 [100] | (B)-1 [5.86] | (D)-1 [5.00] | (F)-1 [1.50] | (S)-1 [100] | (S)-2 [2800] |

TABLE 3

| | Component (A) | Component (B) | Component (D) | Component (F) | Component (S) | |
|---|---|---|---|---|---|---|
| Ex. 9 | (A)-13 [100] | (B)-1 [5.86] | (D)-1 [5.00] | (F)-1 [1.50] | (S)-1 [100] | (S)-2 [2800] |
| Ex. 10 | (A)-14 [100] | (B)-1 [5.86] | (D)-1 [5.00] | (F)-1 [1.50] | (S)-1 [100] | (S)-2 [2800] |
| Ex. 11 | (A)-15 [100] | (B)-1 [5.86] | (D)-1 [5.00] | (F)-1 [150] | (S)-1 [100] | (S)-2 [2800] |
| Ex. 12 | (A)-16 [100] | (B)-1 [5.86] | (D)-1 [5.00] | (F)-1 [1.50] | (S)-1 [100] | (S)-2 [2800] |
| Ex. 13 | (A)-17 [100] | (B)-1 [5.86] | (D)-1 [5.00] | (F)-1 [1.50] | (S)-1 [100] | (S)-2 [2800] |
| Ex. 14 | (A)-18 [100] | (B)-1 [5.86] | (D)-1 [5.00] | (F)-1 [150] | (S)-1 [100] | (S)-2 [2800] |
| Ex. 15 | (A)-19 [100] | (B)-1 [5.86] | (D)-1 [5.00] | (F)-1 [1.50] | (S)-1 [100] | (S)-2 [2800] |
| Ex. 16 | (A)-20 [100] | (B)-1 [5.86] | (D)-1 [5.00] | (F)-1 [1.50] | (S)-1 [100] | (S)-2 [2800] |
| Ex. 17 | (A)-21 [100] | (B)-1 [5.86] | (D)-1 [5.00] | (F)-1 [1.50] | (S)-1 [100] | (S)-2 [2800] |
| Ex. 18 | (A)-1 [100] | (B)-2 [6.32] | (D)-1 [5.00] | (F)-1 [1.50] | (S)-1 [100] | (S)-2 [2800] |
| Ex. 19 | (A)-1 [100] | (B)-3 [6.10] | (D)-1 [5.00] | (F)-1 [1.50] | (S)-1 [100] | (S)-2 [2800] |
| Ex. 20 | (A)-1 [100] | (B)-4 [6.44] | (D)-1 [5.00] | (F)-1 [150] | (S)-1 [100] | (S)-2 [2800] |
| Ex. 21 | (A)-1 [100] | (B)-5 [5.62] | (D)-1 [5.00] | (F)-1 [1.50] | (S)-1 [100] | (S)-2 [2800] |

In Tables 2 and 3, the reference characters indicate the following. The values in brackets [ ] indicate the amount (in terms of parts by weight) of the component added.

(A)-1 to (A)-21: the aforementioned polymeric compounds A-1 to A-21.

(B)-1 to (B)-5: an acid generator consisting of a compound represented by each chemical formula (B)-1 to (B)-5 shown below.

(D)-1: acid diffusion control agent of a compound represented by chemical formula (D)-1 below.

(F)-1: fluorine-containing polymeric compound represented by chemical formula (F)-1 below. The weight average molecular weight (Mw) and the molecular weight dispersity (Mw/Mn) in terms of the polystyrene equivalent value measured by GPC were 17100 and 1.71, respectively. The composition of the copolymer (ratio (molar ratio) of the respective structural units within the structural formula) as determined by $^{13}$C-NMR was 1/m=52/48.

(S)-1: γ-butyrolactone.

(S)-2: a mixed solvent of propylene glycol monomethyl ether acetate/propylene glycol monomethyl ether/cyclohexanone=45/30/25 (weight ratio).

[Chemical Formula 57]

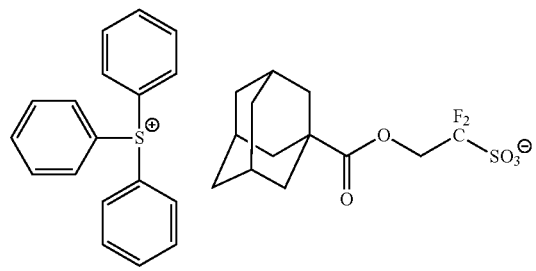

[Chemical Formula 58]

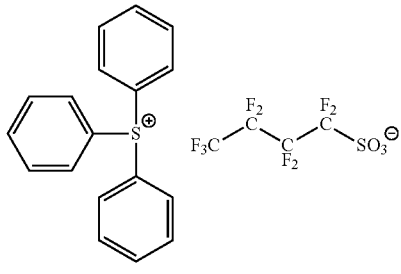

Formation of Resist Pattern

Examples 1 to 21, Comparative Examples 1 to 4

An organic antireflection film composition was applied to a 12-inch silicon wafer and the composition was then baked and dried at 240° C. for 60 seconds, thereby forming an organic antireflection film having a thickness of 150 nm. Then, an inorganic antireflection film composition was applied to the organic antireflection film and the composition was then baked and dried at 240° C. for 60 seconds, thereby forming an inorganic antireflection film having a film thickness of 35 nm.

Each of the aforementioned resist compositions was then applied to the inorganic antireflection film using a spinner, and was then prebaked (PAB, ° C.) and dried on a hotplate at a temperature indicated in Table for 60 seconds, thus forming a resist film having a film thickness of 100 nm.

Subsequently, the resist film was selectively irradiated with an ArF excimer laser (193 nm) using an immersion lithography ArF exposure apparatus NSR-S609B (manufactured by Nikon Corporation; NA (numerical aperture)=1.07; Crosspole (0.78-0.97) with POLANO; immersion medium: water) thorough each photomasks targeting a line and space pattern with a space width of 40 nm and a pitch of 100 nm (target 1), or a trench pattern with a space width of 45 nm and a pitch of 140 nm (target 2).

Then, a post exposure bake treatment (PEB, ° C.) was conducted at a temperature indicated in Table for 60 seconds.

Next, a solvent development was conducted at 23° C. for 13 seconds using butyl acetate, followed by drying by shaking.

As a result, when the target is the target 1, a line and space pattern (hereafter, sometimes referred to simply as "LS pattern") having a space width of 45 nm and a pitch of 100 nm was formed in each of the examples except Comparative Example 1. On the other hand, when the resist composition of Comparative Example 1 is used, pattern collapse occurred and an LS pattern could not be resolved.

When the target is the target 2, a trench pattern having a space width of 50 nm and a pitch of 140 nm was formed in each of the examples.

[Evaluation of Optimum Exposure Dose (Eop)]

The optimum exposure dose Eop (mJ/cm$^2$) with which the target resist pattern was formed in the above formation of the resist pattern was determined. The results are indicated under "Eop (mJ/cm$^2$)" in Tables 4 to 5.

[Evaluation of Line Width Roughness (LWR)]

With respect to each of the resist patterns formed in the above formation of the resist pattern, the space width of the LS pattern and the space width of the trench pattern were measured using a length measuring SEM (acceleration voltage: 300V), As the length measuring SEM, a measuring scanning electron microscope manufactured by Hitachi High-Technologies Corporation (product name: S-9380) was used. The space width of the each patterns was measured using the length measuring SEM (acceleration voltage: 300V) at 400 points in the lengthwise direction of the each space.

Then, the value of 3 times the standard deviation s (i.e., 3 s) was determined from the measured result of the space width of the each pattern, and the average value (nm) of the 3 s values at 400 points was calculated. The average value was set as a yardstick of LWR. The results are indicated under "LWR (nm)" in Tables 4 to 5.

The smaller this 3 s value is, the lower the level of roughness of the space portion, indicating that a LS pattern or a trench pattern with a uniform space width was obtained.

[Evaluation of Maximum Resolution Size]

A LS pattern was formed with the exposure dose (mJ/cm$^2$) and the focus appropriately changed in the aforementioned formation of the resist pattern (in the case of target 1). The maximum size of the space portion in the resolved LS pattern was measured using a length measuring SEM (acceleration voltage: 300V). As the length measuring SEM, a measuring scanning electron microscope manufactured by Hitachi High-Technologies Corporation (product name: S-9380) was used.

The maximum sizes of the space portion in the resolved LS pattern are indicated under "maximum resolution size (nm)" in Tables 4 to 5.

[Evaluation of Depth of Focus (DOF)]

A resist pattern was formed in the same manner as the above-mentioned formation of the resist pattern, with the above-mentioned Eop and the focus appropriately shifted up and down in the above-mentioned formation of the resist pattern (in the case of target 2). The depth of focus (DOF; unit: nm) with which a space portion could be formed was determined. The results are indicated under "DOF (nm)" in Tables 4 to 5.

"DOF" is the range of depth of focus in which a resist pattern having a predetermined shape can be formed when the exposure focus is moved upwardly or downwardly with the same exposure dose, i.e., the range in which a resist pattern faithful to the mask pattern can be obtained. The larger the range is (The larger the value is), the larger the process margin.

TABLE 4

Formation of negative-tone resist pattern (in the case of target 1)

| | PAB (° C.) | PEB (° C.) | Eop (mJ/cm$^2$) | LWR (nm) | Max Resolution Size (nm) |
|---|---|---|---|---|---|
| Ex. 1 | 110 | 90 | 22.4 | 4.59 | 51.2 |
| Ex. 2 | 110 | 90 | 21.2 | 4.68 | 50.6 |
| Comp. Ex. 1 | 110 | 95 | | not resolved | |
| Ex. 3 | 110 | 90 | 18.8 | 4.7 | 51.1 |
| Ex. 4 | 110 | 100 | 23 | 4.53 | 50.5 |
| Ex. 5 | 110 | 95 | 20.9 | 4.65 | 50.1 |
| Ex. 6 | 110 | 95 | 23.4 | 4.5 | 52 |
| Comp. Ex. 2 | 110 | 90 | 20.3 | 5.12 | 46.6 |
| Ex. 7 | 110 | 90 | 21.8 | 4.51 | 50.2 |
| Ex. 8 | 110 | 90 | 19.5 | 4.47 | 50.5 |
| Comp. Ex. 3 | 110 | 100 | 31.1 | 5.33 | 45.5 |
| Comp. Ex. 4 | 110 | 100 | 25.4 | 5.2 | 44.1 |
| Ex. 9 | 110 | 90 | 20.7 | 4.45 | 51.7 |
| Ex. 10 | 110 | 90 | 21.4 | 4.52 | 52.6 |
| Ex. 11 | 110 | 100 | 23.5 | 4.73 | 52.5 |
| Ex. 12 | 110 | 90 | 23.6 | 4.51 | 52.2 |
| Ex. 13 | 110 | 95 | 21.3 | 4.65 | 53.7 |
| Ex. 14 | 110 | 90 | 20.7 | 4.62 | 52 |
| Ex. 15 | 110 | 90 | 23.3 | 4.77 | 51.8 |
| Ex. 16 | 110 | 90 | 23.8 | 4.85 | 51.1 |
| Ex. 17 | 110 | 90 | 20.1 | 4.89 | 49.8 |
| Ex. 18 | 110 | 90 | 21.8 | 4.5 | 52.4 |
| Ex. 19 | 110 | 95 | 26.7 | 4.63 | 52.5 |
| Ex. 20 | 110 | 90 | 23.4 | 4.81 | 50.4 |
| Ex. 21 | 110 | 90 | 16.5 | 5.02 | 49.9 |

From the results shown in Table 4, it was confirmed that Examples 1 to 21 had smaller LWR value (nm) than those of Comparative Examples 2 to 4, indicating that a LS pattern with a uniform space width was obtained.

Further, it was confirmed that the values of the maximum resolution size (nm) in Examples 1 to 21 were larger than those of Comparative Examples 2 to 4, indicating that a space portion in the LS pattern was satisfactorily resolved.

Accordingly, even when an extremely fine line and space pattern having a size of 50 nm or smaller was formed, it was confirmed, by the method of forming a resist pattern according to the present invention, a resist pattern having an excellent shape could be formed without pattern collapse.

TABLE 5

Formation of negative-tone resist pattern (in the case of target 2)

| | PAB (° C.) | PEB (° C.) | Eop (mJ/cm$^2$) | LWR (nm) | DOF (nm) |
|---|---|---|---|---|---|
| Ex. 1 | 110 | 90 | 18.9 | 4.71 | 180 |
| Ex. 2 | 110 | 90 | 17.9 | 4.8 | 180 |
| Comp. Ex. 1 | 110 | 95 | 14.4 | 5.55 | 90 |
| Ex. 3 | 110 | 90 | 15.3 | 4.9 | 180 |
| Ex. 4 | 110 | 100 | 19.7 | 4.66 | 180 |
| Ex. 5 | 110 | 95 | 17.2 | 4.67 | 180 |
| Ex. 6 | 110 | 95 | 19.8 | 4.73 | 180 |
| Comp. Ex. 2 | 110 | 90 | 16.9 | 5.54 | 90 |
| Ex. 7 | 110 | 90 | 18 | 4.64 | 180 |
| Ex. 8 | 110 | 90 | 16.2 | 4.69 | 180 |
| Comp. Ex. 3 | 110 | 100 | 27.4 | 5.77 | 30 |
| Comp. Ex. 4 | 110 | 100 | 21 | 5.43 | 90 |
| Ex. 9 | 110 | 90 | 17.9 | 4.59 | 210 |
| Ex. 10 | 110 | 90 | 18.9 | 4.67 | 210 |

TABLE 5-continued

Formation of negative-tone resist pattern
(in the case of target 2)

|       | PAB (°C.) | PEB (°C.) | Eop (mJ/cm²) | LWR (nm) | DOF (nm) |
|-------|-----------|-----------|--------------|----------|----------|
| Ex. 11 | 110 | 100 | 20.2 | 4.88 | 150 |
| Ex. 12 | 110 | 90  | 20.2 | 4.64 | 210 |
| Ex. 13 | 110 | 95  | 17.5 | 5.27 | 120 |
| Ex. 14 | 110 | 90  | 18.8 | 4.78 | 180 |
| Ex. 15 | 110 | 90  | 19.6 | 4.84 | 180 |
| Ex. 16 | 110 | 90  | 20.6 | 4.79 | 180 |
| Ex. 17 | 110 | 90  | 16.5 | 5.2  | 120 |
| Ex. 18 | 110 | 90  | 18.2 | 4.7  | 180 |
| Ex. 19 | 110 | 95  | 22.2 | 4.82 | 180 |
| Ex. 20 | 110 | 90  | 18.7 | 5.11 | 150 |
| Ex. 21 | 110 | 90  | 12.5 | 5.3  | 120 |

From the results shown in Table 5, it was confirmed that Examples 1 to 21 had smaller or the same LWR value (nm) compared to those of Comparative Examples 1 to 4, indicating that a trench pattern with a uniform space width was obtained.

Further, it was confirmed that DOF value (nm) in Examples 1 to 21 were larger than or the same as those of Comparative Examples 1 to 4, indicating that a process margin was large.

Accordingly, even when an extremely fine space pattern having a size of 50 nm or smaller was formed, it was confirmed, by the method of forming a resist pattern according to the present invention, a resist pattern having an excellent shape could be formed without resolution defect.

What is claimed is:

1. A method of forming a resist pattern, comprising:
   forming a resist film on a substrate using a resist composition which generates acid upon exposure and exhibits changed solubility in a developing solution under action of the acid;
   exposing the resist film; and
   patterning the exposed resist film by negative-tone development using a developing solution containing an organic solvent, to form a resist pattern,
   the resist composition comprising a polymeric compound comprising a structural unit (a01) represented by general formula (a01-1) shown below, at least one structural unit (a0-2) selected from the group consisting of a structural unit represented by general formula (a02-1-1) shown below and a structural unit represented by general formula (a02-2-1) shown below, a structural unit (a03) represented by general formula (a03-1) shown below, a structural unit (a04) represented by general formula (a04-1) shown below and a structural unit (a05) containing a polar group-containing aliphatic hydrocarbon group, provided that the structural units that fall under the definition of structural units (a01) to (a04) are excluded:

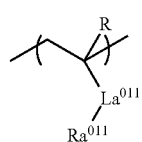
(a01-1)

wherein R represents a hydrogen atom, an alkyl group of 1 to 5 carbon atoms or a halogenated alkyl group of 1 to 5 carbon atoms; $La^{011}$ represents —CO—, —CO—O—($Va^{01}$-CO—O—)$n_{a011}$-, —O—CO—, —CO—N(R')—, —CO—NH—CO— or —CO—NH—CS—; $Va^{01}$ represents a divalent linking group or a single bond; $n_{a011}$ represents 0 or 1; R' represents a hydrogen atom or a methyl group; $R_a^{011}$ represents a polycyclic group containing at least one structure selected from the group consisting of —O—CO— and —SO$_2$— in the ring skeleton thereof, a cyclic group containing a structure —CO—N< in the ring skeleton thereof, or a cyclic group having a group represented by formula —$Va^{001}$-N($Ra^{012}$)($Ra^{013}$) as a substituent; $Va^{001}$ represents —CO— or —SO$_2$—; $Ra^{012}$ and $Ra^{013}$ each independently represent a hydrogen atom, —CO—$Ra^{014}$ or —SO$_2$—$Ra^{015}$; and $Ra^{014}$ and $Ra^{015}$ each independently represents an alkyl group of 1 to 5 carbon atoms; provided that, when $La^{011}$ represents —CO—N(R')—, $Ra^{011}$ can represent a monocyclic group containing —O—CO— in the ring skeleton thereof;

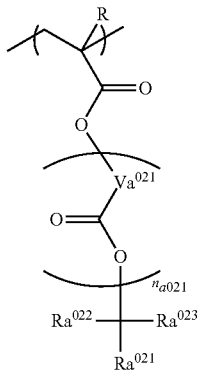
(a02-1-1)

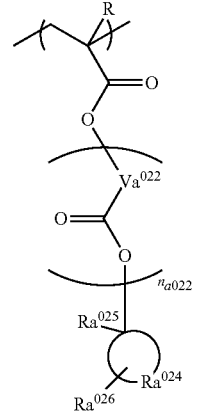
(a02-2-1)

wherein each R independently represents a hydrogen atom, an alkyl group of 1 to 5 carbon atoms or a halogenated alkyl group of 1 to 5 carbon atoms; $Va^{021}$ and $Va^{022}$ each independently represent a divalent linking group or a single bond; $n_{a021}$ and $n_{a022}$ independently represents 0 or 1; $Ra^{021}$ represents a polycyclic alicyclic hydrocarbon group; $Ra^{022}$ and $Ra^{023}$ independently represent an alkyl group of 1 to 5 carbon atoms; $Ra^{024}$ is a group which forms an alicyclic hydrocarbon group with the carbon atom bonded to $Ra^{025}$; $Ra^{026}$ represents a hydrogen atom or an alicyclic hydrocarbon group optionally having a substituent; provided that, when the total number of carbon atoms within the alicyclic hydrocarbon group formed by $Ra^{024}$ and $Ra^{026}$ is 3 to 7, $Ra^{025}$ is an alkyl group of 1 to 10 carbon atoms; and when the total number of carbon atoms is 8 or more, $Ra^{025}$ is an alkyl group of 2 to 10 carbon atoms;

(a03-1)

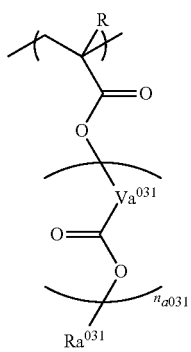

wherein, R represents a hydrogen atom, an alkyl group of 1 to 5 carbon atoms or a halogenated alkyl group of 1 to 5 carbon atoms; $Va^{031}$ represents a divalent linking group or a single bond; $n_{a031}$ represents 0 or 1; and $Ra^{031}$ represents a hydrocarbon group of 2 or more carbon atoms optionally having a fluorine atom; and (a04-1)

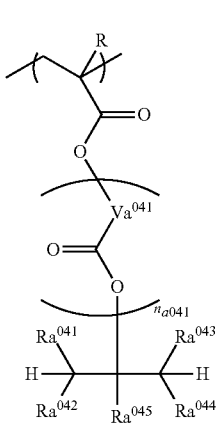

wherein R represents a hydrogen atom, an alkyl group of 1 to 5 carbon atoms or a halogenated alkyl group of 1 to 5 carbon atoms; $Va^{041}$ represents a divalent linking group or a single bond; $n_{a041}$ represents 0 or 1; $Ra^{041}$, $Ra^{042}$, $Ra^{043}$ and $Ra^{044}$ each independently represent a linear or branched alkyl group of 1 to 5 carbon atoms optionally having a substituent; and $Ra^{045}$ represents a linear or branched alkyl group of 1 to 10 carbon atoms optionally having a substituent.

2. The method according to claim 1, wherein $Ra^{011}$ is represented by any one of general formulae (a2-r-1) to (a2-r-6) shown below:

(a2-r-1)

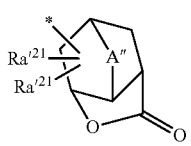

(a2-r-2)

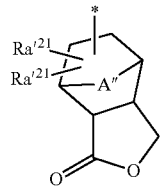

(a2-r-3)

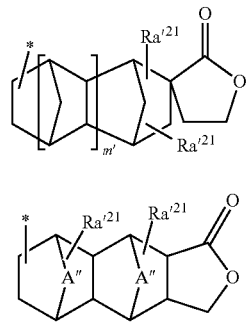

(a2-r-4)

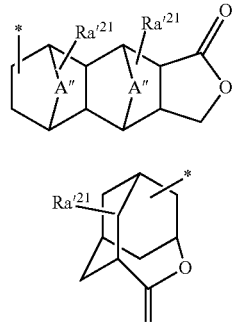

(a2-r-5)

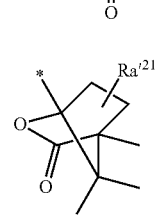

(a2-r-6)

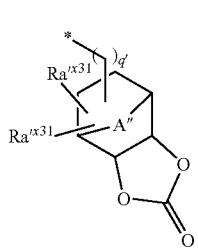

wherein, each $Ra'^{21}$ independently represents a hydrogen atom, an alkyl group, an alkoxy group, a halogen atom, a halogenated alkyl group, a hydroxy group, —$COOR_{02}''$, —$OC(=O)R_{02}''$, a hydroxyalkyl group or a cyano group; $R_{02}''$ represents a hydrogen atom, an alkyl group or a lactone-containing polycyclic group; and A'' represents an oxygen atom, a sulfur atom or a alkylene group of 1 to 5 carbon atoms optionally containing an oxygen atom or a sulfur atom; and m' represents 0 or 1.

3. The method according to claim 1, wherein $Ra^{011}$ is represented by any one of general formulae (ax3-r-2) to (ax3-r-3) shown below:

(ax3-r-2)

(ax3-r-3)

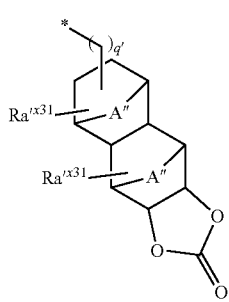

wherein, each $Ra'^{x31}$ independently represents a hydrogen atom, an alkyl group, an alkoxy group, a halogen atom, a halogenated alkyl group, a hydroxy group, $-COOR_{03}"$, $-OC(=O)R_{03}"$, a hydroxyalkyl group or a cyano group; $R_{03}"$ represents a hydrogen atom, an alkyl group or a lactone-containing polycyclic group; and A" represents an oxygen atom, a sulfur atom or an alkylene group of 1 to 5 carbon atoms optionally containing an oxygen atom or a sulfur atom; and q' represents 0 or 1.

4. The method according to claim 1, wherein $Ra^{011}$ is represented by any one of general formulae (a5-r-1) to (a5-r-2) shown below:

(a5-r-1)

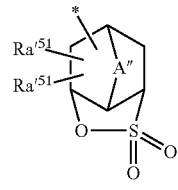

(a5-r-2)

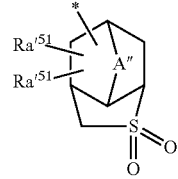

wherein, each $Ra'^{51}$ independently represents a hydrogen atom, an alkyl group, an alkoxy group, a halogen atom, a halogenated alkyl group, a hydroxy group, $-COOR_{05}"$, $-OC(=O)R_{05}"$, a hydroxyalkyl group or a cyano group; $R_{05}"$ represents a hydrogen atom, an alkyl group or a $-SO_2-$ containing polycyclic group; and A" represents an oxygen atom, a sulfur atom or an alkylene group of 1 to 5 carbon atoms optionally containing an oxygen atom or a sulfur atom.

* * * * *